(12) United States Patent
Narita

(10) Patent No.: US 9,269,671 B2
(45) Date of Patent: Feb. 23, 2016

(54) SEMICONDUCTOR DEVICE MANUFACTURING METHOD AND SEMICONDUCTOR DEVICE

(71) Applicant: Renesas Electronics Corporation, Kawasaki-shi, Kanagawa (JP)

(72) Inventor: Hiroaki Narita, Tsuruta (JP)

(73) Assignee: Renesas Electronics Corporation, Tokyo (JP)

( * ) Notice: Subject to any disclaimer, the term of this patent is extended or adjusted under 35 U.S.C. 154(b) by 24 days.

(21) Appl. No.: 13/889,349

(22) Filed: May 8, 2013

(65) Prior Publication Data
US 2013/0299956 A1 Nov. 14, 2013

(30) Foreign Application Priority Data
May 10, 2012 (JP) .................................. 2012-108266

(51) Int. Cl.
*H01L 23/544* (2006.01)
*H01L 21/56* (2006.01)
(Continued)

(52) U.S. Cl.
CPC .............. *H01L 23/544* (2013.01); *H01L 21/56* (2013.01); *H01L 21/561* (2013.01); *H01L 21/568* (2013.01); *H01L 21/6836* (2013.01); *H01L 24/97* (2013.01); *H01L 2221/6834* (2013.01); *H01L 2221/68327* (2013.01); *H01L 2221/68381* (2013.01); *H01L 2223/54406* (2013.01); *H01L 2223/54426* (2013.01); *H01L 2223/54433* (2013.01); *H01L 2223/54473* (2013.01); *H01L 2223/54486* (2013.01); *H01L 2224/48137* (2013.01); *H01L 2224/48247* (2013.01); *H01L 2224/85181* (2013.01); *H01L 2224/97* (2013.01); *H01L 2924/15747* (2013.01); *H01L 2924/1815* (2013.01); *H01L 2924/18165* (2013.01)

(58) Field of Classification Search
CPC ....... H01L 24/97; H01L 21/561; H01L 21/56; H01L 21/6836; H01L 23/544; H01L 2223/54486
USPC ........................... 438/113, 401; 257/676, 797
See application file for complete search history.

(56) References Cited

U.S. PATENT DOCUMENTS 6,700,185 B1 3/2004 Kawai et al.
8,704,342 B2 4/2014 Sasaki et al.
(Continued)

FOREIGN PATENT DOCUMENTS

JP 2002-231871 A 8/2002
JP 2003-332513 A 11/2003
(Continued)

OTHER PUBLICATIONS

Office Action issued Dec. 22, 2015, in Japanese Patent Application No. 2012-108266.

*Primary Examiner* — William F Kraig
*Assistant Examiner* — Nga Doan
(74) *Attorney, Agent, or Firm* — Miles & Stockbridge P.C.

(57) ABSTRACT

There is provided a technology by which the position of 1 pin in a tabless package can be recognized easily. The rear surfaces of plural leads are exposed on a rear surface of a resin-sealed body which seals a semiconductor chip etc., a image recognition area is further provided adjacent to 1 pin (lead with index 1), and a rear surface of an identification mark is exposed from the rear surface of the resin-sealed body of the image recognition area. This identification mark is made of the same conductive member as the plural leads.

13 Claims, 49 Drawing Sheets

(51) Int. Cl.
*H01L 23/00* (2006.01)
*H01L 21/683* (2006.01)

(56) References Cited

U.S. PATENT DOCUMENTS

2004/0232442 A1* 11/2004 Shimanuki .................. 257/199
2006/0125064 A1*  6/2006 Ito et al. ..................... 257/666
2013/0040426 A1*  2/2013 Narita ......................... 438/113

FOREIGN PATENT DOCUMENTS

| JP | 2004-327903 A | 11/2004 |
| JP | 2005-294443 A | 10/2005 |
| JP | 2006-229263 A | 8/2006 |
| JP | 2008-153710 A | 7/2008 |
| JP | 2008-288304 A | 11/2008 |
| JP | 2010-080914 A | 4/2010 |
| JP | 2011-91145 A | 5/2011 |
| WO | 01/35460 A1 | 5/2001 |

* cited by examiner

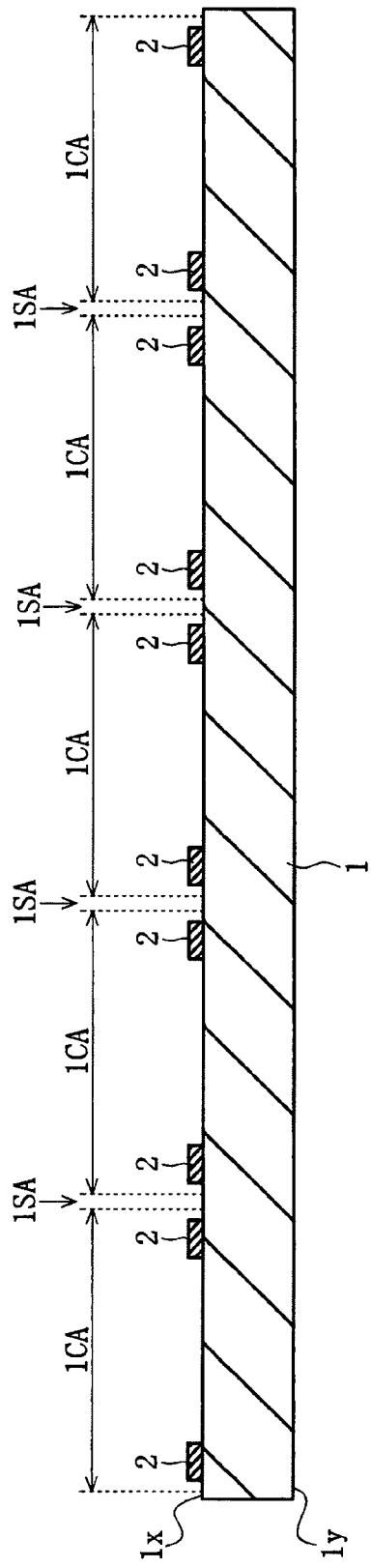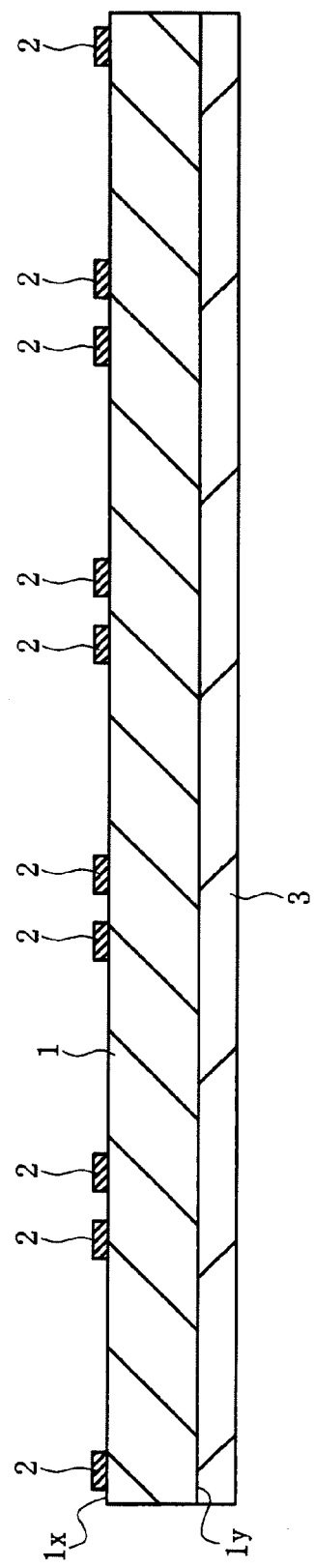

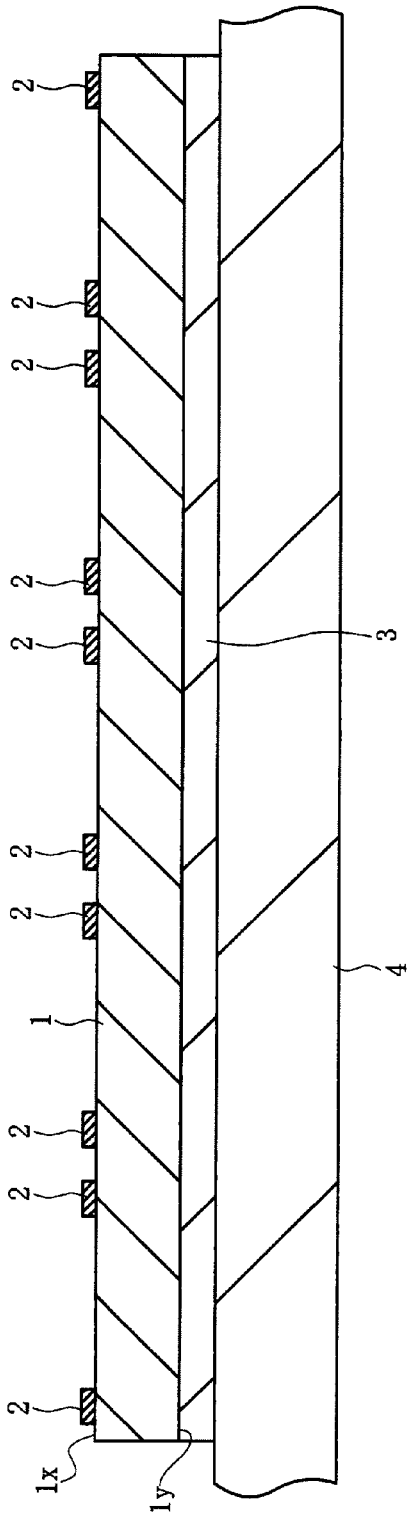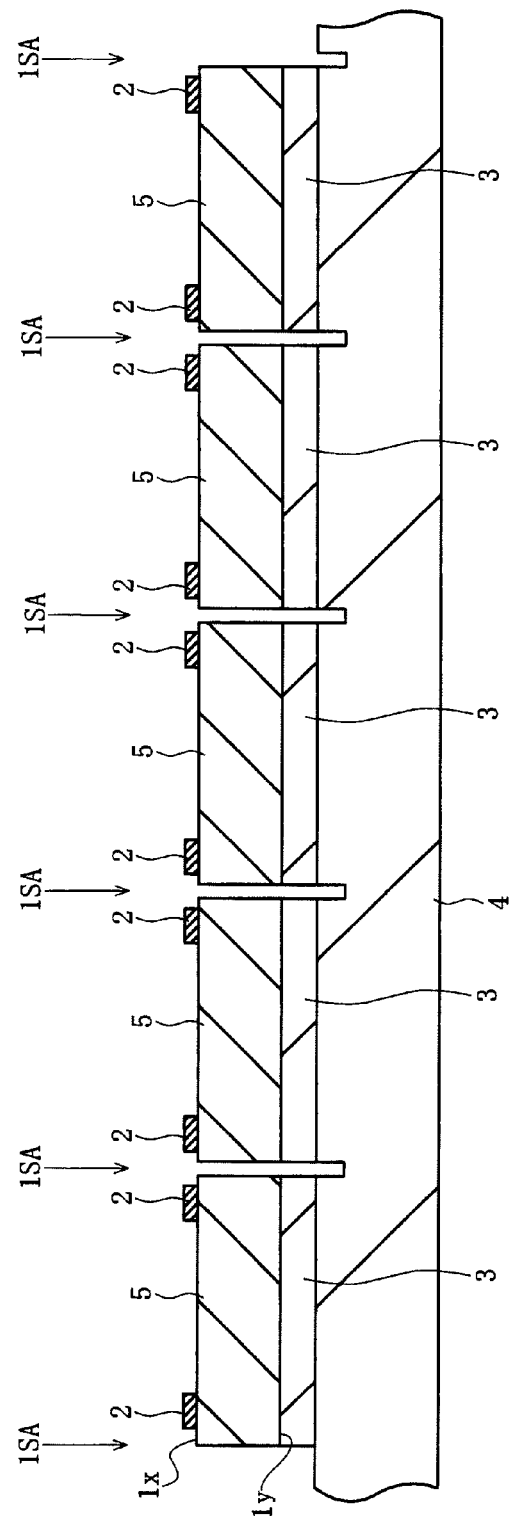

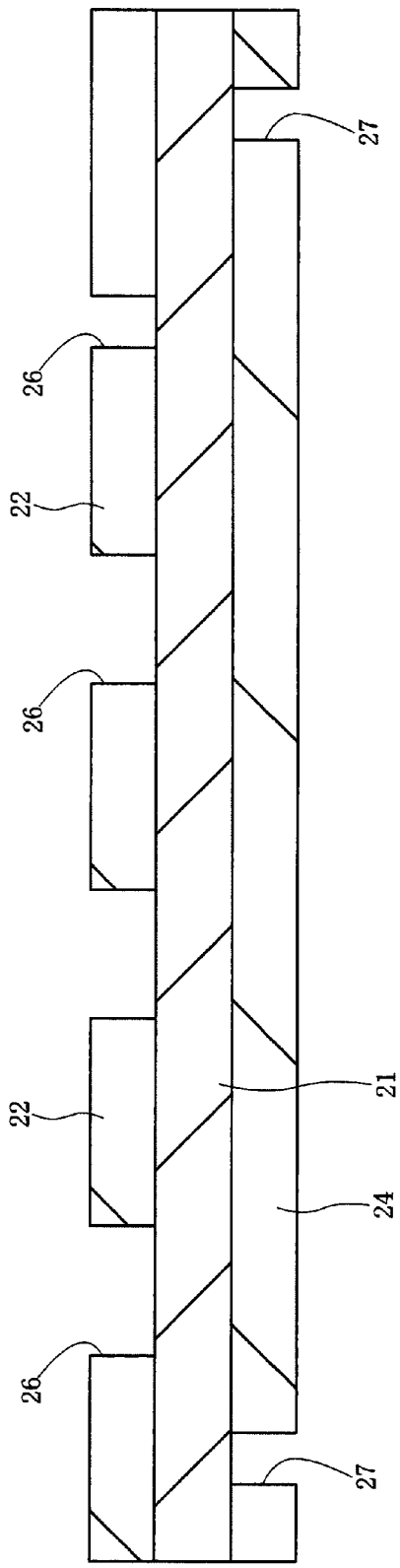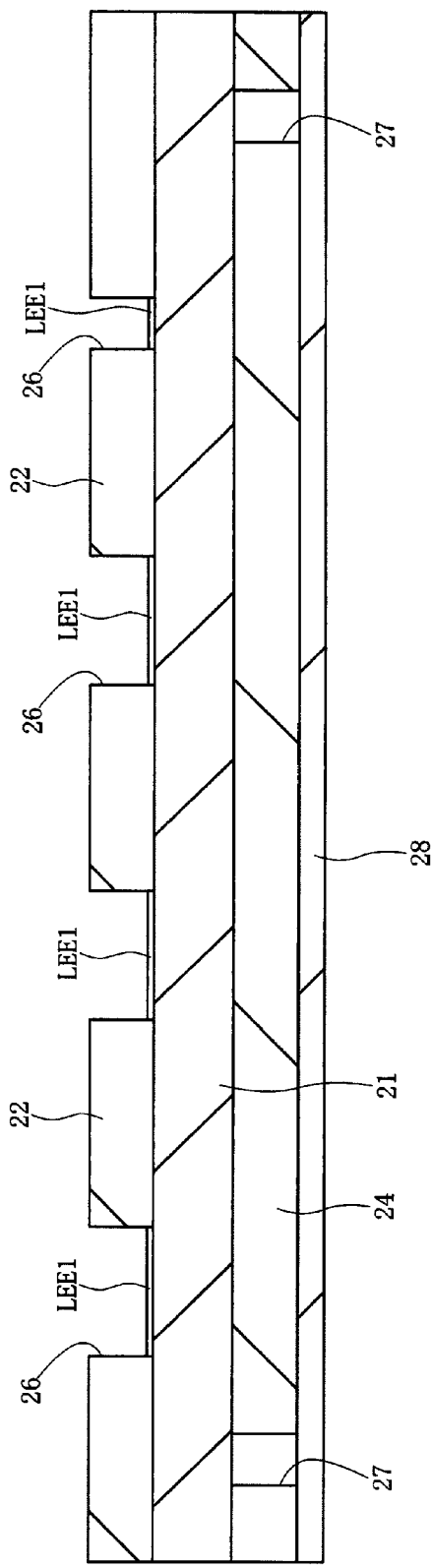

SEMICONDUCTOR DEVICE MANUFACTURING METHOD AND SEMICONDUCTOR DEVICE

INCORPORATION BY REFERENCE

The present application claims priority from Japanese application JP2012-108266 filed on May 10, 2012, the content of which is hereby incorporated by reference into this application.

BACKGROUND OF THE INVENTION

The present invention relates to a semiconductor device manufacturing method and a semiconductor device, and it can be suitably used for, for example, manufacturing of a semiconductor device having leads on the back surface of a package.

For property selection of a resin-sealed semiconductor device, it is necessary to recognize the position of 1 pin (one pin) which is determined as a first lead as an index (an identification number, a serial number, an index) from plural leads (external connection terminals, external terminals, and terminals).

For example, Japanese Patent Laid-Open No. 2008-288304 discloses a technology that the front ends of suspension leads of the periphery exposed from the undersurface of a mold resin are configured as reinforcing terminal portions, and one reinforcing terminal is determined to have a different shape, which is exposed from the mold resin, from the other reinforcing terminals, thereby recognizing 1 pin.

Japanese Patent Laid-Open No. 2011-091145 discloses a technology that the exposed shape of an island is used as a position recognition mark by partly cutting a corner portion of the island exposed on a rear surface of a resin package.

And, Japanese Patent Laid-Open No. 2006-229263 discloses a technology that plural suspension leads are partly exposed from a rear surface of the resin-sealed body, and one of them is used as an index for recognizing a direction of the resin-sealed body.

Japanese Patent Laid-Open No. 2003-332513 discloses a technology that notches are formed in two corners along the diagonal direction of the front surface side of the sealed body, and a part of the suspension lead which is provided with a recognition mark having a circular flat shape is exposed from the notches.

Japanese Patent Laid-Open No. 2004-327903 discloses a semiconductor device wherein one surface of a lead is determined as a half-etching surface and the other surface as a non-half-etching surface, the non-half-etching surface and the outer side surface are exposed from the resin, and the others are disposed within the resin to seal with the resin.

SUMMARY OF THE INVENTION

In the resin-sealed semiconductor device (semiconductor package), one lead among plural leads exposed from its rear surface is determined as "1 pin". This 1 pin takes a role in identifying a direction of the semiconductor device or identifying each of the plural leads at the time of inspection. Therefore, it is necessary that the 1 pin can be recognized easily from the appearance. However, in a case where property selection of a parts feeder system is adopted, the tabless package had a problem that the position of 1 pin cannot be recognized.

Other problems and novel features will become clear from the description of this specification and the accompanying drawings.

According to one embodiment, an identification mark which is coupled to a suspension lead and exposed to a rear surface of a resin-sealed body is formed, and the position of 1 pin is recognized according to the identification mark among plural leads exposed on the rear surface of the resin-sealed body.

According to one embodiment, the position of 1 pin in a tabless package can be recognized easily.

Other objects, features and advantages of the invention will become apparent from the following description of the embodiments of the invention taken in conjunction with the accompanying drawings.

BRIEF DESCRIPTION OF THE DRAWINGS

FIG. 4 is a cross-sectional view of a main part of the semiconductor device in a wafer preparation step according to one embodiment.

FIG. 5 is a cross-sectional view of the main part of the semiconductor device in a resin sheet attaching step according to one embodiment.

FIG. 6 is a cross-sectional view of the main part of the semiconductor device in a dicing tape step according to one embodiment.

FIG. 7 is a cross-sectional view of the main part of the semiconductor device in a wafer dicing step according to one embodiment.

FIG. 44 is subsequent to FIG. 43 and is a cross-sectional view of the main part of the same portion as in FIG. 43.

FIG. 45 is subsequent to FIG. 44 and is a cross-sectional view of the main part of the same portion as in FIG. 43.

DESCRIPTION OF THE EMBODIMENTS

Figure 1:
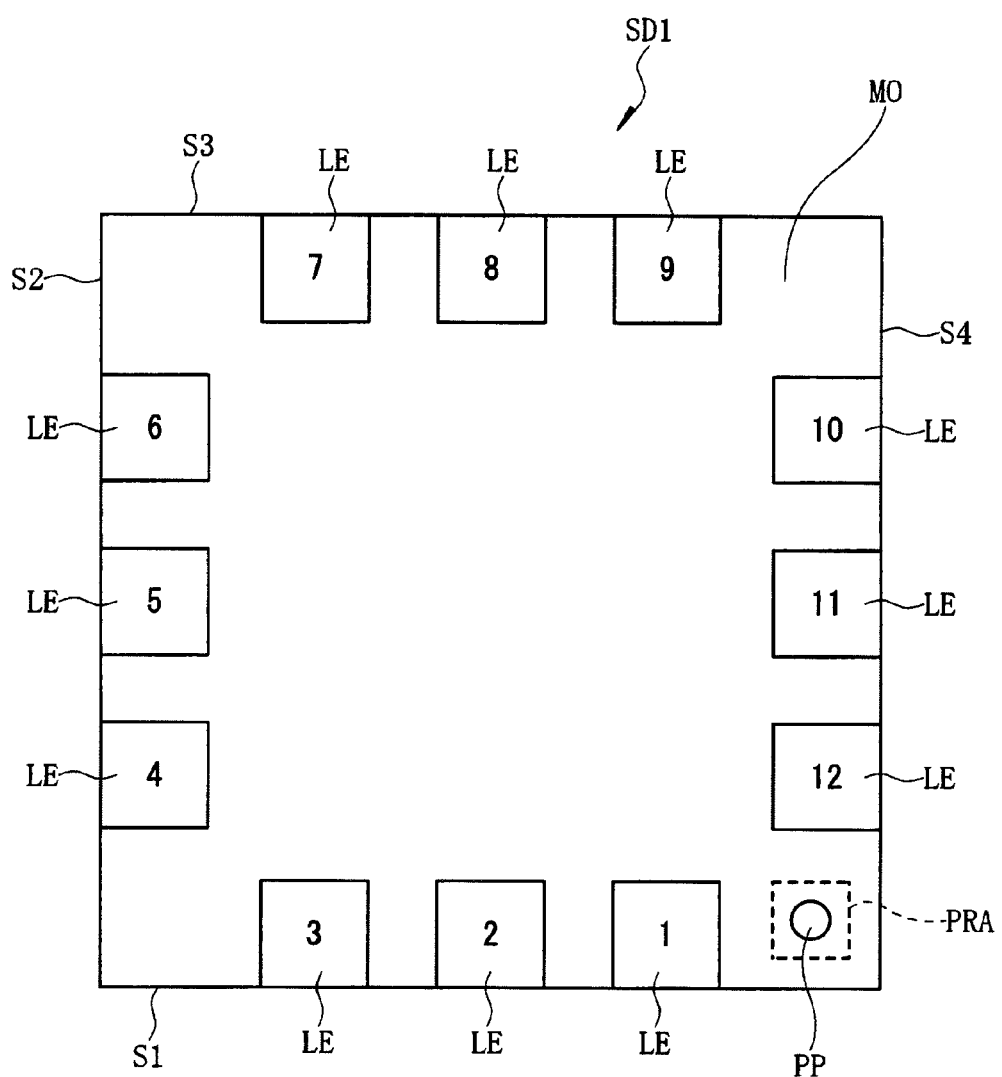
FIG. 1 is a plan view of a main part showing a rear surface of the semiconductor device according to one embodiment.

In the following embodiments, descriptions are made dividing into plural sections or embodiments if necessary for convenience, but they are not mutually irrelevant unless otherwise specified particularly, and one of them is in relation of a modified example, details, supplemental explanation or the like of a part of others or all of them.

In a case where the number of elements (including quantity, numerical value, amount, range, etc.) is referred to in the following embodiments, it is not limited to a particular number but may be larger or smaller than the particular number unless otherwise specified and except where it is apparently limited to a particular number in principle. In addition, it is needless to say that the component elements (including an element step etc.) in the following embodiments are not necessarily essential unless otherwise specified and except where they seem to be apparently essential in principle. Similarly, in a case where the shapes, positional relations and the like of the component elements and the like are described in the following embodiments, it is determined that shapes substantially close or similar to the above are included unless otherwise specified and except where it is considered not to be so obviously in principle. The same is also applied to the above numerical values and ranges.

The tabless package in the following embodiments is a resin package which does not have a base material (tabs, islands) on which semiconductor chips are mounted and does not have the base material exposed on a rear surface (undersurface and bottom surface) of a resin-sealed body for sealing the semiconductor chip.

In the drawings used in the following embodiments, there is a case that hatching is given even it is a plan view to make the drawings easy to understand. In all drawings for explaining the following embodiments, the same numerals are given to the components having the same function in principle, and the repetitive description thereof will be omitted. The embodiments of the invention will be described below in detail referring to the drawings.

(Detailed Subject)

One of semiconductor packages having a semiconductor chip, which is mounted on a lead frame, sealed with a sealed body made of a resin includes QFN (Quad Flat Non-leaded package).

The QFN has a structure that a semiconductor chip is arranged in the central portion of a sealed body, plural leads are arranged on the periphery of the semiconductor chip, plural electrode pads formed on a front surface of the semiconductor chip within the sealed body and front surfaces of plural leads are electrically connected through plural bonding wires, and rear surfaces of the plural leads are exposed from the rear surface of the sealed body. And, the respective rear surfaces of the plural leads exposed from the rear surface of the sealed body are soldered to the electrodes (foot print) of the wiring board, whereby the semiconductor package is mounted. This QFN has an advantage that a mounting area becomes small in comparison with a QFP (Quad Flat Package) in which plural leads are extended transversely from the side surface of the sealed body.

Figure 58:
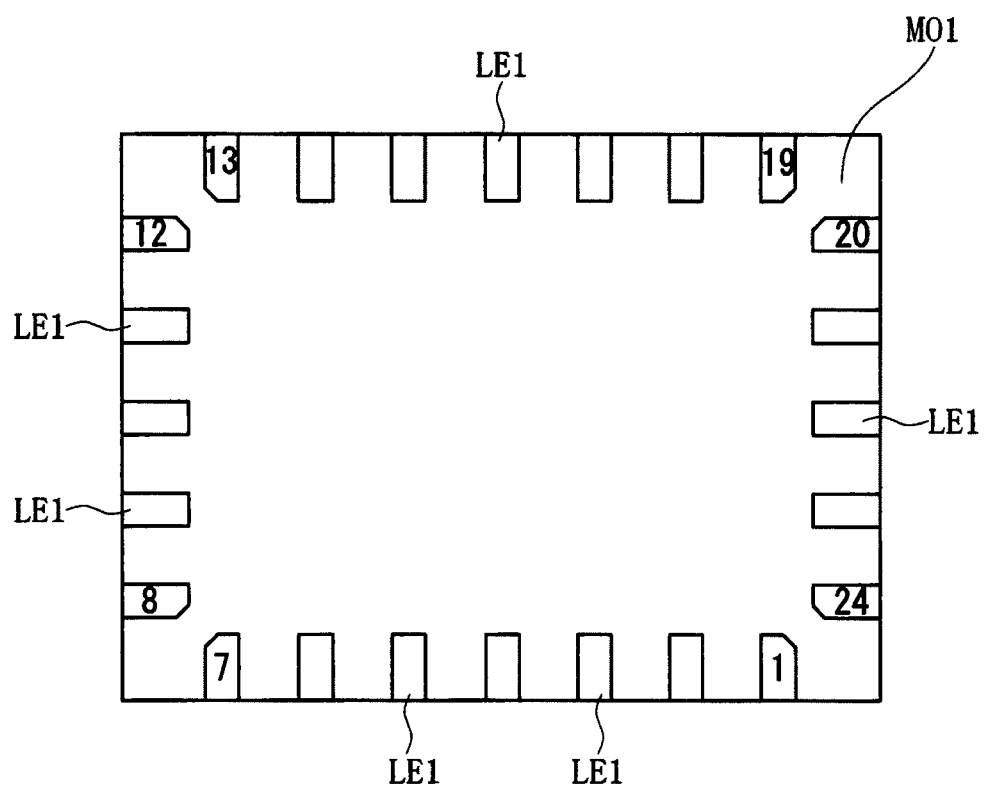
FIG. 58 is a plan view of a main part of a rear surface of a tabless package which is one example of a QFN considered by the present inventors.

FIG. 58 shows a plan view of a main part of a rear surface of a tabless package which is one example of the QFN. The rear surfaces of plural (24) leads LE1 are respectively exposed on the rear surface of the outer circumference of a sealed body MO1. Numerals shown in FIG. 58 are indexes (identification number, serial number, index) of the respective leads LE1, and the lead LE1 corresponding to index 1 is called "1 pin".

Figure 59:
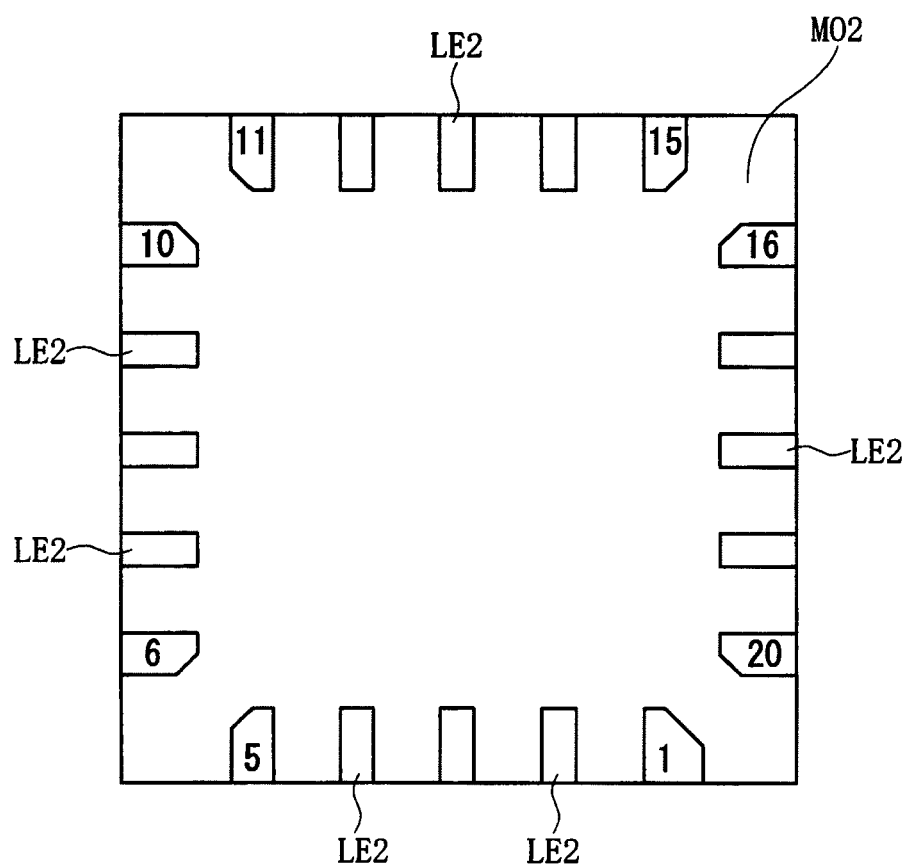
FIG. 59 is a plan view of a main part of a rear surface of a first modified example of the tabless package which is one example of the QFN considered by the present inventors.

FIG. 59 shows a plan view of a main part of a rear surface of a first modified example of the tabless package which is one example of the QFN. The rear surfaces of plural (20) leads LE2 are respectively exposed on the rear surface of the outer circumference of a sealed body MO2. Similar to the above FIG. 58, numerals shown in FIG. 59 are indexes of the respective leads LE2, and the lead LE2 corresponding to index 1 is called "1 pin".

A width in a direction along the outer circumference of the sealed body MO2 on the rear surface of 1 pin exposed from the sealed body MO2 is formed to be larger than that along the outer circumference of the sealed body MO2 on the rear surface of another lead LE2 exposed from the sealed body MO2. That is, the shape of this 1 pin exposed from the rear surface of the sealed body MO2 is different from the shape which is exposed from the rear surface of the sealed body MO2 of another lead LE2. Thus, 1 pin can be recognized.

Figure 60:
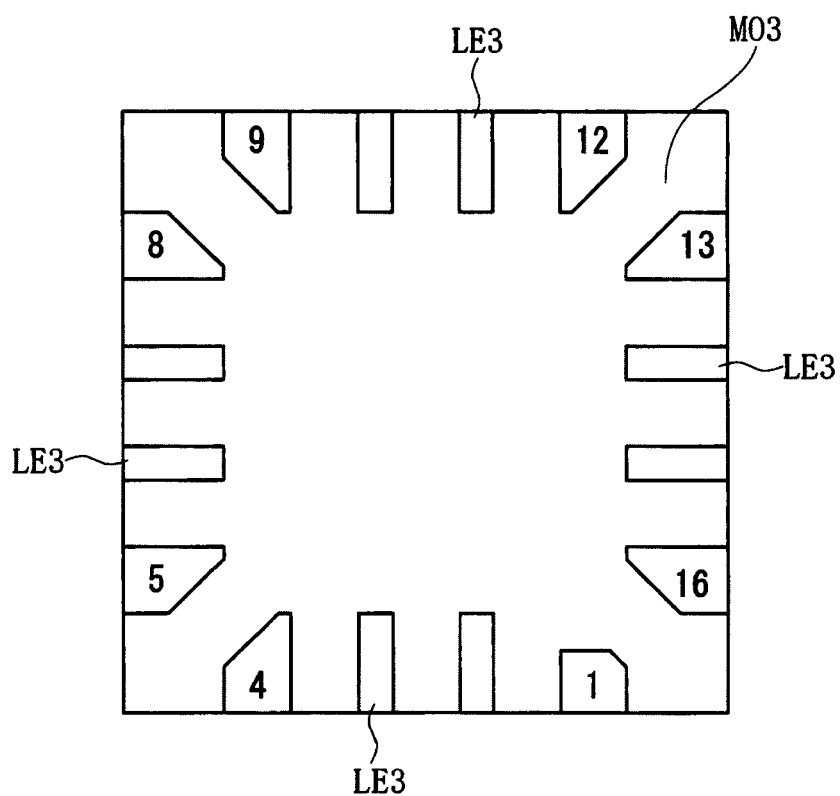
FIG. 60 is a plan view of a main part of a rear surface of a second modified example of the tabless package which is one example of the QFN considered by the present inventors.

FIG. 60 shows a plan view of a main part of a rear surface of a second modified example of a tabless package which is one example of the QFN. Rear surfaces of plural (16) leads LE3 are respectively exposed on the rear surface of the outer circumference of a sealed body MO3. Similar to the above FIG. 58, numerals shown in FIG. 60 are indexes of the respective leads LE3, and the lead LE3 corresponding to index 1 is called "1 pin".

Length of the rear surface of 1 pin exposed from the sealed body MO3 in a direction intersecting at right angles on the rear surface of the sealed body MO3 with a direction along the outer circumference of the sealed body MO3 is formed to be shorter than the lengths of the other leads LE3 exposed from the rear surface of the sealed body MO3 in directions intersecting at right angles with the direction along the outer circumference of the sealed body MO3. That is, the shape of this 1 pin exposed from the rear surface of the sealed body MO3 is different from the shapes of the other leads LE2 exposed from the rear surface of the sealed body MO3. Thus, 1 pin can be recognized.

Figure 61:
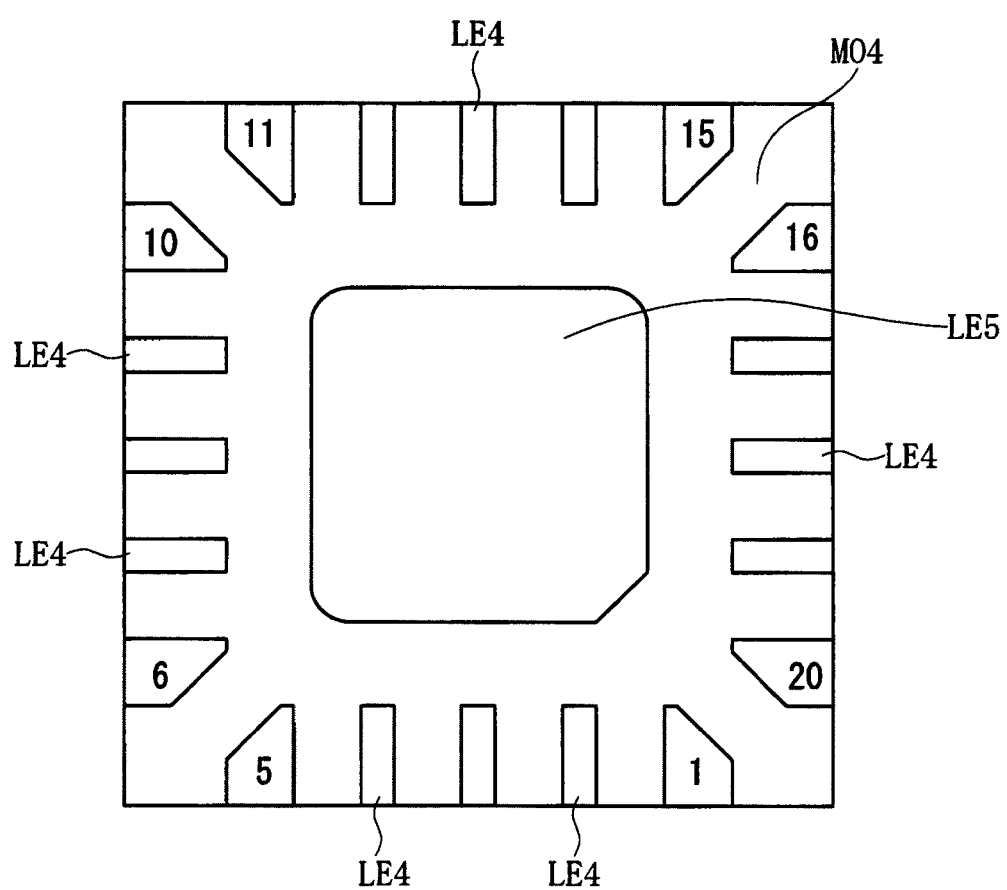
FIG. 61 is a plan view of a main part of a rear surface of a package with tabs, which is another example of the QFN considered by the present inventors.

FIG. 61 shows a plan view of a main part of the rear surface of the package with tabs, which is another example of the QFN. The rear surfaces of plural (20) leads LE4 are respectively exposed on the rear surface of the outer circumference of a sealed body MO4. In addition, one quadrangular tab (island) LE5 is exposed at the central portion on the rear surface of the sealed body MO4. Similar to the above FIG. 58, numerals shown in FIG. 61 are indexes of the respective leads LE4, and the lead LE4 corresponding to index 1 is called "1 pin". A notch portion is formed in one corner portion of the tab LE5 exposed from the rear surface of the sealed body MO4, so that 1 pin can be recognized.

Incidentally, in the property selection of the semiconductor device having the package structure as described above, a tray system property selection or a prober system property selection was adopted conventionally.

However, it was necessary that the tray system property selection takes a long time in working because respective semiconductor devices (semiconductor packages) are put into a tray. And, the prober system property selection was insufficient in flexibility because it takes time to make a variety change or the like. In addition, it was necessary for the tray system property selection and the prober system property selection to have a separate packing device for packing the semiconductor device after the property selection by an inspection device.

Therefore, the present inventors had considered the adoption of the parts feeder system property selection. The parts feeder system property selection has advantages that a working time can be made shorter than the tray system property selection, and the variety change can also be performed easily. In addition, the semiconductor device inspection and packing can be performed continuously by a single device.

However, in the parts feeder system property selection, the plural semiconductor devices which were divided by dicing are separated to pieces once, so that it is necessary to recognize 1 pin when inspecting and to align the directions of the semiconductor devices. Incidentally, the tray system property selection did not need the identification of 1 pin because the plural semiconductor devices divided by dicing are, for example, separately packed into a tray by a collet. And, according to the prober system property selection, the plural semiconductor devices separated by dicing are inspected in a state that they are attached to a fixing ring (C ring), and therefore, it was not necessary to identify 1 pin.

However, 1 pin cannot be recognized in the tabless package shown in FIG. 58 described above.

Although 1 pin can be recognized in the tabless package shown in FIG. 59 and FIG. 60 described above, it is necessary that the electrodes of the wiring board conform to the shape of 1 pin, so that a change of the shape of 1 pin needs the approval by the customer. In addition, the tabless packages shown in FIG. 59 and FIG. 60 described above have about several percent of a change of the area by the change of the shape of 1 pin. Therefore, when the semiconductor device size is decreased to have, for example, about 2 mm of one side, image recognition becomes difficult, and there was a possibility that 1 pin cannot be recognized accurately.

Similarly, even the package with tabs shown in FIG. 61 described above also had a possibility that the image recognition becomes difficult when the semiconductor device size is decreased to, for example, about 2 mm of one side, and 1 pin cannot be recognized accurately.

This embodiment discloses a technology that forms an identification mark which is held by a suspension lead, exposes the identification mark from the rear surface of the sealed body, and can easily perform the position recognition of 1 pin particularly in a tabless package.

(Embodiments)

<<Semiconductor Device>>

The structure of a semiconductor device according to Embodiment 1 is explained with reference to FIG. 1 to FIG. 3. A tabless package having twelve leads (external connection terminals, external terminals, and terminals) is exemplified below.

Figure 2:
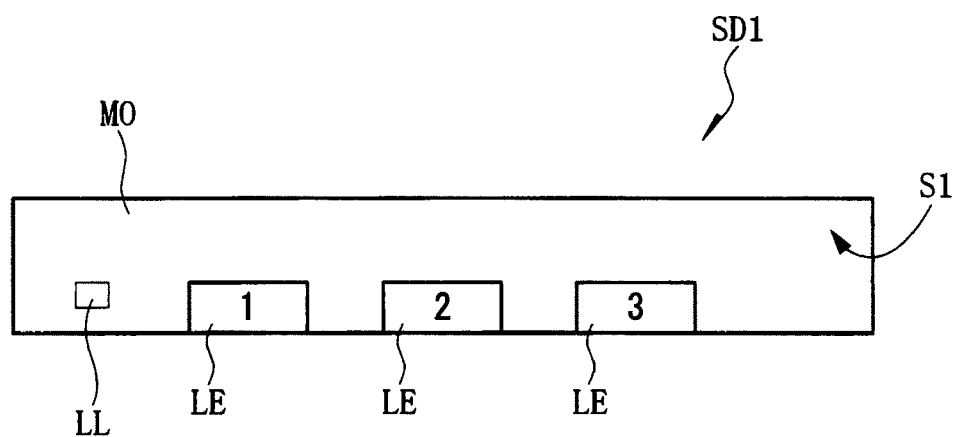
FIG. 2 is a side view of the main part showing an outer side surface on which arranged is a lead (1 pin) attached with a first index of the semiconductor device according to one embodiment.
Figure 3:
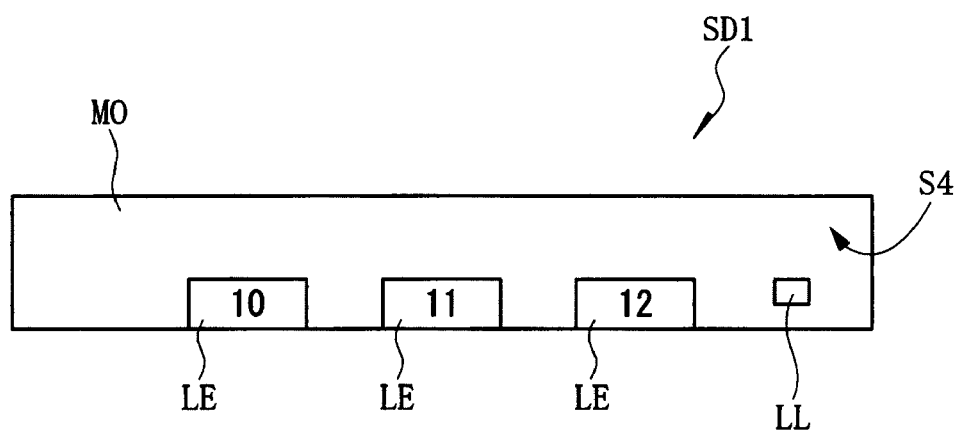
FIG. 3 is a side view of the main part showing an outer side surface on which arranged is a lead attached with a final index of the semiconductor device according to one embodiment.

FIG. 1 is a plan view of a main part showing a rear surface of the semiconductor device, FIG. 2 is a side view of the main part showing an outer side surface, on which 1 pin (lead of index 1) is arranged, of the semiconductor device, and FIG. 3 is a side view of the main part showing an outer side surface, on which the lead (lead with index 12) attached with a final index is arranged, of the semiconductor device.

A semiconductor device (semiconductor package) SD1 has a square shape in a plan view and has a front surface (top surface), a rear surface (undersurface, bottom surface), and four side surfaces (a first side surface S1, a second side surface S2, a third side surface S3, and a fourth side surface S4).

The semiconductor device SD1 is configured of, for example, a semiconductor chip, plural leads (external connection terminals, external terminals, terminals) LE arranged on a periphery of the semiconductor chip, and plural conductive wires which respectively connect electrically plural electrode pads (bonding pads, front surface electrodes) arranged on a front surface of the semiconductor chip and the front surfaces (top surfaces) of the plural leads LE. And, the semiconductor chip, parts (front surfaces (top surfaces)) of the plural leads LE and a part of the side surfaces), and the plural conductive wires are sealed with the resin-sealed body MO (sealed body) MO. Therefore, the resin-sealed body MO also has a square shape in a plan view, and a front surface (top surface), and a rear surface (undersurface and bottom surface) on the opposite side of the front surface with a prescribed thickness.

As shown in FIG. 1, the rear surfaces (undersurface, mounting surface) of the plural leads LE are exposed on the rear surface of the resin-sealed body MO. Here, the semiconductor device SD1 having the twelve leads LE is exemplified, so that the rear surfaces of the twelve leads LE are exposed on the rear surface of the resin-sealed body MO. Among four corner portions of the resin-sealed body MO, one lead LE closest to one corner portion is determined as index 1, and based on it, indexes (identification number, serial number, index) are sequentially provided to the plural leads LE which are arranged on the rear surface of the outer circumference of the resin-sealed body MO. The lead LE corresponding to the index 1 is called "1 pin".

In the semiconductor device SD1, leads LE with indexes 1, 2 and 3 are arranged along the first side surface S1, leads LE with indexes 4, 5 and 6 are arranged along the second side surface S2, leads LE with indexes 7, 8 and 9 are arranged along the third side surface S3, and leads LE with indexes 10, 11 and 12 are arranged along the fourth side surface S4. Numerals which are given in addition to the leads LE in FIG. 1 are indexes.

In addition, an image recognition area PRA is provided adjacent to 1 pin at a corner portion of the resin-sealed body MO which is closest to 1 pin, and the rear surface (undersurface) of an identification mark PP is exposed at the image recognition area PRA on a rear surface of the resin-sealed body MO. This identification mark PP is held by the suspension lead to be described later and formed of the same conductive member as the twelve leads LE. The above-described conductive member is, for example, copper (Cu), and for example, a palladium (Pd) film is formed on the rear surfaces of the twelve leads LE exposed from the rear surface of the resin-sealed body MO and the rear surface of the identification mark PP.

As shown in FIG. 2 and FIG. 3, other parts of the side surfaces of the twelve leads LE are also exposed on the side surfaces of the resin-sealed body MO. Numerals given in addition to the leads LE in FIG. 2 and FIG. 3 are indexes. The other parts of the side surfaces of the leads LE with the indexes 1, 2 and 3 are exposed on the first side surface S1 as shown in FIG. 2, and the other parts of the side surfaces of the leads LE with the indexes 10, 11 and 12 are exposed on the fourth side surface S4 as shown in FIG. 3. A side view is omitted, but similar to the first side surface S1 and the fourth side surface S4, the other parts of the side surfaces of the leads LE with the indexes 4, 5 and 6 are exposed on the second side surface S2, and the other parts of the side surfaces of the leads LE with the indexes 7, 8 and 9 are exposed on the third side surface S3.

In addition, a suspension lead LL for holding the above identification mark PP is exposed on the first side surface S1 of the resin-sealed body MO, where the 1 pin is exposed, and positioned near but away from 1 pin. Similarly, the suspension lead LL for holding the above identification mark PP is also exposed on the fourth side surface S4, and positioned near but away from the lead LE (lead LE with index 12) attached with a final index.

The identification mark PP can be detected by image recognition. The image recognition judges the presence or not of the identification mark PP by binarizing the image. For example, four corner areas (image recognition area PRA and areas of other three corners having the same area as the area PRA) where plural leads LE are not formed on a rear surface of the semiconductor device SD1 are chosen to perform image recognition, and a pixel difference is judged. If the pixel difference is 15% or more, it becomes possible to judge a reflecting part (part having the identification mark PP) and a non-reflecting part (part not having the identification mark PP). Therefore, a plane area of the identification mark PP to the region (image recognition area PRA) where image processing is performed by image recognition is preferably 15% or more.

By the provision of the identification mark PP near 1 pin as described above, it becomes easy to identify the position of 1 pin. Therefore, directions of the semiconductor devices SD1 can be aligned by recognizing 1 pin, and the property selection of the parts feeder system can be adopted in the inspection of the semiconductor devices SD1.

<<Semiconductor Device Manufacturing Method>>

A semiconductor device manufacturing method according to this embodiment is described stepwise with reference to FIG. 4 to FIG. 33. Here, a tabless package having twelve leads (external connection terminal, external terminal, terminal) is exemplified.

Figure 8:
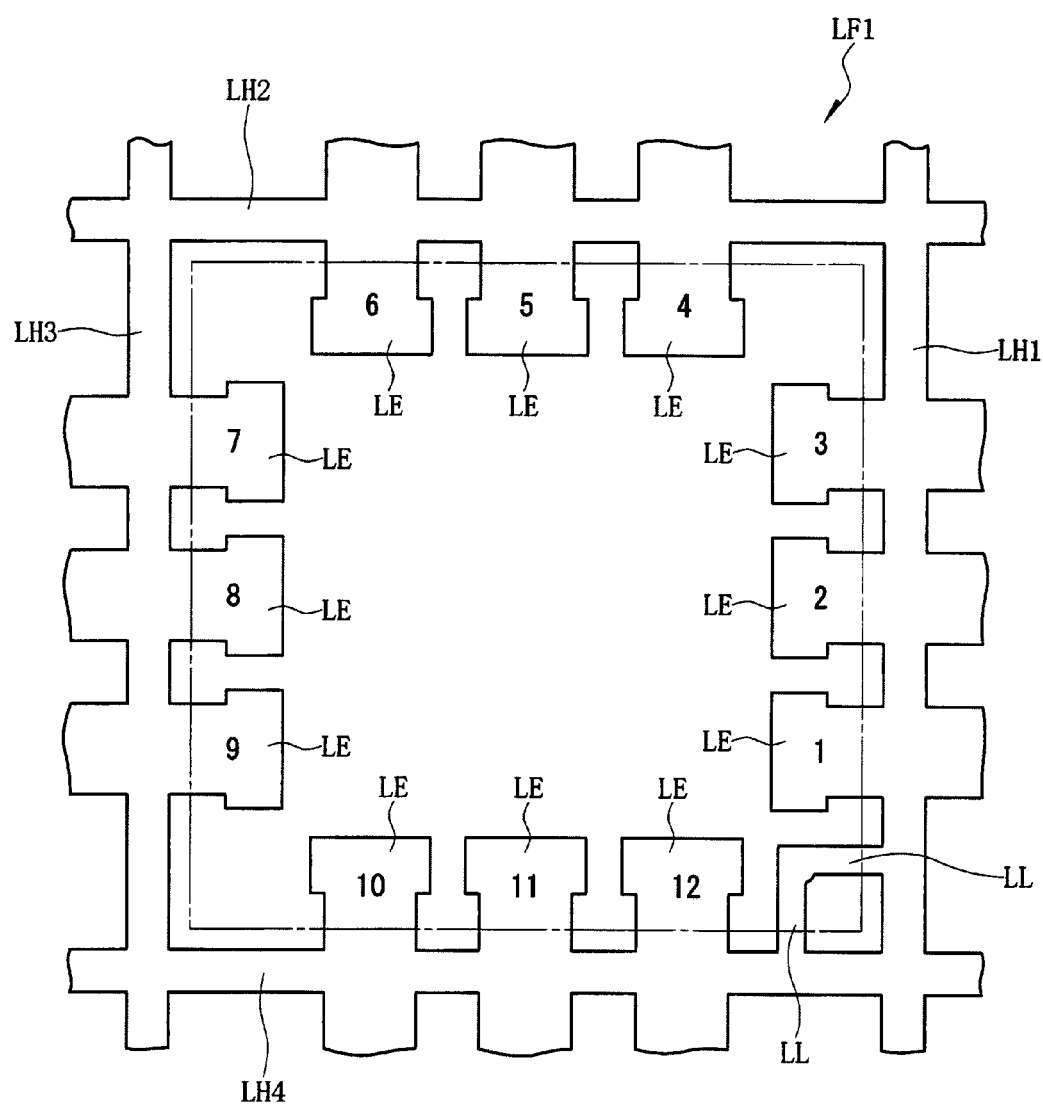
FIG. 8 is a plan view of the main part showing a front surface of a lead frame according to one embodiment.
Figure 9:
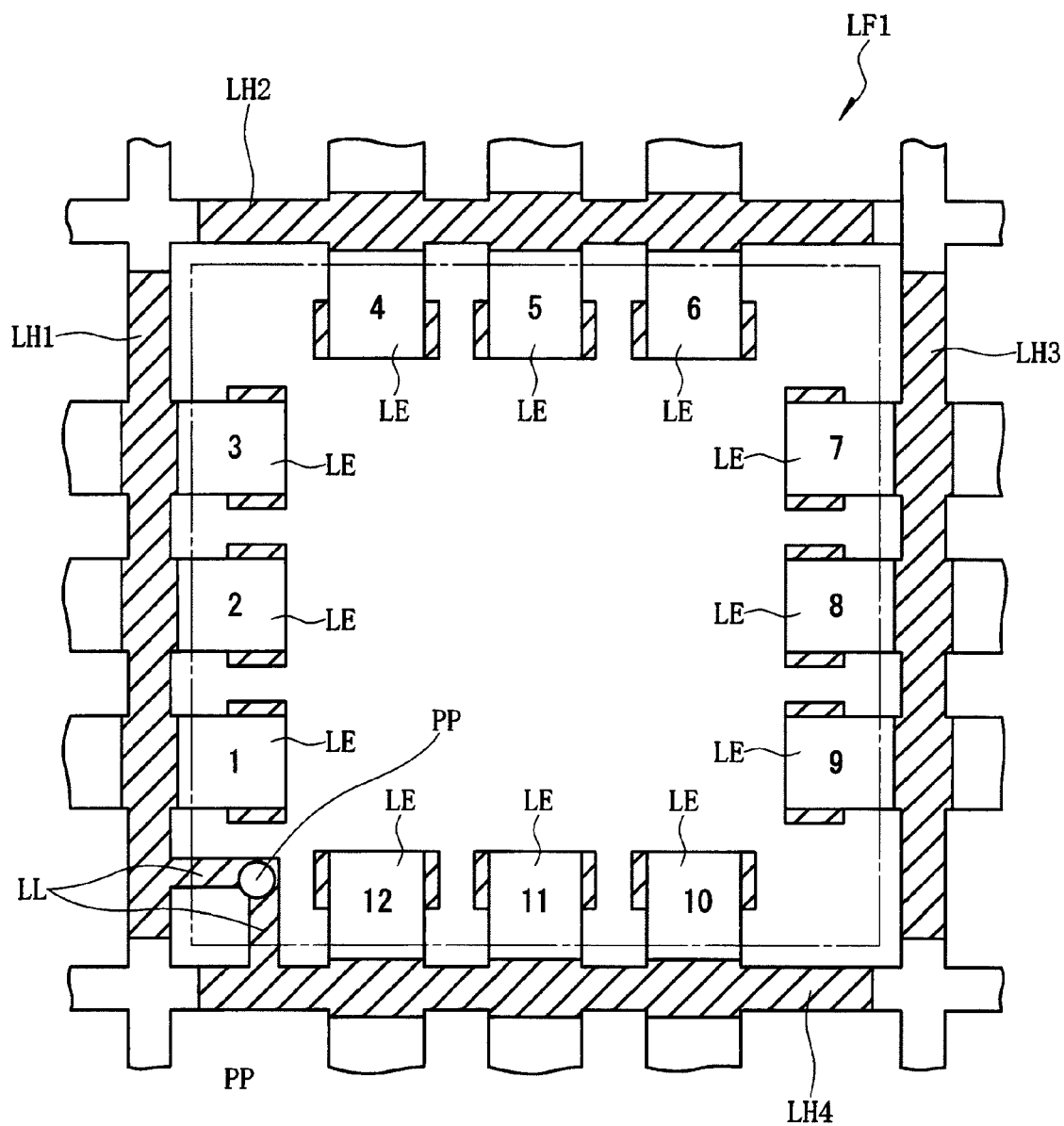
FIG. 9 is a plan view of the main part showing a rear surface of the lead frame according to one embodiment.
Figure 28:
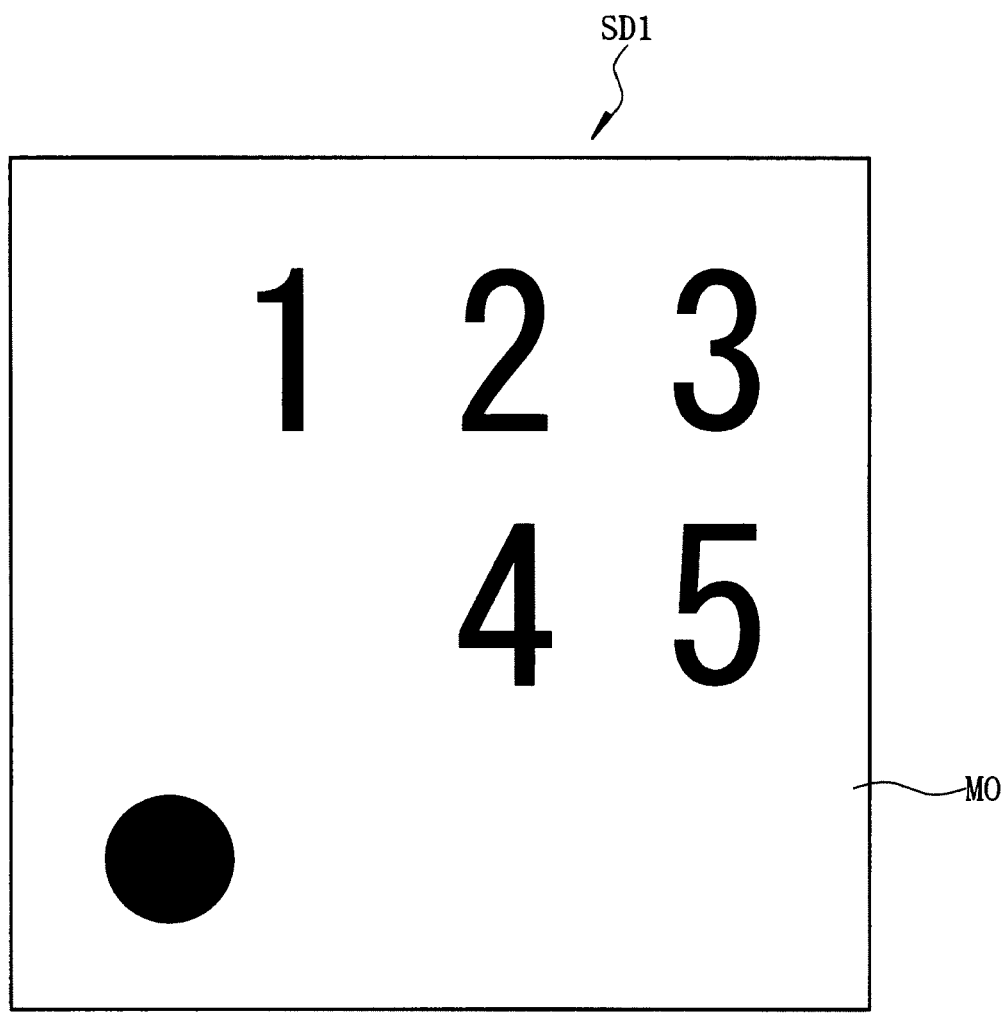
FIG. 28 is a plan view of the main part showing a front surface of the semiconductor device according to one embodiment.
Figure 29:
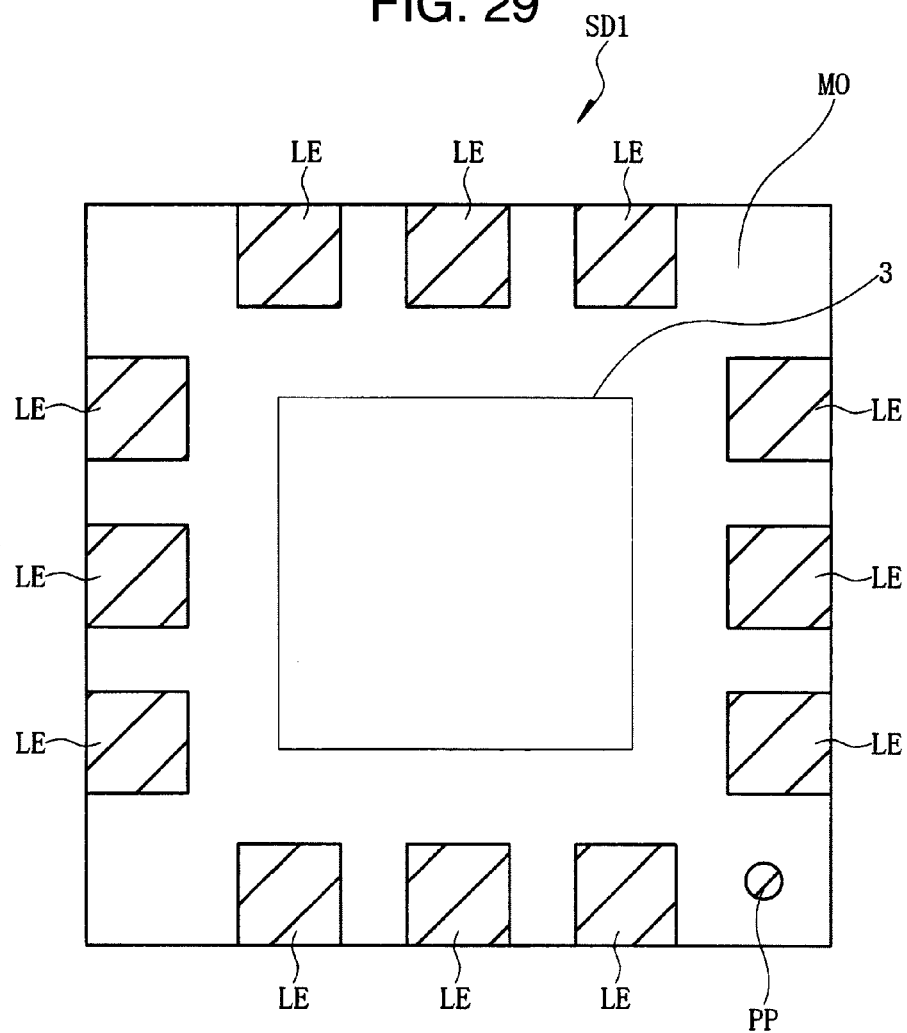
FIG. 29 is a plan view of the main part showing a rear surface of the semiconductor device according to one embodiment.
Figure 30:
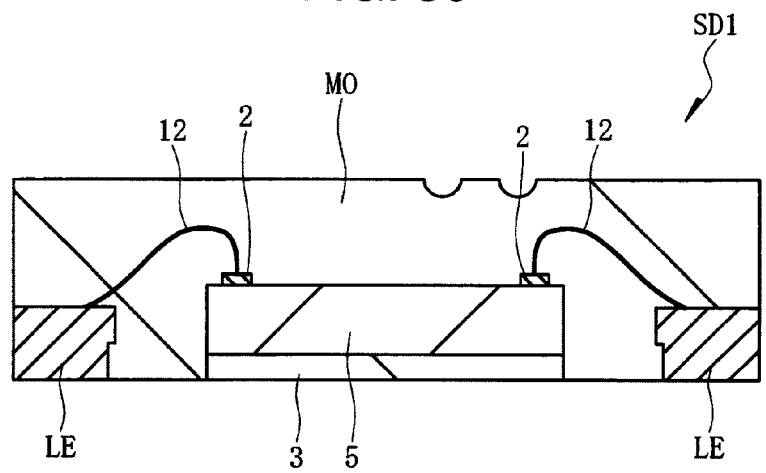
FIG. 30 is a cross-sectional view of the main part showing a cross section of the semiconductor device according to one embodiment.
Figure 31:
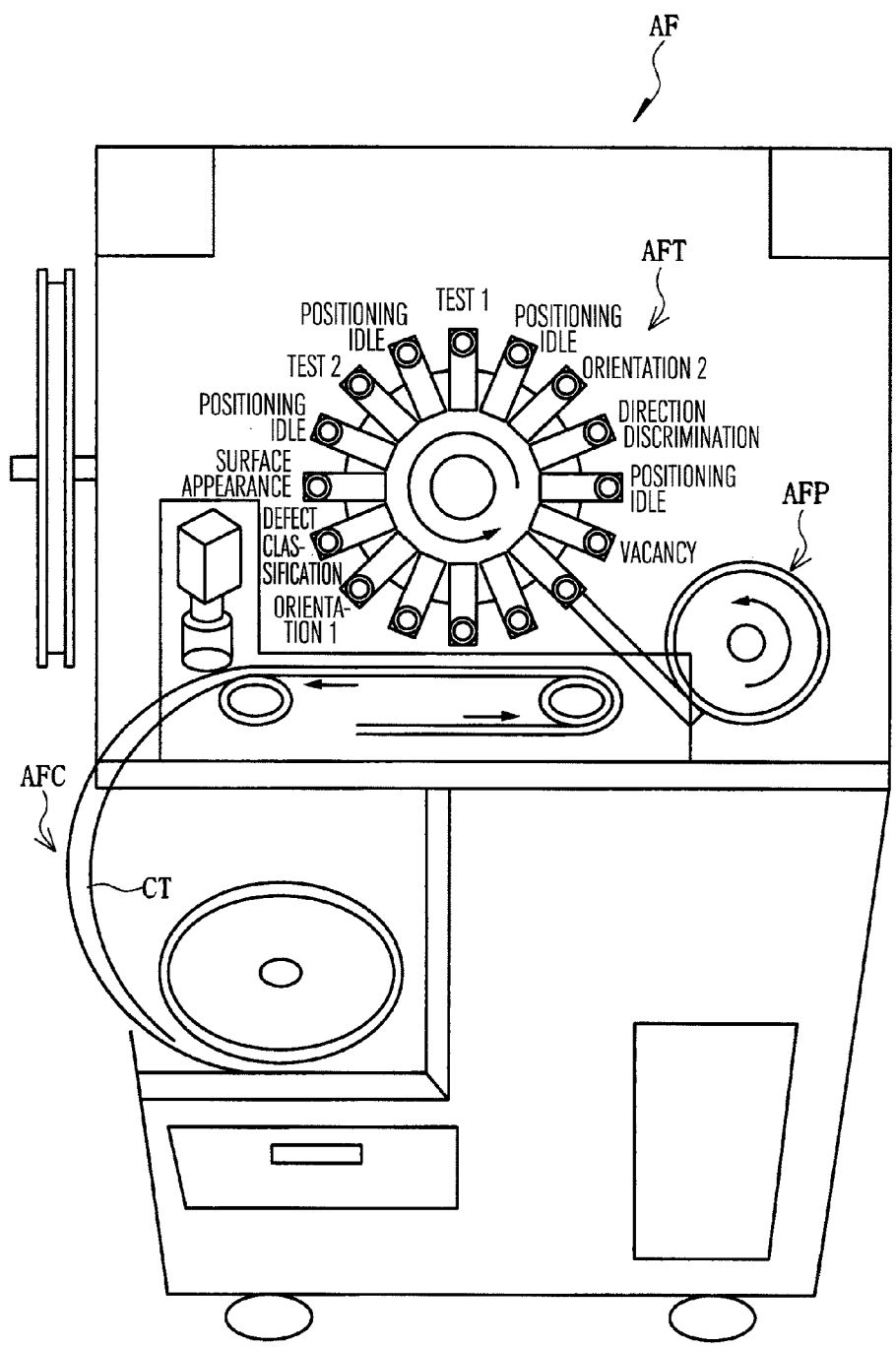
FIG. 31 is a schematic view for explaining an automatic parts feeder according to one embodiment.
Figure 32:
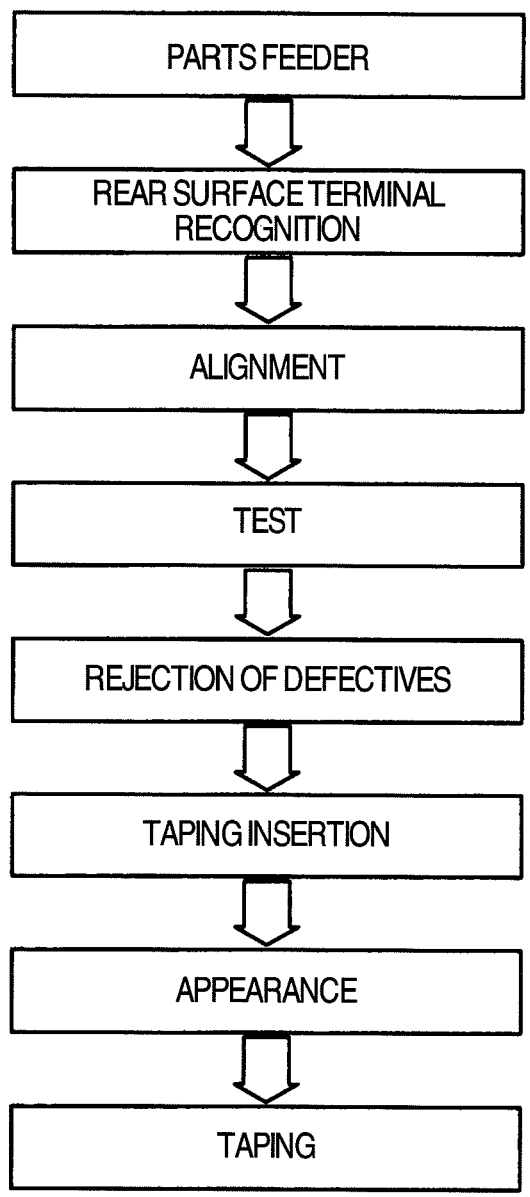
FIG. 32 is a step view for explaining a property selection of a parts feeder system according to one embodiment.
Figure 33:
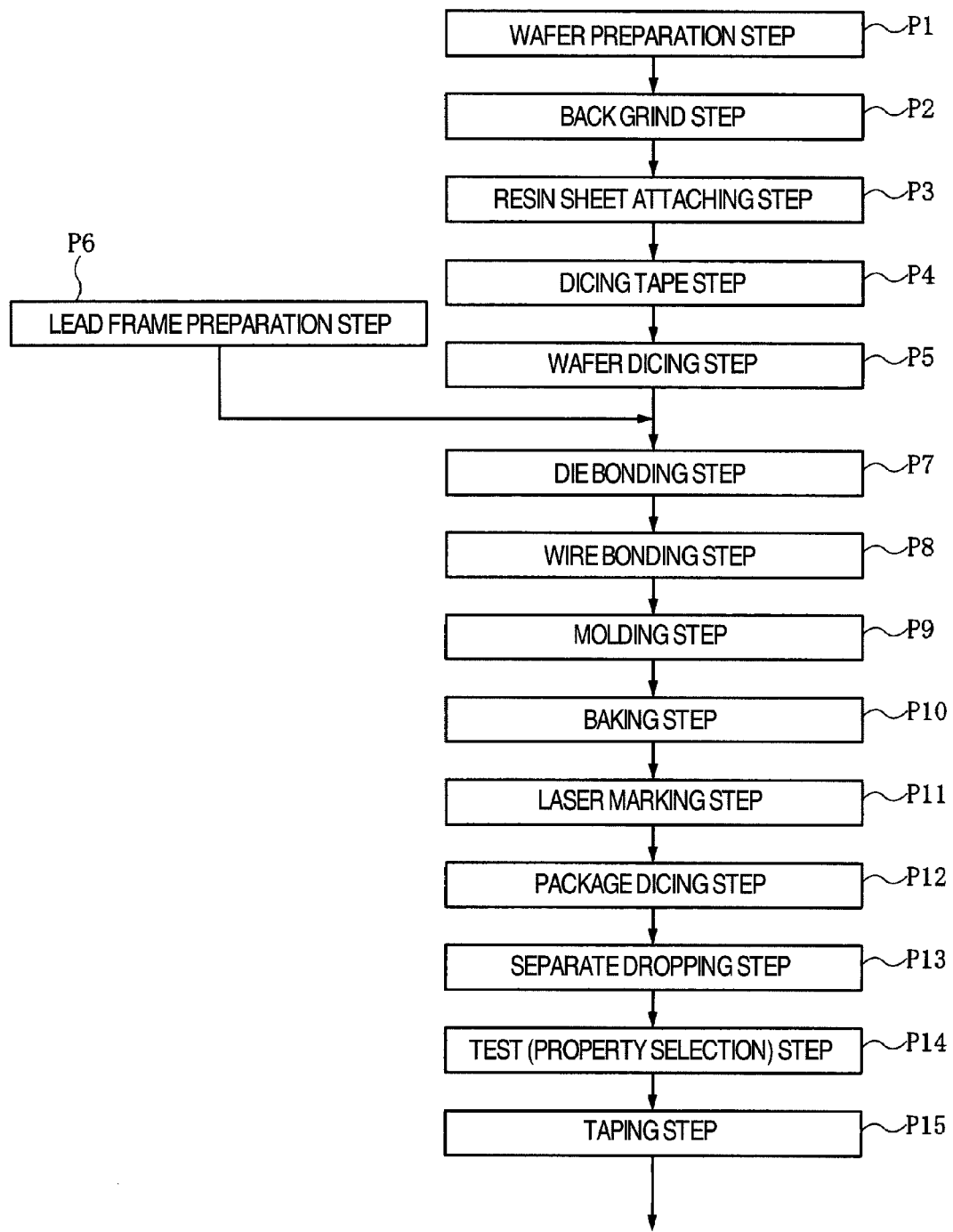
FIG. 33 is a step view for explaining a manufacturing method of the semiconductor device according to one embodiment.

FIG. 4 to FIG. 7 are cross-sectional views of a main part of a semiconductor device in a manufacturing step for explaining the semiconductor device manufacturing method. FIG. 8 is a plan view of the main part showing a front surface of a lead frame, and FIG. 9 is a plan view of the main part showing a rear surface of the lead frame. FIG. 10 to FIG. 22 are views for explaining the lead frame manufacturing step. FIG. 23 to FIG. 27 are cross-sectional views of the main part of the semiconductor device in the manufacturing step for explaining the semiconductor device manufacturing method. FIG. 28 is a plan view of the main part showing a front surface of the semiconductor device, FIG. 29 is a plan view of the main part showing a rear surface of the semiconductor device, and FIG. 30 is a cross-sectional view of the main part showing a cross section of the semiconductor device. FIG. 31 is a schematic view for explaining an automatic parts feeder. FIG. 32 is a step view for explaining property selection of the parts feeder system. FIG. 33 is a step view for explaining the semiconductor device manufacturing method.

<Wafer Preparation Step P1>

As shown in FIG. 4, a semiconductor wafer 1 is prepared. The semiconductor wafer 1 is formed of monocrystalline silicon, and it has a diameter of, for example, 200 mm or 300 mm, and a thickness (first thickness) of, for example, 0.7 mm or more (a value when it is put into the manufacturing step). The semiconductor wafer 1 has a first principal surface (front surface) 1x, plural chip regions 1CA which are formed into compartments arranged in a matrix state on the first principal surface 1x, cutting regions (scribe regions, dicing regions, dicing lines) 1SA formed between mutually adjacent chip regions 1CA among the plural chip regions 1CA, and a second principal surface (rear surface) 1y on the opposite side of the first principal surface 1x.

An integrated circuit which comprises plural semiconductor devices, a multilayer wiring layer which has an insulating layer and a wiring layer laminated into plural layers, and a front surface protection film which is formed to cover the multilayer wiring layer is formed on each chip region 1CA of the first principal surface 1x of the semiconductor wafer 1, and it is not limitative. The insulating layer is formed of, for example, a silicon oxide ($SiO_2$) film. The wiring layer is formed of a metal film of, for example, aluminum (Al), tungsten (W), or copper. The above front surface protection film is formed of, for example, a silicon oxide film or a multilayer film which has an inorganic insulation film and an organic insulation film, such as a silicon nitride ($Si_3N_4$) film, laminated. And, on each chip region 1CA of the first principal surface 1x of the semiconductor wafer 1, plural electrode pads (bonding pads, front surface electrode) 2 electrically connected to the above plural semiconductor device are arranged along respective sides of the respective chip regions 1CA (the plural electrode pads 2 are partly shown in FIG. 4). The plural electrode pads 2 are formed of the wiring on the uppermost layer in the above-described multilayer wiring layer and exposed via openings which are formed in the above front surface protection film in correspondence with the respective electrode pads 2.

<Back Grind Step P2>

A protection tape (back grind tape) covering the integrated circuit is applied to the first principal surface 1x side of the semiconductor wafer 1, and the second principal surface 1y of the semiconductor wafer 1 is roughly ground by a grinding material (for example, roughness of #360) to decrease the thickness of the semiconductor wafer 1 to a prescribed thickness. Subsequently, the second principal surface 1y of the semiconductor wafer 1 is finish ground by a grinding material (for example, roughness of #1500 or #2000) having finer roughness than the previously used grinding material to remove the distortion of the second principal surface 1y of the semiconductor wafer 1 produced when roughly ground (back grind). In addition, polishing streaks of the second principal surface 1y of the semiconductor wafer 1 produced when finish grinding is removed by, for example, a spin etching method, a CMP (Chemical Mechanical Polishing) method or the like (stress relief). When the above back grind and the above stress relief were terminated, the semiconductor wafer 1 has a thickness (second thickness) of, for example, 0.13 mm. The above stress relief is not required to be performed on all the semiconductor wafers 1 but performed depending on the strength required for the semiconductor chip.

<Resin Sheet Attaching Step P3>

As shown in FIG. 5, a film-type resin sheet (an adhesive sheet, an adhesive film, or a sealing material) 3 is applied to the second principal surface 1y of the semiconductor wafer 1. After the semiconductor device SD1 is completed, the resin sheet 3 functions as a sealing material to protect the rear surface of the semiconductor chip. The resin sheet 3 is, for example, a thermosetting type and made of an epoxy type resin containing a filler ($SiO_2$ particles). Its thickness is, for example, 20 to 30 µm and is preferably in a peripheral range having 25 µm as a center value. And, the filler content is, for example, 60 wt %. Then, the semiconductor wafer 1, to which the resin sheet 3 is applied, is subjected to a heat treatment.

<Dicing Tape Step P4>

As shown in FIG. 6, a dicing tape 4 is prepared. It is not shown but a frame having an annular shape in a plan view is attached to the peripheral edge of the dicing tape 4. The dicing tape 4 has, for example, polyolefin as the base material, and its thickness is, for example, 90 µm. And, the top surface (surface where the semiconductor wafer 1 is fixed) of the dicing tape 4 has an adhesive layer (not shown) thereon. The adhesive layer is, for example, an acrylic UV curing adhesive and has an adhesive force of, for example, 200 g/25 mm before UV irradiation and 10 to 20 g/25 mm after UV irradiation.

Then, the top surface of the dicing tape 4 and the second principal surface 1y of the semiconductor wafer 1 are opposed and attached mutually with the resin sheet 3 between them. Thus, the semiconductor wafer 1 is fixed to the top surface of the dicing tape 4 via the resin sheet 3.

<Wafer Dicing Step P5>

As shown in FIG. 7, an ultrathin round blade on which, for example, fine diamond particles are attached is used to cut the semiconductor wafer 1 longitudinally and transversely along cutting regions 1SA. At the same time, the resin sheet 3 is also cut longitudinally and transversely along the cutting regions 1SA of the semiconductor wafer 1. The semiconductor wafer 1 is divided into semiconductor chips 5, which maintain an aligned state because the semiconductor chips 5 are fixed to the frame by the dicing tape 4 even after dividing. In the resin sheet attaching step P3 which is a previous manufacturing step, the resin sheet 3 is firmly adhered to the second principal surface 1y of the semiconductor wafer 1, so that there is not caused a problem that the semiconductor chips 5 are peeled from the resin sheet 3, and the semiconductor chips 5 are dispersed or the like.

<Lead Frame Preparation Step P6>

As shown in FIG. 8 and FIG. 9, a lead frame LF1 is prepared. The lead frame LF1 is made of a conductive member such as copper and has a front surface (top surface) and a rear surface (undersurface) which is on the opposite side of the front surface. The lead frame LF1 corresponds to a single semiconductor product and has a structure in which a unit frame having twelve leads LE and a suspension lead LL is arranged in plural in a square holding frame (holding part) surrounding a chip mounting region. FIG. 8 and FIG. 9 show a part of the lead frame LF1 corresponding to the unit frame.

The holding frame surrounding the chip mounting region is configured of two first holding part LH1 and third holding part LH3 which are separated from each other and provided to extend in a first direction, and two second holding part LH2 and fourth holding part LH4 which are separated from each other and provided to extend in a second direction intersecting at right angles with the first direction. And, the twelve leads LE are arranged to surround the central portion (chip mounting region) of the unit frame. The twelve leads LE are provided with an index (an identification number, a serial number, or an index), one corner portion of the unit frame is selected, and one lead LE closest to the corner portion is determined as index 1. And, based on it, indexes are sequentially applied to the leads LE which are continuously arranged on the periphery of the unit frame. The lead LE corresponding to index 1 is "1 pin" as described above. Numerals which are given in addition to the leads LE in FIG. 8 and FIG. 9 are indexes.

The twelve leads LE are coupled to and held by the first holding part LH1, the second holding part LH2, the third holding part LH3, or the fourth holding part LH4. For example, the leads LE corresponding to indexes 1, 2 and 3 are coupled to and held by the first holding part LH1, the leads LE corresponding to indexes 4, 5 and 6 are coupled to and held by the second holding part LH2, the leads LE corresponding to indexes 7, 8 and 9 are coupled to and held by the third holding part LH3, and the leads LE corresponding indexes 10, 11 and 12 are coupled to and held by the fourth holding part LH4.

In addition, the suspension lead LL is comprised of a first part provided to extend along a first direction, and a second part provided to extend along a second direction. One end of the second part of the suspension lead LL is coupled to the first holding part LH1 between a corner portion where the first holding part LH1 and the fourth holding part LH4 intersect with each other and the lead LE (1 pin) with index 1, and one end of the first part of the suspension lead LL is coupled to the fourth holding part LH4 between the above corner portion and the lead LE (lead LE added with a final index) with the index 12. And, the other end of the first part of the suspension lead LL and the other end of the second part of the suspension lead LL hold the identification mark PP.

The front surface of the lead frame LF1 is flat but parts (for example, hatched parts shown in FIG. 9) of the rear surface of the lead frame LF1 are undergone half-etching to process the lead frame LF1 to decrease its thickness to about a half, and the rear surface of the lead frame LF1 is not flat. A part of the lead frame LF1 which is not undergone the half-etching has a thickness of, for example, 0.125 mm.

In the later molding step, half-etching is performed on the twelve leads LE from the rear surface sides of the leads LE excepting a part of the lead LE exposed from the rear surface of the resin-sealed body. The other parts of the lead LE where half-etching was performed are sealed with the resin-sealed body in the later molding step. The sealed thickness is, for example, 0.065 mm.

The suspension lead LL which is connected to the first holding part LH1 and the fourth holding part LH4 is subjected to half-etching from the rear surface side of the suspension lead LL. The rear surface of a conductive member which is held by the suspension lead LL and not subjected to the half-etching becomes identification mark PP, which is exposed from the rear surface of the resin-sealed body, in the later molding step. The suspension lead LL undergone the half-etching is sealed with the resin-sealed body in the later molding step. The sealed thickness is, for example, 0.065 mm.

In the holding part, half-etching is performed on the first holding part LH1, the second holding part LH2, the third holding part LH3, and the fourth holding part LH4 from their rear surface side excepting the corner portion where the first holding part LH1 and the second holding part LH2 intersect with each other, the corner portion where the second holding part LH2 and the third holding part LH3 intersect with each other, the corner portion where the third holding part LH3 and the fourth holding part LH4 intersect with each other, and the corner portion where the fourth holding part LH4 and the first holding part LH1 intersect with each other. The first holding part LH1, the second holding part LH2, the third holding part LH3, and the fourth holding part LH4 have a thickness of, for example, 0.065 mm due to the half-etching.

Figure 10:
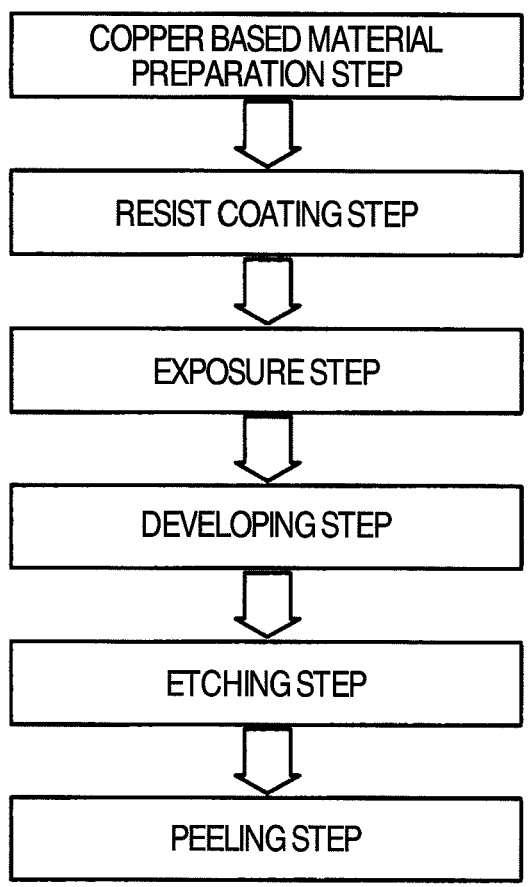
FIG. 10 is a step view for explaining a manufacturing method of the lead frame according to one embodiment.

A manufacturing step of the lead frame LF1 is explained with reference to FIG. 10 to FIG. 22. FIG. 10 is a step view for explaining the manufacturing method of the lead frame LF1. FIG. 11A, FIG. 13A, FIG. 15A, FIG. 17A, FIG. 19A and FIG. 21A are plan views of main parts showing a front surface of the lead frame LF1, and FIG. 11B, FIG. 13B, FIG. 15B, FIG. 17B, FIG. 19B and FIG. 21B are plan views of main parts showing a rear surface of the lead frame LF1. FIG. 12, FIG. 14, FIG. 16, FIG. 18, FIG. 20 and FIG. 22 are cross-sectional views of main parts showing a cross section of the lead frame LF1.

P6-(1) Copper-Based Material Preparation Step

Figure 11A:
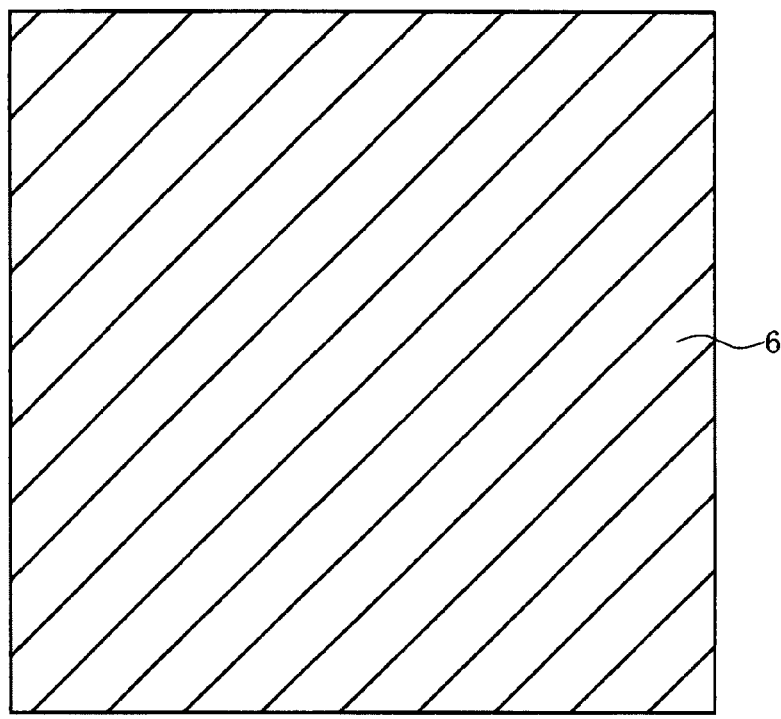
FIG. 11A and FIG. 11B are plan views of main parts respectively showing a front surface and a rear surface of the lead frame in the manufacturing step of the lead frame according to one embodiment.
Figure 11B:
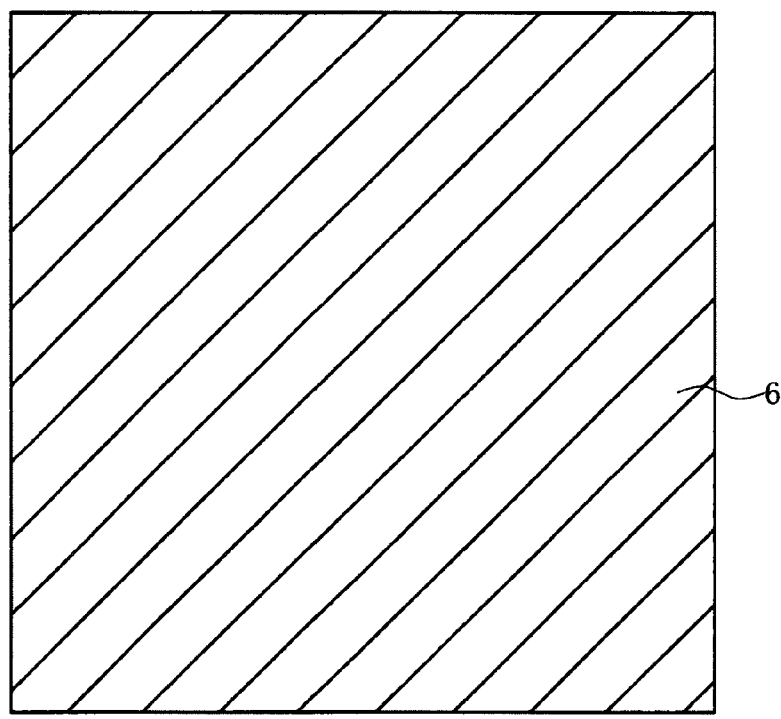
Figure 12:
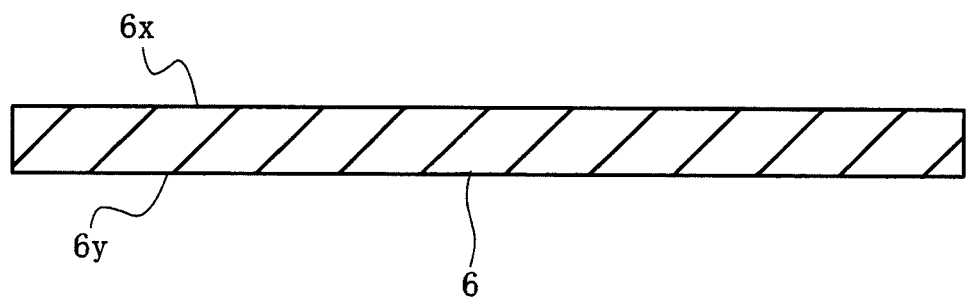
FIG. 12 is a cross-sectional view of the main part showing a cross section of the lead frame in the manufacturing step of the lead frame according to one embodiment.

As shown in FIGS. 11A, 11B and FIG. 12, a conductive member, for example, a copper-based material 6 is prepared. The copper-based material 6 has a front surface (top surface) 6x and a rear surface (undersurface) 6y which is on the opposite side of the front surface 6x, and its thickness is, for example, 0.125 mm.

P6-(2) Resist Coating Step

Figure 13A:
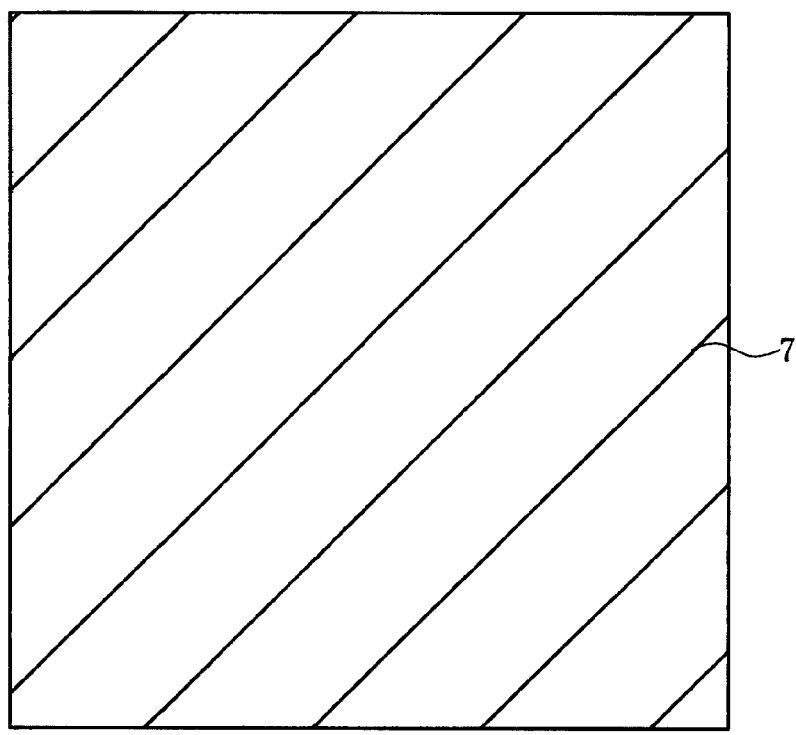
FIG. 13A and FIG. 13B are subsequent to FIGS. 11A, 11B and FIG. 12 and are plan views of the main parts of the same portions as in FIG. 11A and FIG. 11B.
Figure 13B:
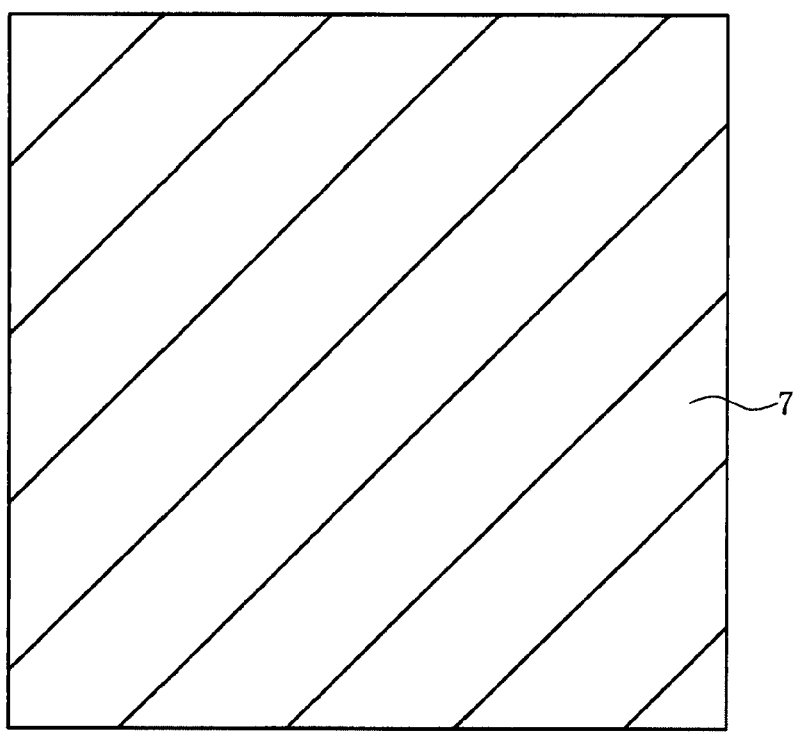
Figure 14:
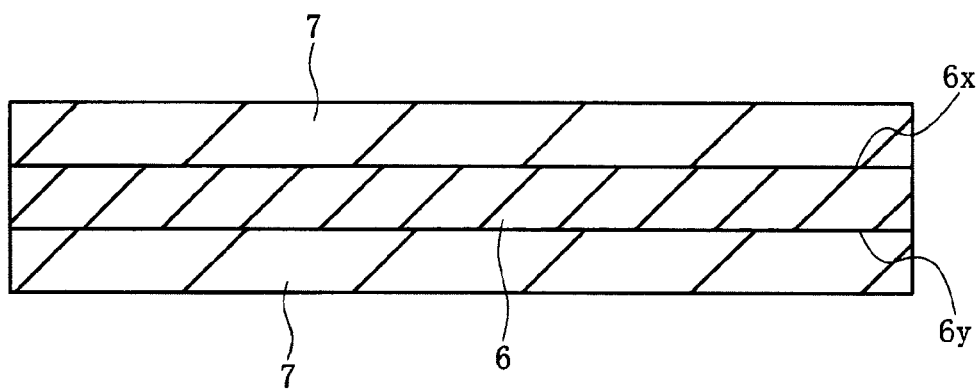
FIG. 14 is subsequent to FIGS. 11A, 11B and FIG. 12 and is a cross-sectional view of the main part of the same portion as in FIG. 12.

As shown in FIGS. 13A, 13B and FIG. 14, a resist film 7 is coated on the front surface 6x and the rear surface 6y of the copper-based material 6.

P6-(3) Exposure Step

Figure 15A:
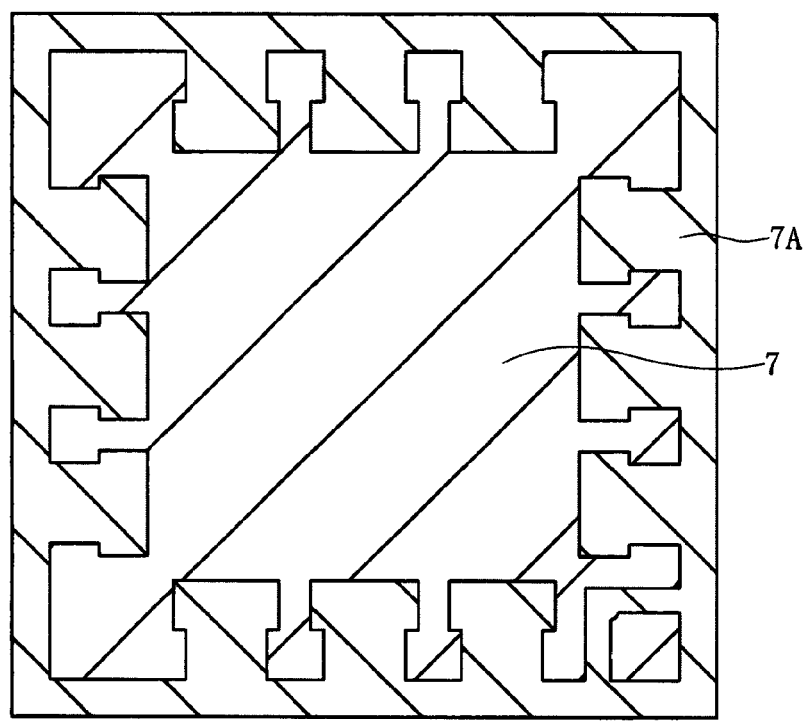
FIG. 15A and FIG. 15B are subsequent to FIGS. 13A, 13B and FIG. 14 and are plan views of the main parts respectively showing the same portions as in FIGS. 11A and 11B.
Figure 15B:
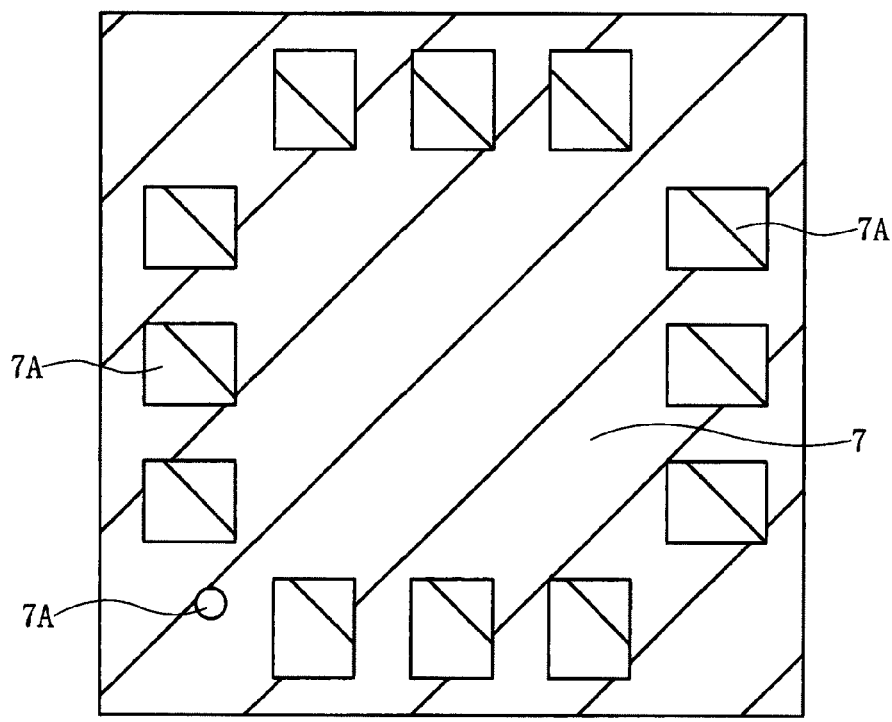
Figure 16:
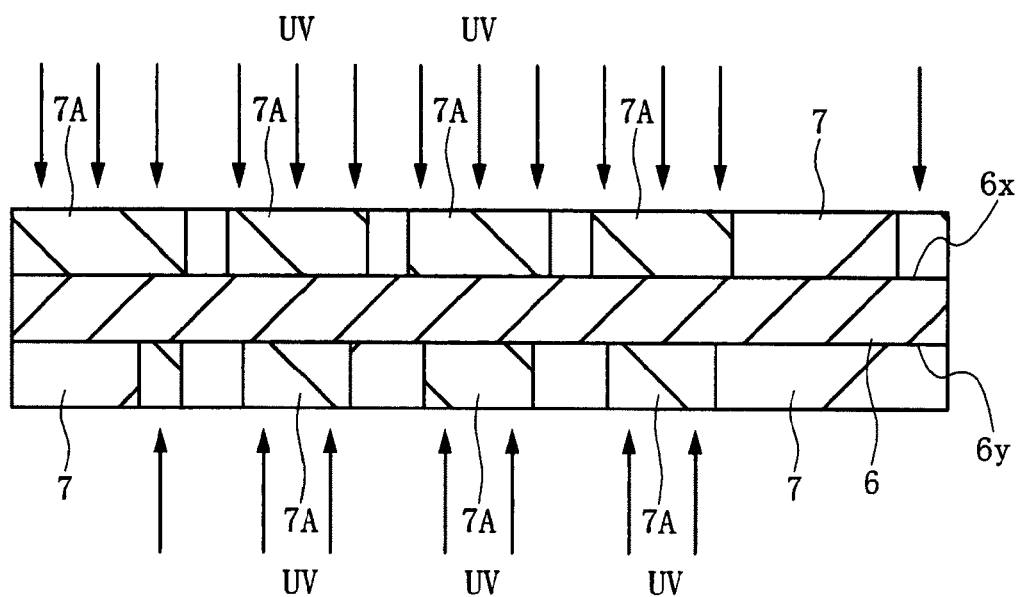
FIG. 16 is subsequent to FIGS. 13A, 13B and FIG. 14 and is a cross-sectional view of the main part of the same portion as in FIG. 12.

As shown in FIGS. 15A, 15B and FIG. 16, an exposure light (UV (Ultra Violet) light) is emitted from the front surface 6x side and the rear surface 6y side of the copper-based material 6 to the regions (regions where the lead frame is formed), where a resist film 7 is remained, to cure the resist film 7. In FIG. 16, a code 7A denotes the cured parts of the resist film 7.

P6-(4) Developing Step

Figure 17A:
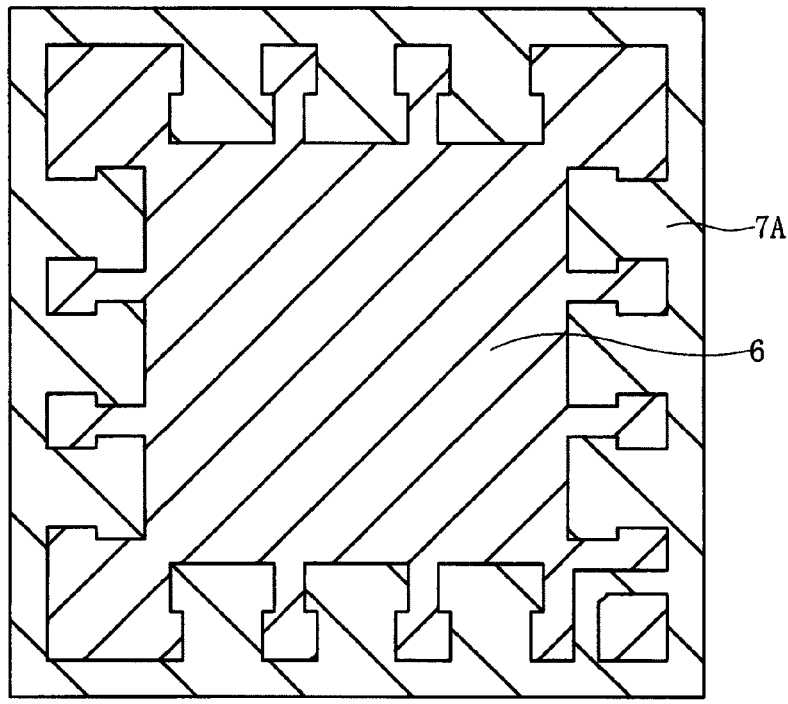
FIG. 17A and FIG. 17B are subsequent to FIGS. 15A, 15B and FIG. 16 and are plan views of the main parts respectively showing the same portions as in FIGS. 11A and 11B.
Figure 17B:
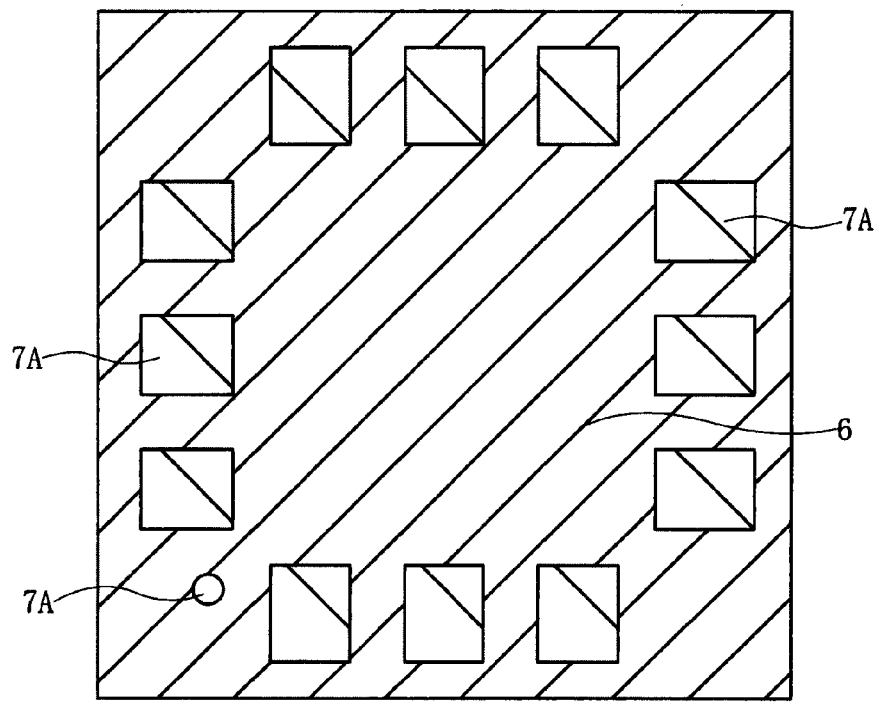
Figure 18:
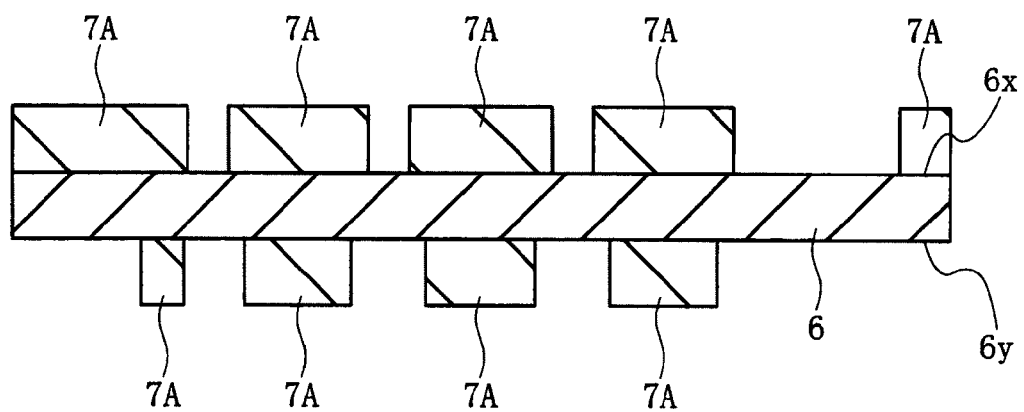
FIG. 18 is subsequent to FIGS. 15A, 15B and FIG. 16 and is a cross-sectional view of the main part showing the same portion as in FIG. 12.

As shown in FIGS. 17A, 17B and FIG. 18, the resist films 7 and 7A are subjected to a developing process, and the cured resist film 7A is remained on the front surface 6x and the rear surface 6y of the copper-based material 6. The resist film 7A formed on the front surface 6x of the copper-based material 6 and the resist film 7A formed on the rear surface 6y of the copper-based material 6 have a different shape from each other. Their different regions become regions which are subjected to half-etching.

That is, when seen through from the front surface 6x side of the copper-based material 6, the regions covered with the resist film 7A formed on the front surface 6x of the copper-based material 6 are larger than the regions covered with the resist film 7A formed on the rear surface 6y of the copper-based material 6, but all regions covered with the resist film 7A formed on the rear surface 6y of the copper-based material 6 overlap with the regions covered with the resist film 7A formed on the front surface 6x of the copper-based material 6.

P6-(5) Etching Step

Figure 19A:
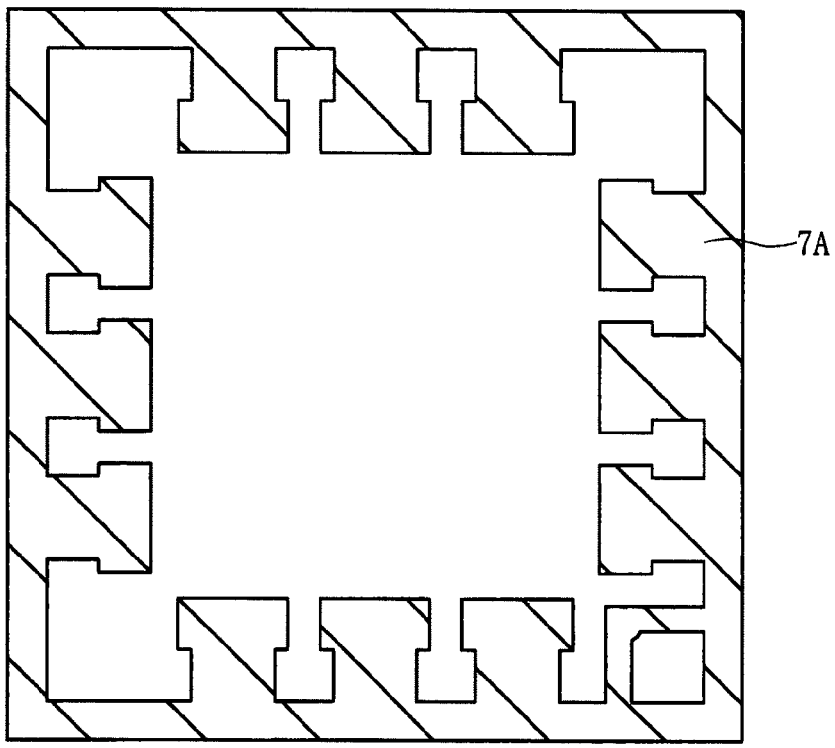
FIG. 19A and FIG. 19B are subsequent to FIGS. 17A, 17B and FIG. 18 and are plan views of the main parts respectively showing the same portions as in FIGS. 11A and 11B.
Figure 19B:
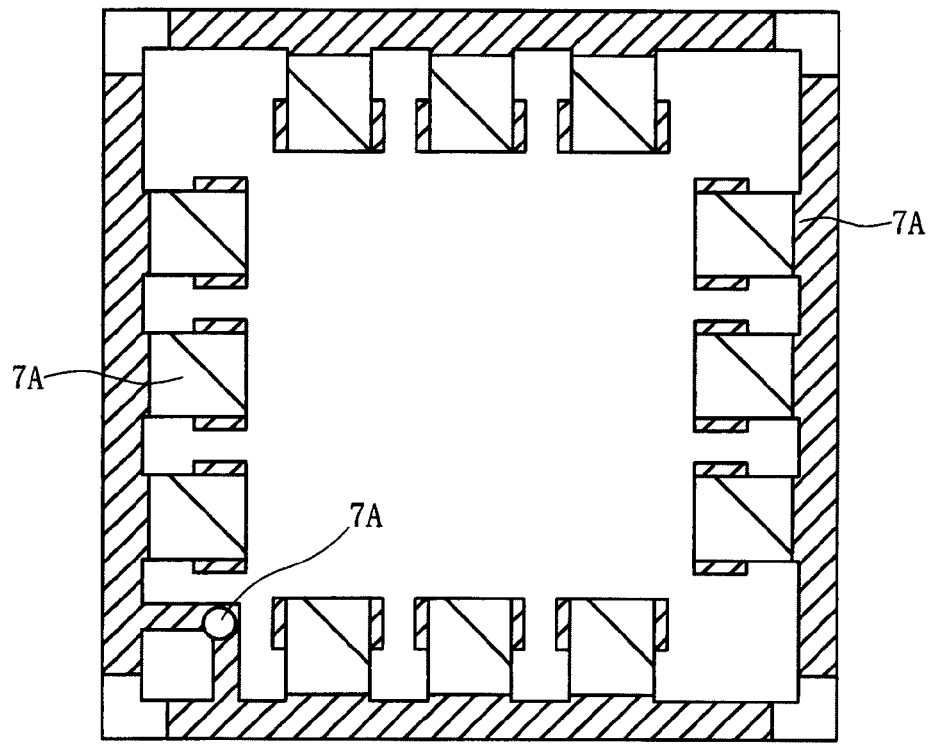
Figure 20:
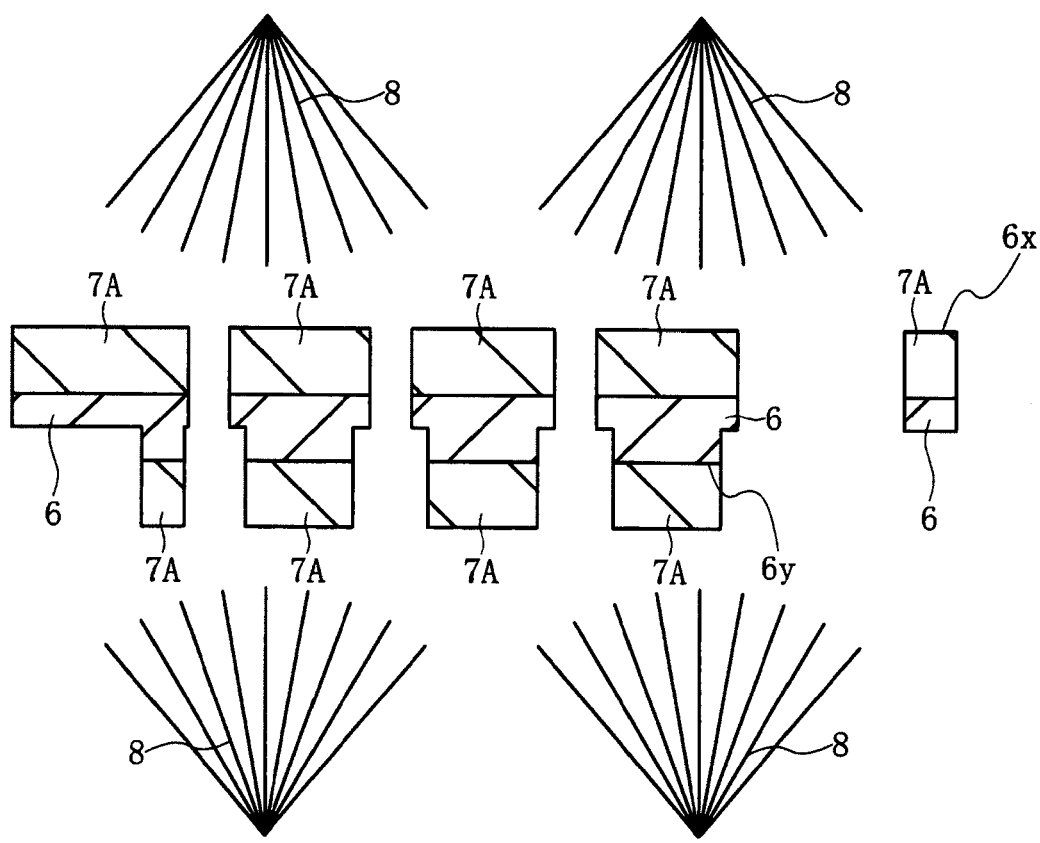
FIG. 20 is subsequent to FIGS. 17A, 17B and FIG. 18 and is a cross-sectional view of the main part of the same portion as in FIG. 12.
Figure 21A:
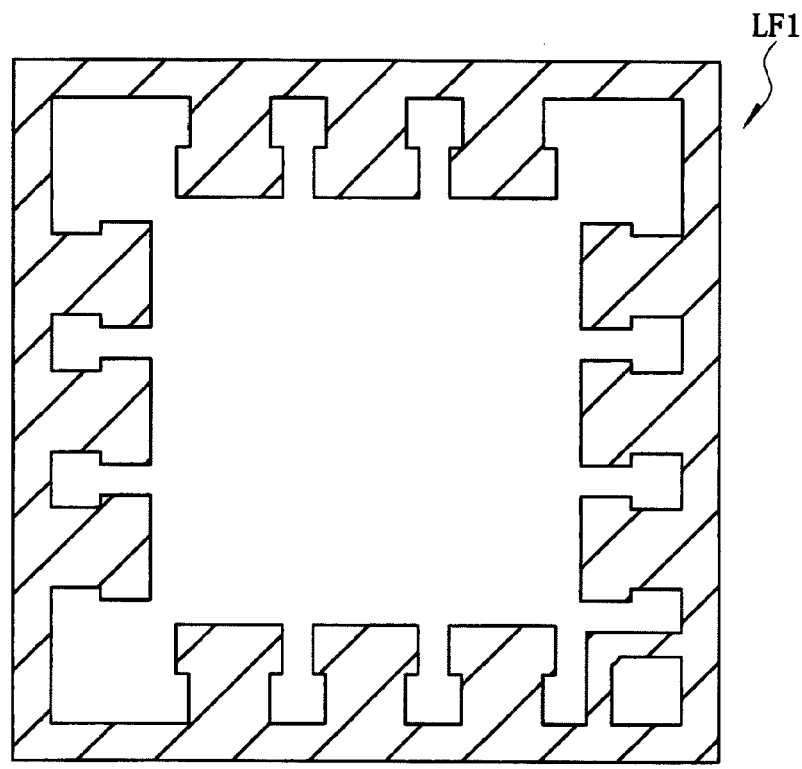
FIG. 21A and FIG. 21B are subsequent to FIGS. 19A, 19B and FIG. 20 and are plan views of the main parts respectively showing the same portions as in FIGS. 11A and 11B.
Figure 21B:
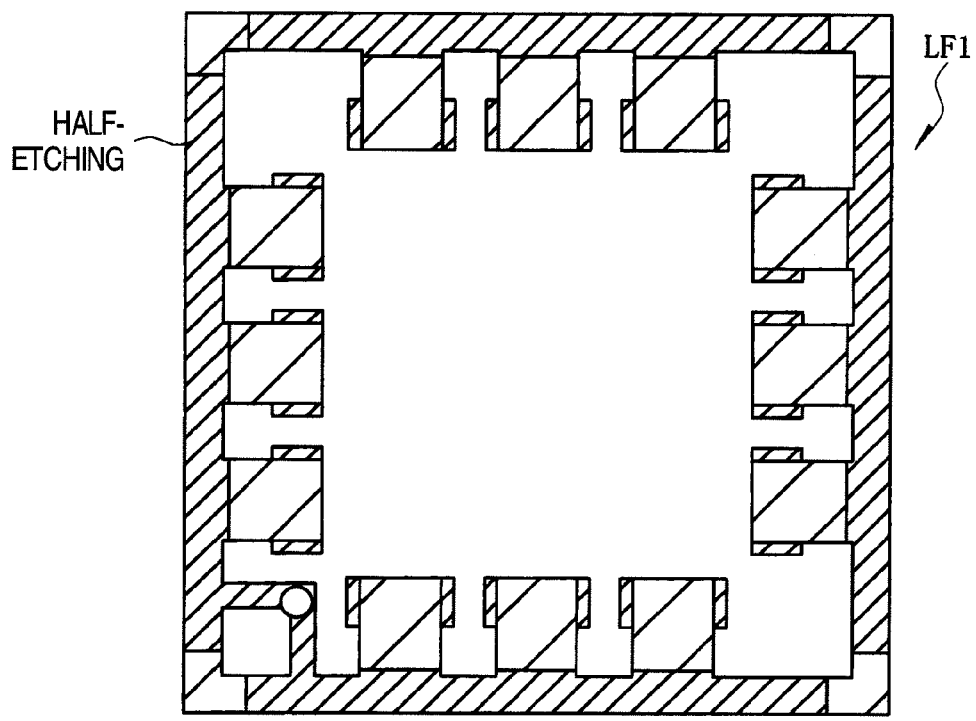

As shown in FIGS. 19A, 19B and FIG. 20, a melting solution 8 is sprayed to the copper-based material 6 from the front surface 6x side and the rear surface 6y side of the copper-based material 6 to perform etching of the copper-based material 6 not covered with the resist film 7A. The copper-based material 6 of the regions where the resist film 7A is not formed on neither of the front surface 6x and the rear surface 6y is etched in the thickness direction. On the other hand, the resist film 7A is formed on the front surface 6x but the rear surface 6y of the copper-based material 6 of the regions where the resist film 7A is not formed is etched (half-etching) to about a half in the thickness direction from the rear surface 6y.

That is to say, when seen through from the front surface 6x side of the copper-based material 6, the copper-based material 6 is not etched in the regions where the resist film 7A formed on the front surface 6x of the copper-based material 6 and the resist film 7A formed on the rear surface 6y of the copper-based material 6 overlap with each other. However, when seen through from the front surface 6x side of the copper-based material 6, in regions where the resist film 7A is formed on the front surface 6x of the copper-based material 6 but the resist film 7A is not formed on the rear surface 6y of the copper-based material 6, the copper-based material 6 is etched in the thickness direction from the rear surface 6y side while it is partly remained on the front surface 6x side.

Therefore, when seen through from the front surface 6x side of the copper-based material 6 in the regions where the identification mark PP is formed, the resist film 7A formed on the front surface 6x of the copper-based material 6 and the resist film 7A formed on the rear surface 6y of the copper-based material 6 overlap with each other, and the copper-based material 6 is not etched. However, when seen through from the front surface 6x side of the copper-based material 6 in the regions where the suspension lead LL is formed, the resist film 7A is formed on the front surface 6x of the copper-based material 6, but the resist film 7A is not formed on the rear surface 6y of the copper-based material 6, and the copper-based material 6 is etched in the thickness direction from the rear surface 6y side while it is partly remained on the front surface 6x side.

P6-(6) Peeling Step

Figure 22:
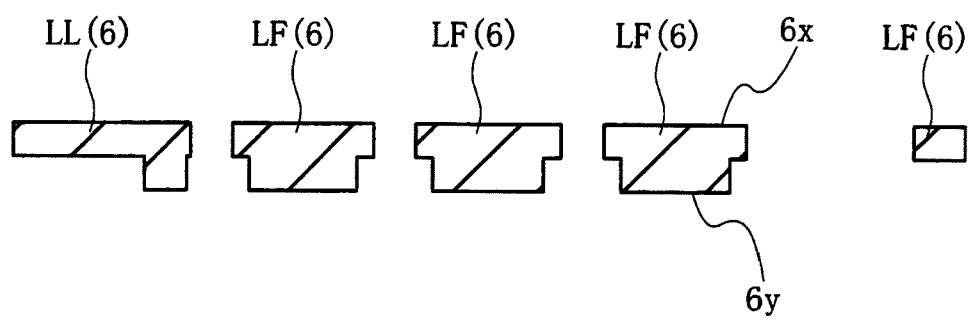
FIG. 22 is subsequent to FIGS. 19A, 19B and FIG. 20 and is a cross-sectional view of the main part showing the same portion as in FIG. 12.

As shown in FIG. 21 and FIG. 22, the resist film 7A is removed to complete the lead frame LF1.

In this embodiment, the identification mark PP has a circular shape in a plan view but it is not limitative, and it may be, for example, square.

Then, the lead frame LF1 is subjected to a plating treatment to form, for example, a palladium film (not shown) on the front surface and the rear surface of the lead frame LF1 by plating method.

<Die Bonding Step P7>

Ultraviolet rays are irradiated from the undersurface side of the dicing tape 4 to decrease the adhesive force of the adhesive layer formed on the top surface of the dicing tape 4 to, for example, about 10-20 g/25 mm, and the adhesive layer is cured. Thus, the respective semiconductor chips 5 become easy to separate from the dicing tape 4.

Figure 23:
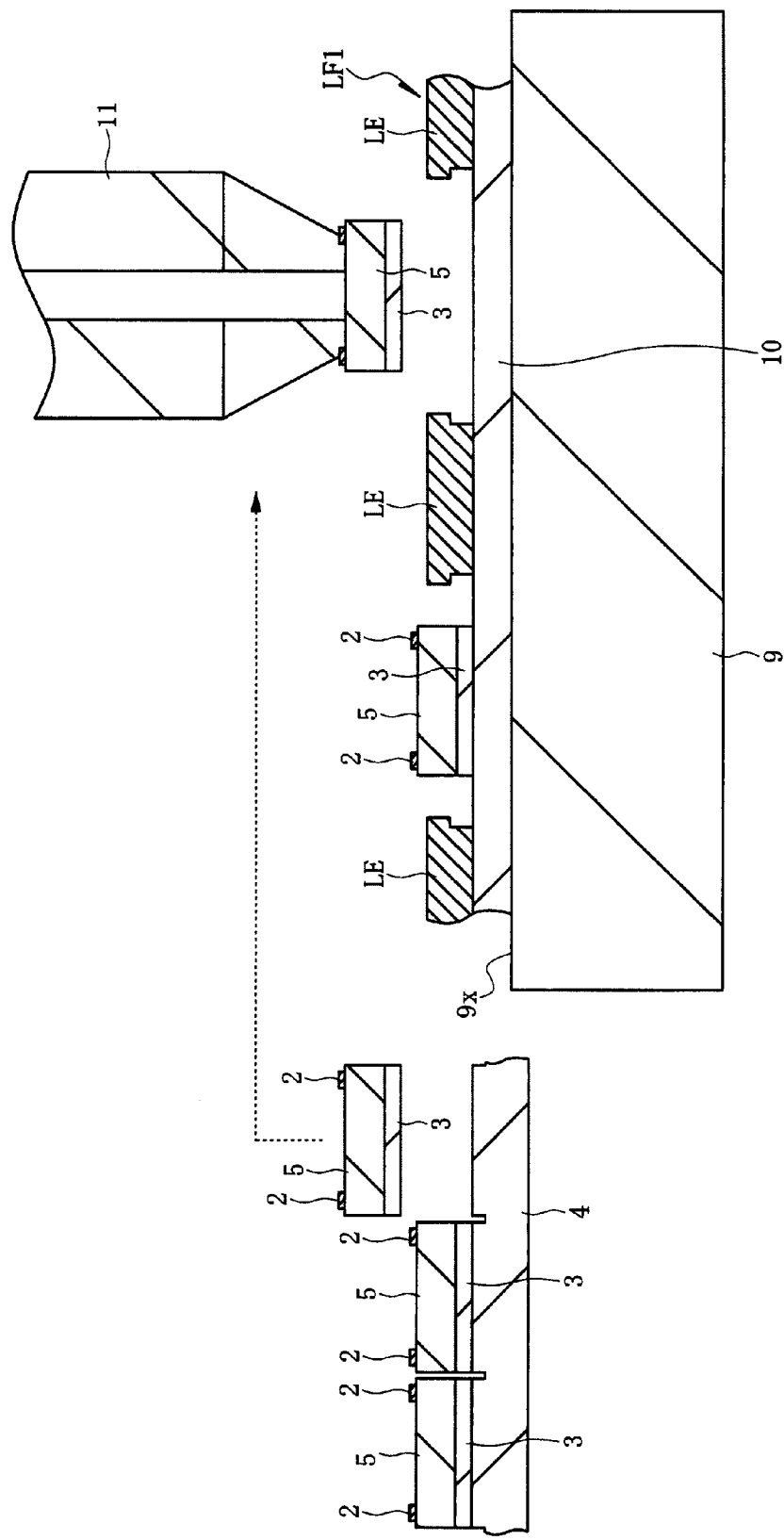
FIG. 23 is a cross-sectional view of the main part showing the semiconductor device in a die bonding step according to one embodiment.

As shown in FIG. 23, the rear surface of the lead frame LF1 and a front surface (top surface) 9x of a heat stage 9 having a heat source are then opposed to each other to arrange the lead frame LF1 on the front surface 9x of the heat stage 9 with a frame tape 10 between them. The heat stage 9 is made of a conductive member, for example, stainless steel (SUS430) and heated to, for example, 40 to 80° C.

Then, the front surface of the semiconductor chip 5 is adsorbed and held by a cylindrical collet 11, and the semiconductor chip 5 is picked up by removing from the dicing tape 4. Since the adhesive force of the adhesive layer formed on the top surface of the dicing tape 4 is weakened, even the semiconductor chip 5 which is thin and weakened in strength can be picked up without fail. The resin sheet 3 is adhered to the rear surface of the semiconductor chip 5.

The picked-up semiconductor chip 5 is then conveyed to a predetermined chip mounting region of the frame tape 10. Subsequently, the semiconductor chip 5 is arranged in the chip mounting region of the frame tape 10 via the resin sheet 3 adhered to the rear surface of the semiconductor chip 5, and heat (for example, 40 to 80° C.) is applied to fix the semiconductor chip 5 to the chip mounting region of the frame tape 10.

<Wire Bonding Step P8>

Figure 24:
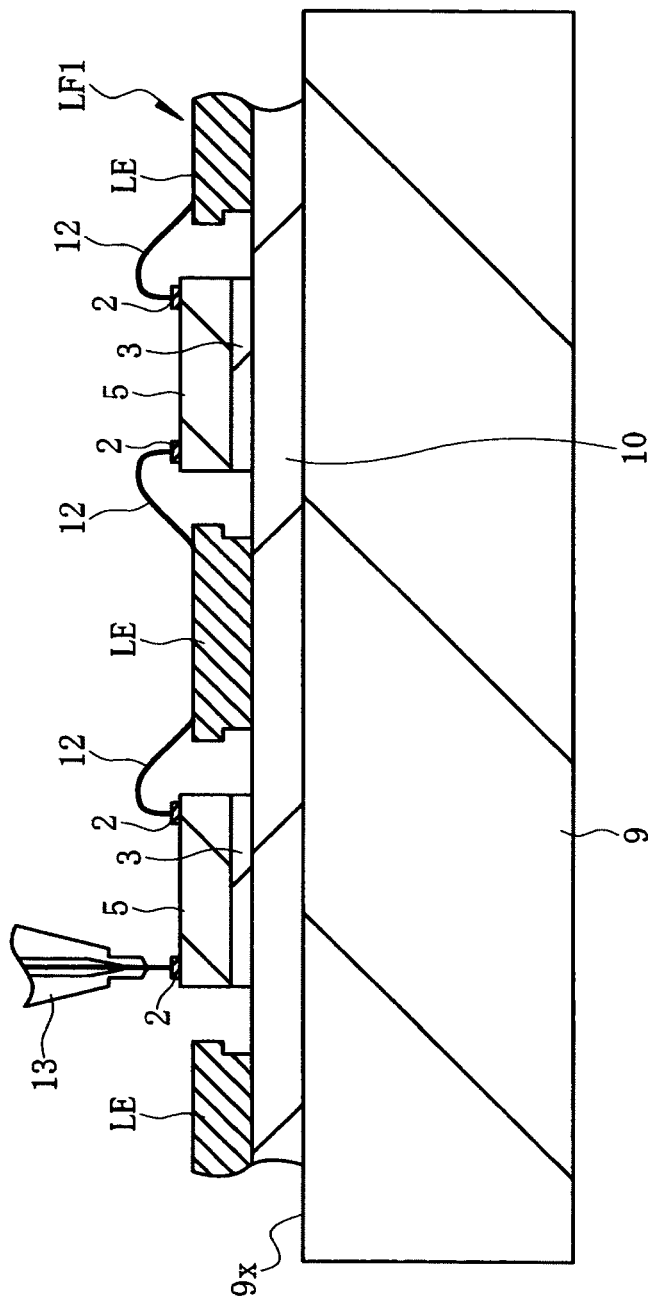
FIG. 24 is a cross-sectional view of the main part showing the semiconductor device in a wire bonding step according to one embodiment.

As shown in FIG. 24, the plural electrode pads 2 arranged along the edge of the front surface of the semiconductor chip 5 and the front surfaces of plural leads LE positioned on the periphery of the chip mounting regions are electrically connected using plural conductive wires 12 by, for example, a nail head bonding method (ball bonding method) also using ultrasonic vibration for thermocompression bonding. Specifically, the front ends of the conductive wires 12 are melted by arc discharge to form a ball by surface tension, which is thermocompression bonded to the front surfaces of the electrode pads 2 and the lead LE by a capillary (cylindrical joining jig) 13 while applying for example, ultrasonic vibration of 120 kHz.

Mainly a forward bonding system (system by which after the electrode pads 2 on the semiconductor chip 5 and parts of the conductive wires 12 are connected, the leads LE and the other parts of the conductive wires 12 are connected) is used, but a reverse bonding system (system by which after the lead LE and parts of the conductive wires 12 are connected, the electrode pads 2 of the semiconductor chip 5 and the other parts of the conductive wires 12 are connected) may be used.

<Molding Step P9>

Figure 25:
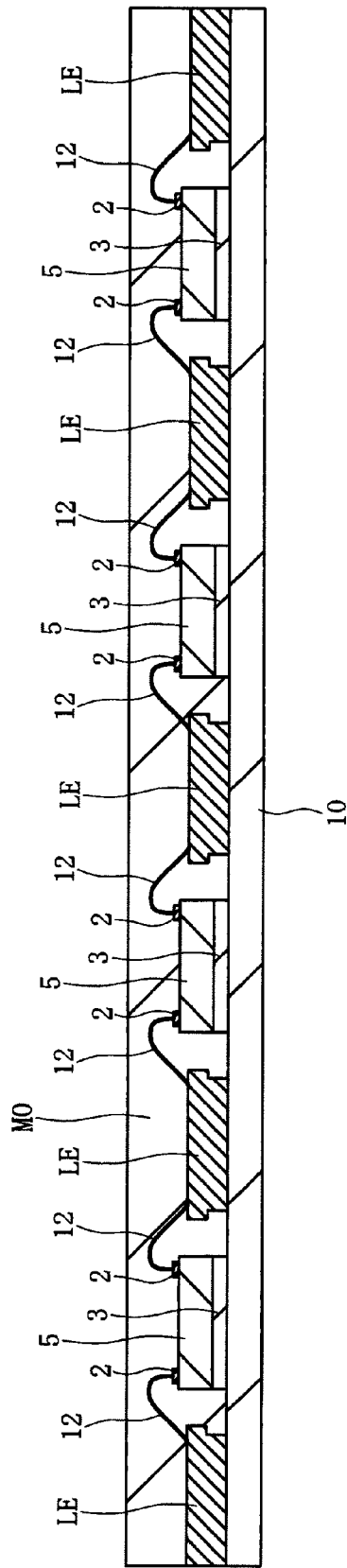
FIG. 25 is a cross-sectional view of the main part showing the semiconductor device in a molding step according to one embodiment.

As shown in FIG. 25, the lead frame LF1 on which plural semiconductor chips 5 are mounted and the frame tape 10 are set on a die molding device, the temperature is raised to pump the liquefied sealing resin to flow it into the die molding device, and the surface side, on which the semiconductor chips etc. are mounted, of the frame tape 10 is sealed with the sealing resin to form a single resin-sealed body (sealed body) MO. In order to reduce the stress, the resin-sealed body MO is made of, for example, an epoxy-based thermosetting insulating resin to which a phenol curing agent, silicone rubber and a large number of fillers (for example, silica) are added.

<Baking Step P10>

For example, a heat treatment (post-cure bake) is performed at a temperature of 175° C. for five hours. This heat treatment is, for example, air (Air) bake. Thus, the plural semiconductor chips 5, parts (parts of the front surface and the side surface) of the plural leads LE, the plural conductive wires 12, and parts (front surface (top surface) and side surface) of the identification mark PP are sealed with the resin-sealed body MO. The resin-sealed body MO has a thickness of, for example, 300 p.m.

<Laser Marking Step P11>

Figure 26:
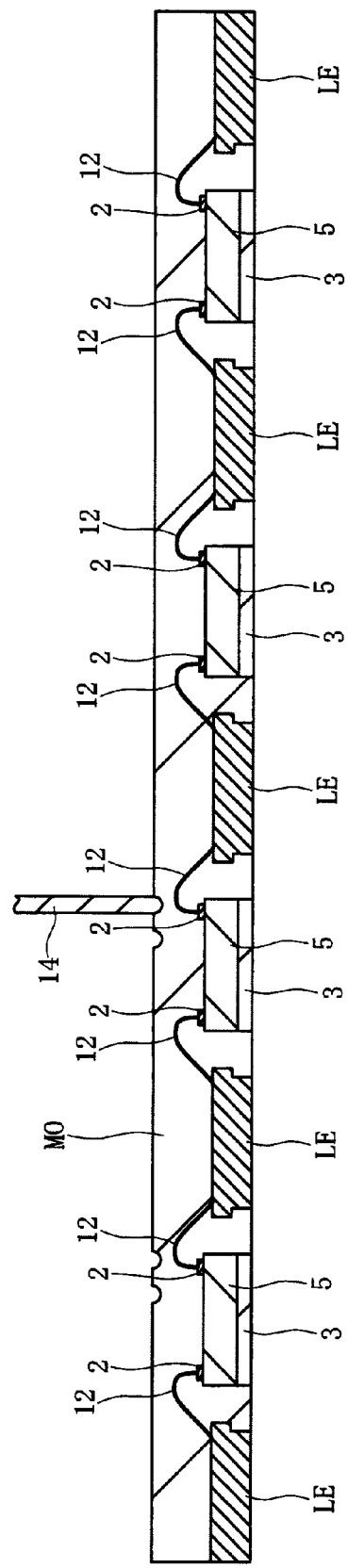
FIG. 26 is a cross-sectional view of the main part showing the semiconductor device in a laser marking step according to one embodiment.

As shown in FIG. 26, after the frame tape 10 is removed, a laser 14 is used to mark a product name or the like on the top surface of the resin-sealed body MO.

<Package Dicing Step P12>

Figure 27:
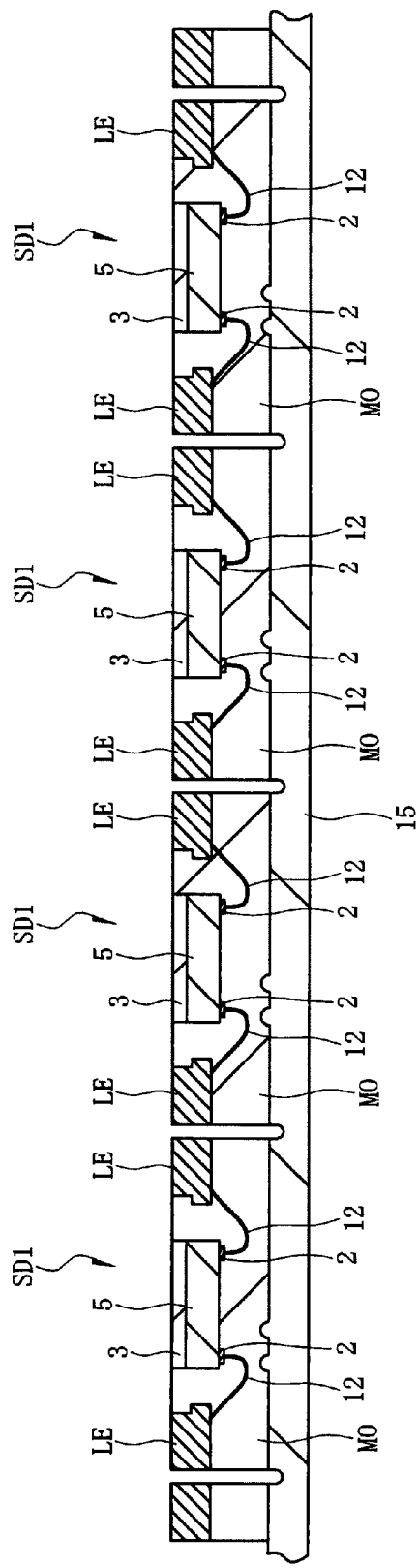
FIG. 27 is a cross-sectional view of the main part showing the semiconductor device in a package dicing step according to one embodiment.

As shown in FIG. 27, a dicing tape 15 is prepared. Subsequently, the resin-sealed body MO, which has sealed the plural semiconductor chips 5, parts (parts of the front surface and the side surface) of the plural leads LE, and the plural conductive wires 12, is fixed to the top surface of the dicing tape 15.

Then, an ultrathin round blade to which, for example, fine diamond particles are adhered is used to cut the resin-sealed body MO, the plural leads LE, and the suspension lead LL from the rear surface side of the resin-sealed body MO longitudinally and transversely along the scribe regions. The resin-sealed body MO is divided into the semiconductor devices (semiconductor package) SD 1 but they maintain an aligned state because the semiconductor devices SD1 are fixed by the dicing tape 15 even after dividing. Subsequently, the semiconductor device SD1 is washed to remove debris and the like produced when the resin-sealed body MO was cut.

<Separate Dropping Step P13>

As shown in FIG. 28 to FIG. 30, the dicing tape 15 is removed to separate into individual semiconductor devices SD1. As shown in FIG. 28, laser marks are formed in the front surface of the semiconductor device SD 1. As shown in FIG. 29, the rear surfaces of twelve leads LE and the resin sheet 3 applied to the rear surface of the semiconductor chip 5 are exposed on the rear surface of the semiconductor device SD 1. Therefore, the rear surface of the semiconductor chip 5 is protected by the resin sheet 3. And, the side surfaces of the twelve leads are partly exposed from the resin-sealed body MO on the side surfaces of the semiconductor device SD1. Since it is difficult to visually recognize the resin sheet 3 distinguishing from the resin-sealed body MO, the resin sheet 3 is not recognized by the position recognition of 1 pin described later.

The plural semiconductor devices SD1 which are individually divided are inspected in a later step, and only those which are judged to be good are packed. In this embodiment, an automatic parts feeder AF shown in FIG. 31 is used when inspecting and packing. Therefore, the plural semiconductor devices SD1 are fed in a separate state into a parts feeder part AFP of the automatic parts feeder AF. The plural semiconductor devices SD1 fed into the parts feeder part AFP are sequentially inspected (test (property selection) step P14) in the automatic parts feeder AF, and the semiconductor devices SD1 judged to be good are packed (taping step P15).

<Test (Property Selection) Step P14>

According to the property selection step of the parts feeder system shown in FIG. 32, the semiconductor devices SD1 are carried from the parts feeder part AFP to an inspection section AFT of the automatic parts feeder AF and sorted according to product standards. The plural semiconductor devices SD1 separately fed into the parts feeder part AFP of the automatic parts feeder AF are carried one by one to the inspection section AFT of the automatic parts feeder AF.

In the inspection section AFT, the shapes and areas of the semiconductor devices SD1 are judged, the twelve leads LE and the identification mark PP exposed from the resin-sealed body MO are recognized, and the position of 1 pin is recognized according to the identification mark PP. Subsequently, based on the position of 1 pin, the semiconductor device SD1 is rotated by 90°, 180° or −90° and aligned. Subsequently, the semiconductor devices SD1 are tested (property selection). A semiconductor device SD1 which is judged no good by the test is removed.

<Taping Step P15>

The semiconductor devices SD1 which were judged as being good by the test are housed in a carrier tape CT by a taping part AFC of the automatic parts feeder AF. Subsequently, the appearance of the semiconductor devices SD1 housed in the carrier tape CT, for example, the presence or not of a laser mark, a flaw or the like is inspected. Subsequently, for example, the carrier tape CT is wound on a reel, which is then housed in a moistureproof bag, and the bag containing the reel is shipped.

Thus, according to Embodiment 1, since the position of 1 pin can be recognized easily by virtue of the identification mark PP, the property selection of the parts feeder system can be adopted even for the tabless package.

(First Modified Example of the Embodiment)

In the above-described embodiment, as shown in, for example, FIG. 8 and FIG. 9 described above, the identification mark PP is coupled to the first holding part LH1 which is between the corner portion where the first holding part LH1 provided to extend in the first direction and the fourth holding part LH4 provided to extend in the second direction intersect with each other and the lead LE (1 pin) with index 1, is held by the suspension lead LL which is coupled to the fourth holding part LH4 between the above corner portion and the lead LE with index 12. However, the identification mark PP may be held by the suspension lead which is coupled to one of the first holding part LH1 provided to extend in the first direction or the fourth holding part LH4 provided to extend in the second direction.

Figure 34:
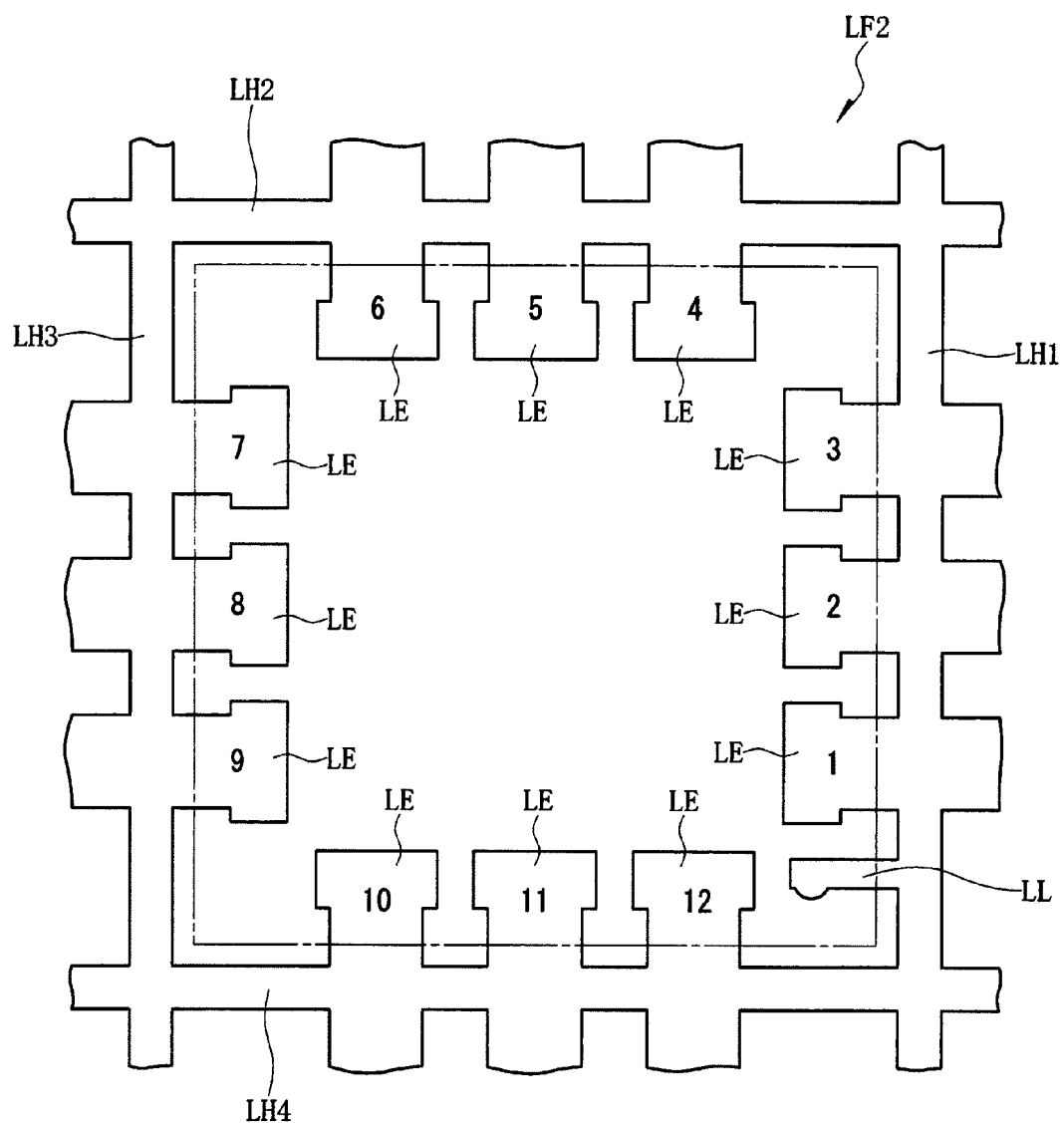
FIG. 34 is a plan view of a main part showing a front surface of a lead frame according to a first modified example of one embodiment.

The first modified example of the lead frame is explained with reference to FIG. 34 and FIG. 35. FIG. 34 is a plan view of a main part showing a front surface of a lead frame, and FIG. 35 is a plan view of a main part showing a rear surface of the lead frame.

Figure 35:
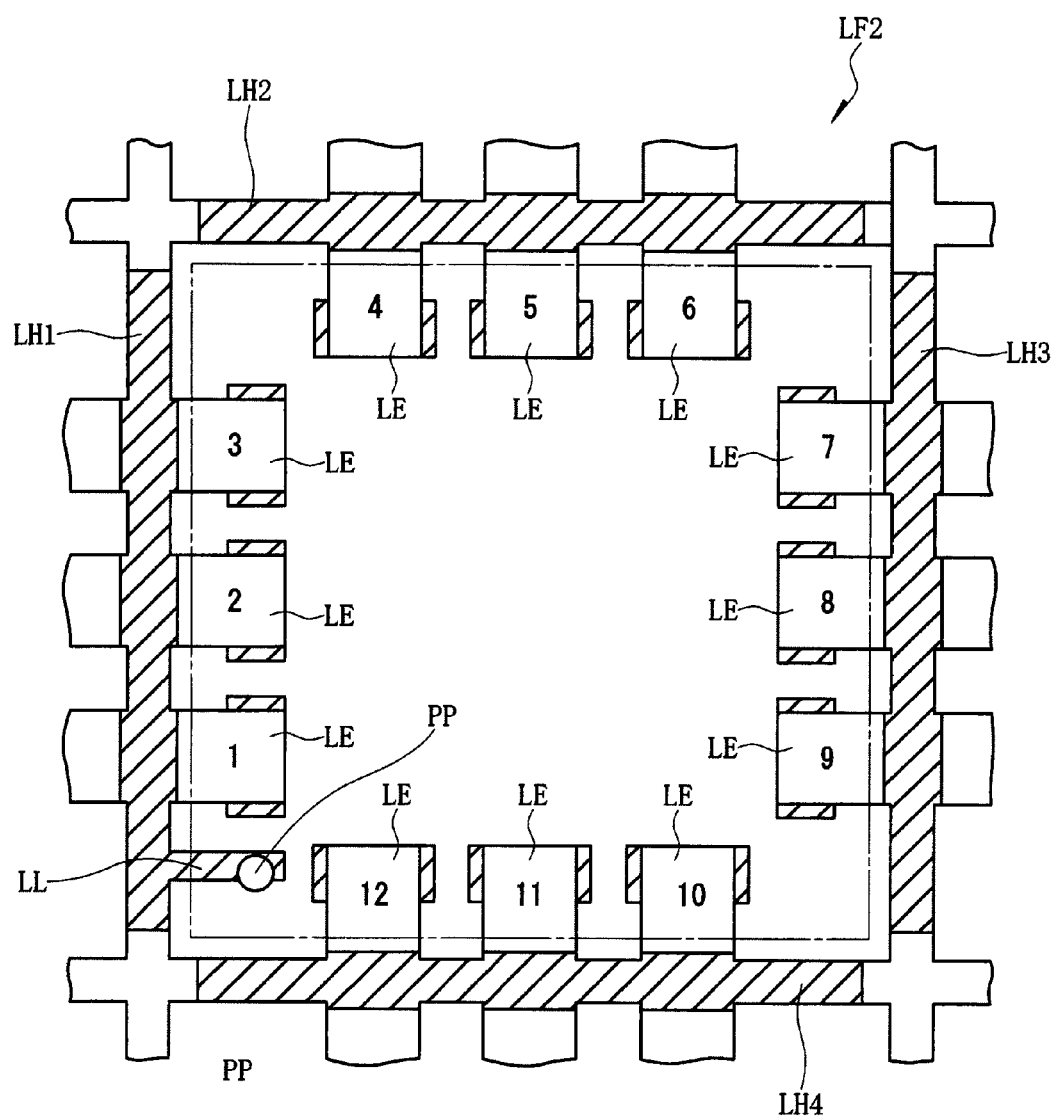
FIG. 35 is a plan view of the main part showing a rear surface of the lead frame according to the first modified example of one embodiment.

As shown in FIG. 34 and FIG. 35, similar to the lead frame LF1 shown in FIG. 8 and FIG. 9 described above, a lead frame LF2 has a first holding part LH1, a second holding part LH2, a third holding part LH3, and a fourth holding part LH4, and has twelve leads LE arranged to surround a central portion (chip mounting region) of a unit frame. The twelve leads LE are allotted with an index (identification number, serial number, index), and the lead LE corresponding to index 1 is 1 pin. And, in the later molding step, an identification mark PP, whose rear surface is exposed from the rear surface of the resin-sealed body, is formed near but away from 1 pin. Numerals which are given in addition to the lead LE in FIG. 34 are indexes.

In this lead frame LF2, however, this identification mark PP is held by the suspension lead LL which is connected to only the first holding part LH1 between a corner portion where the first holding part LH1 and the fourth holding part LH4 intersect and the lead LE (1 pin) of the index 1. That is to say, one end of the suspension lead LL is coupled with the first holding part LH1, and the other end of the suspension lead LL holds the identification mark PP.

(Second Modified Example of the Embodiment)

The above-described embodiment exemplified the semiconductor device SD1 having a structure that seals one semiconductor chip with the resin as shown in, for example, FIG. 30 described above, but this embodiment can also be applied to a semiconductor device having a structure in which 2 or 3 semiconductor chips are sealed with the resin.

Figure 36:
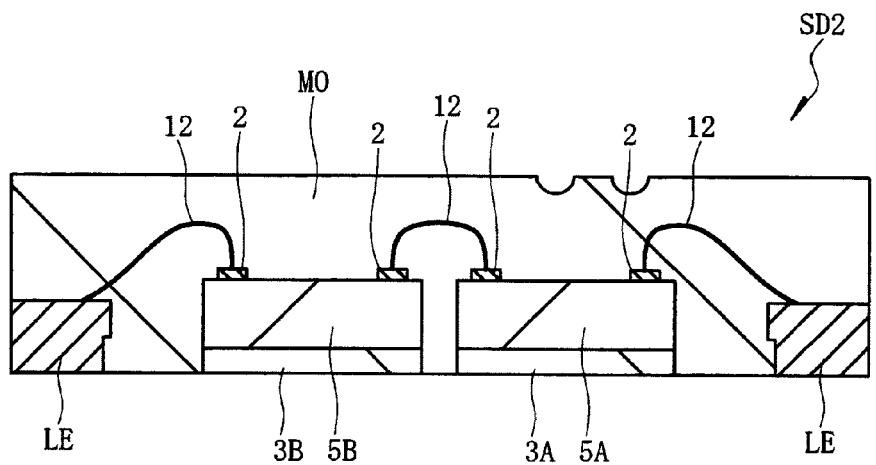
FIG. 36 is a cross-sectional view of the main part showing a cross section of a semiconductor device according to a second modified example of one embodiment.

A structure of the second modified example of the semiconductor device is explained with reference to FIG. 36 and FIG. 37. FIG. 36 is a cross-sectional view of a main part showing a cross section of the semiconductor device, and FIG. 37 is a plan view of a main part showing a rear surface of the semiconductor device.

As shown in FIG. 36, a semiconductor device (semiconductor package) SD2 is configured of two semiconductor chips 5A, 5B, resin sheets (adhesive sheet, adhesive film, sealing material) 3A, 3B which are formed on the rear surfaces of the respective semiconductor chips 5A, 5B, plural leads LE which are arranged on the periphery of the semiconductor chips 5A, 5B, and the plural conductive wires 12 which electrically connect plural electrode pads (bonding pads) arranged on the respective front surfaces of the semiconductor chips 5A, 5B and the plural leads LE. The semiconductor chips 5A, 5B, the side surfaces of the resin sheets 3A, 3B, respective parts of the plural leads LE (front surface (top surface), and parts of the side surfaces), and the plural conductive wires 12 are sealed with a resin-sealed body (sealed body) MO.

Figure 37:
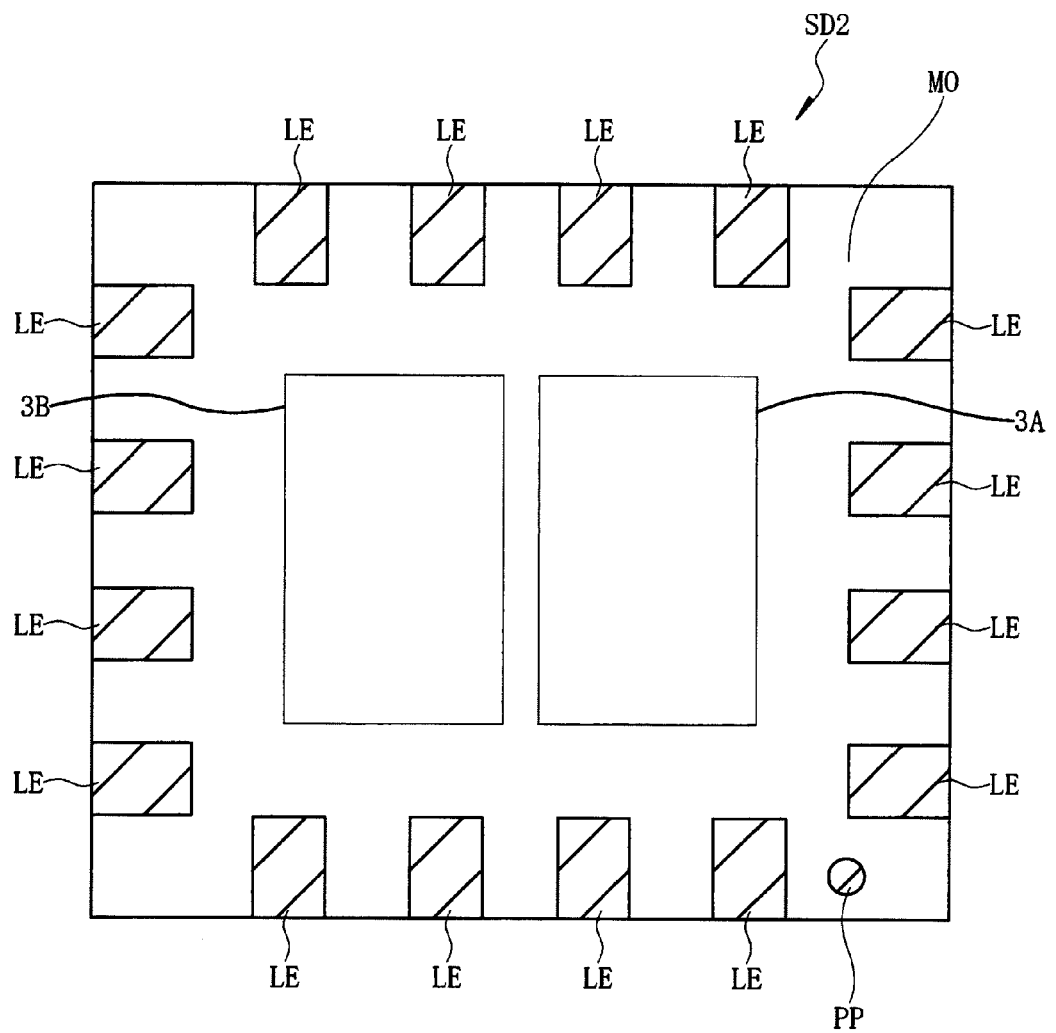
FIG. 37 is a plan view of the main part showing a rear surface of the semiconductor device according to the second modified example of one embodiment.

As shown in FIG. 37, the respective rear surfaces of the semiconductor chips 5A, 5B are not exposed from the undersurface of the resin-sealed body MO, but the resin sheets 3A, 3B adhered to the respective rear surfaces of the semiconductor chips 5A, 5B, the other parts (rear surface (undersurface, mounting surface)) of the plural leads LE, and the rear surface of the identification mark PP are exposed. Since it is difficult to visually recognize the resin sheet 3 distinguishing from the resin-sealed body MO, the resin sheet 3 is not recognized by the position recognition of 1 pin.

(Third Modified Example of Embodiment)

In the above embodiment, the leads (external connection terminals, external terminals, and terminals) of the semiconductor device were formed of the lead frame, but leads formed by an electrolytic plating method may be used.

<<Semiconductor Device>>

The structure of the third modified example of the semiconductor device is explained with reference to FIG. 38 to FIG. 40. A tabless package having twelve leads (external connection terminals, external terminals, terminals) formed by the electrolytic plating method is exemplified below.

Figure 38:
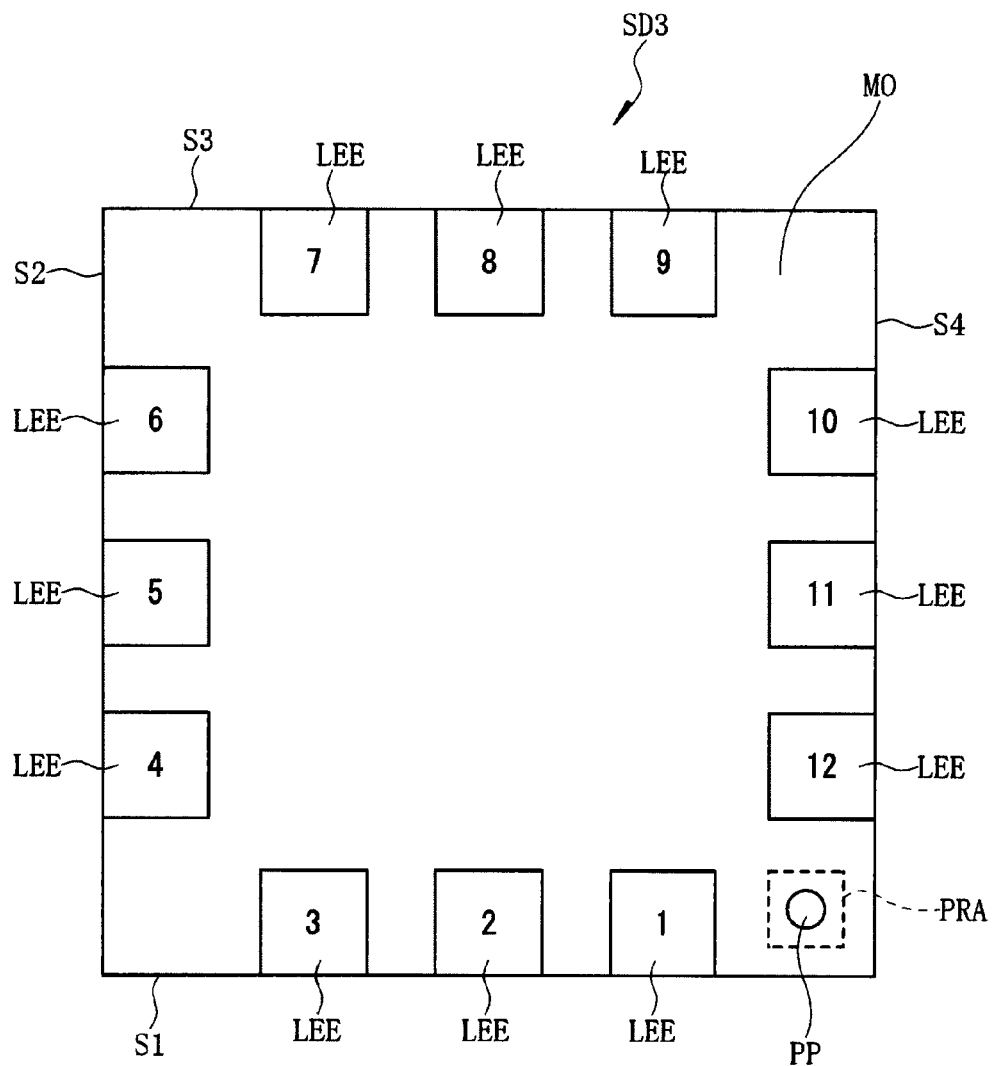
FIG. 38 is a plan view of the main part showing a rear surface of the semiconductor device according to a third modified example of one embodiment.
Figure 39:
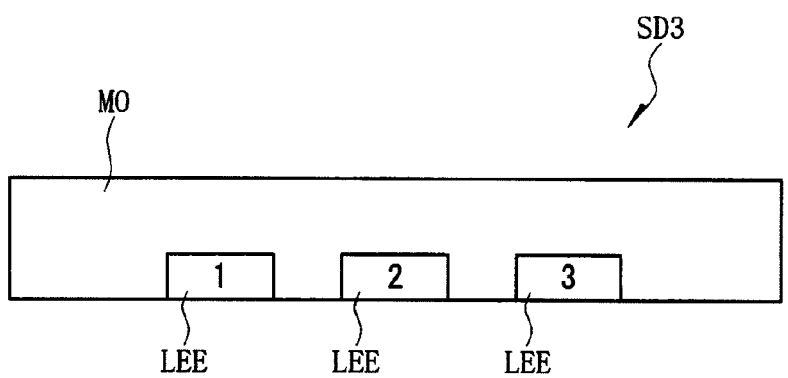
FIG. 39 is a side view of the main part showing an outer side surface on which arranged is a lead (1 pin) attached with a first index of the semiconductor device according to the third modified example of one embodiment.
Figure 40:
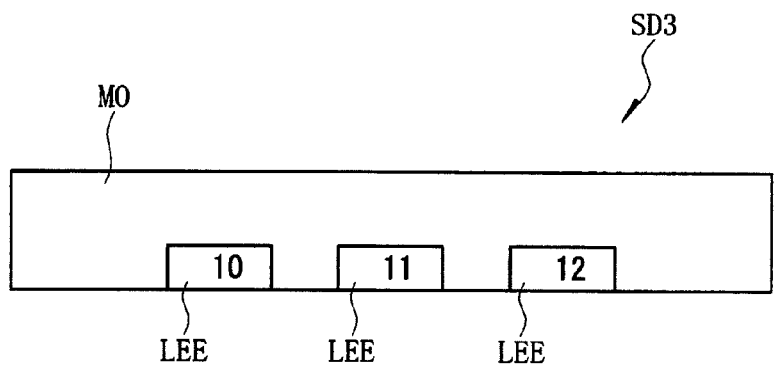
FIG. 40 is a side view of the main part showing an outer side surface on which arranged is a lead attached with a final index of the semiconductor device according to the third modified example of one embodiment.

FIG. 38 is a plan view of a main part showing a rear surface of the semiconductor device, FIG. 39 is a side view of a main part showing an outer side surface on which 1 pin (lead with index 1) of the semiconductor device is arranged, and FIG. 40 is a side view of a main part showing an outer side surface where a lead (lead with index 12) attached with a final index of the semiconductor device are arranged.

As shown in FIG. 38, similar to the semiconductor device (semiconductor package) SD1 shown in FIG. 1 described above, a semiconductor device (semiconductor package) SD3 using leads LEE formed by an electrolytic plating method also has the rear surface (undersurface, mounting surface) of the plural leads LEE exposed on its rear surface (undersurface, bottom surface). Here, the semiconductor device SD3 having twelve leads LEE are exemplified, and the rear surfaces of the twelve leads LEE are exposed on the rear surface of the resin-sealed body MO.

And, the image recognition area PRA is provided adjacent to 1 pin at the corner portion of the resin-sealed body MO closest to 1 pin, and in the image recognition area PRA, the rear surface of the identification mark PP is exposed on the rear surface of the resin-sealed body MO. This identification mark PP is formed by the same manufacturing step as the plural leads LEE and formed of the same conductive member as the twelve leads LEE. As shown in FIG. 39 and FIG. 40, only parts of the side surfaces of the twelve leads LEE are exposed on the side surface of the resin-sealed body MO.

As described above, the identification mark PP can also be provided near 1 pin in the semiconductor device SD3 which has adopted the leads formed by the electrolytic plating method. Thus, the direction of the semiconductor device SD3 can be aligned by recognizing 1 pin, so that to inspect the semiconductor device SD3, the property selection of the parts feeder system can be adopted.

<<Semiconductor Device Manufacturing Method>>

Next, a manufacturing method of a third modified example of the semiconductor device is described stepwise with reference to FIG. 41 to FIG. 57. Here, a tabless package having twelve leads (external connection terminals, external terminals, terminals) formed by an electrolytic plating method is exemplified.

Figure 41:
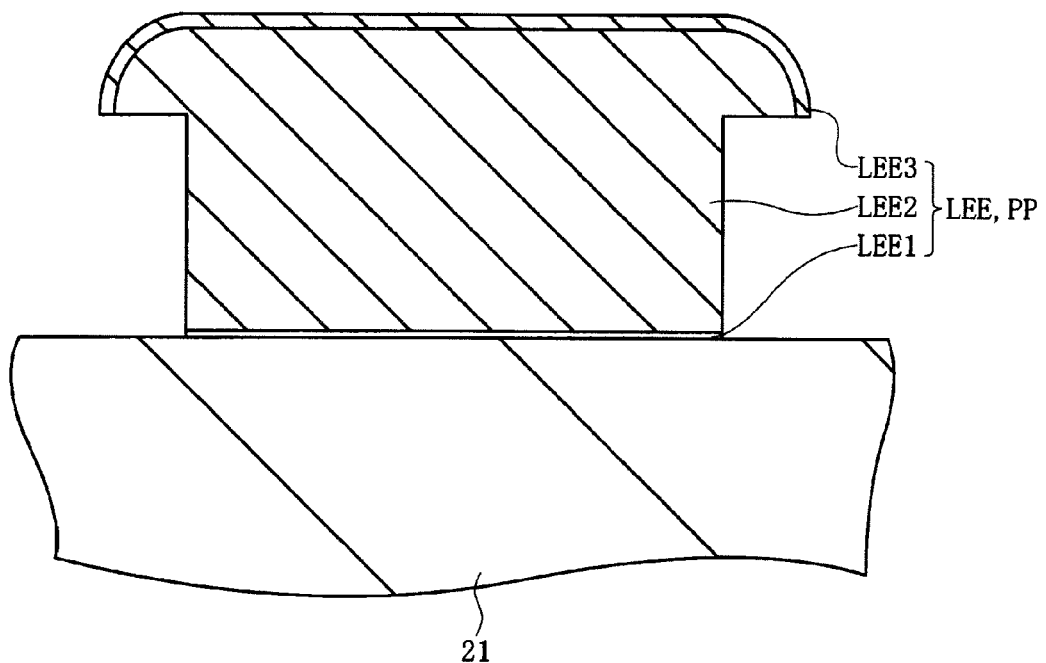
FIG. 41 is a cross-sectional view of the main part of a lead showing one lead in a magnified fashion according to the third modified example of one embodiment.
Figure 42:
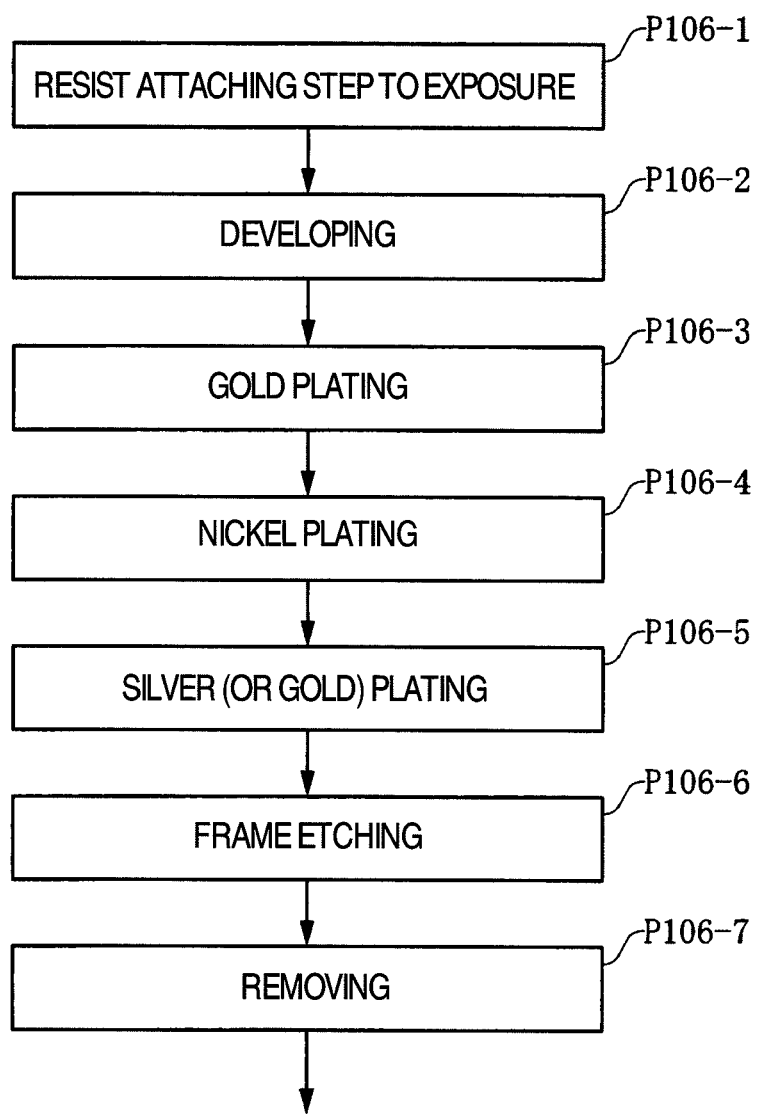
FIG. 42 is a step view for explaining a manufacturing method of a base material having plural leads according to the third modified example of one embodiment.
Figure 55:
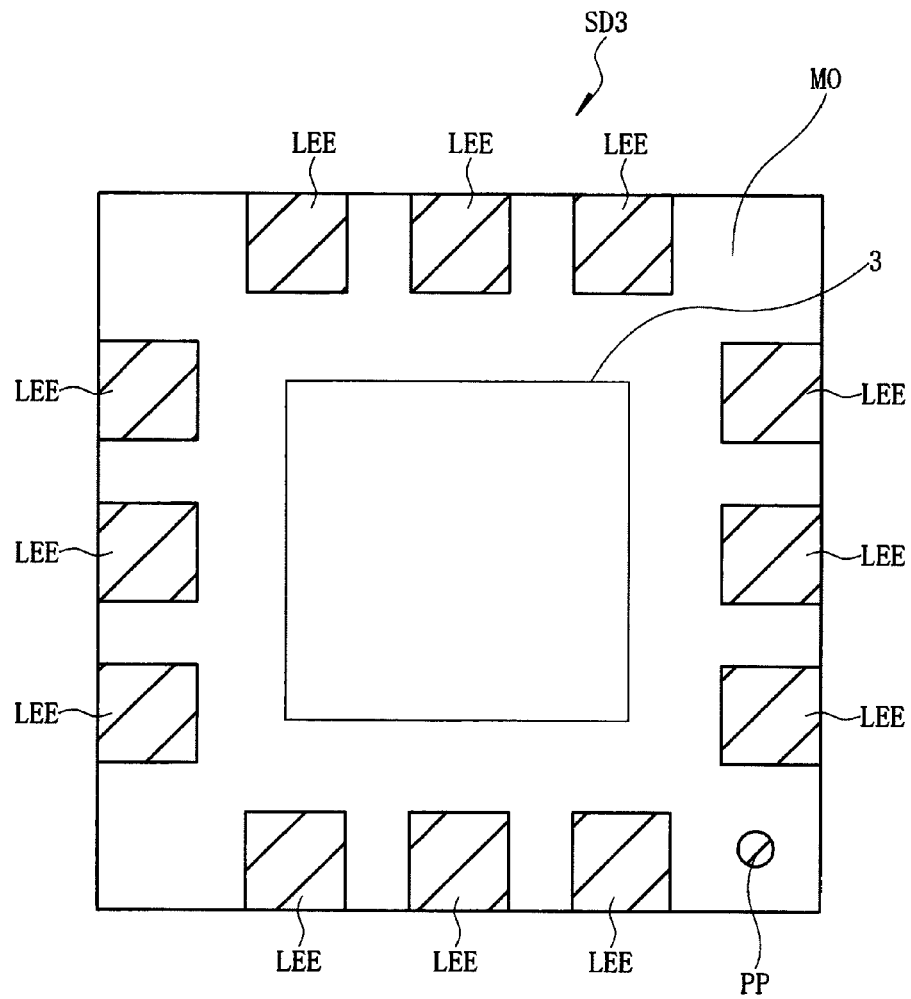
FIG. 55 is a plan view of the main part showing a rear surface of the semiconductor device according to the third modified example of one embodiment.
Figure 56:
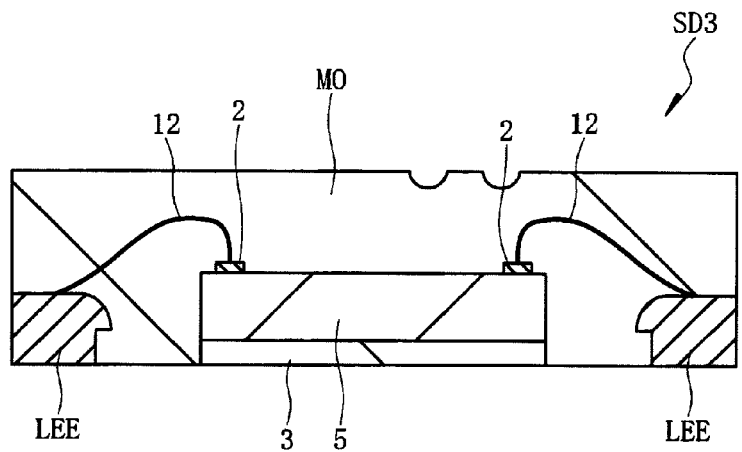
FIG. 56 is a cross-sectional view of the main part showing a cross section of the semiconductor device according to the third modified example of one embodiment.
Figure 57:
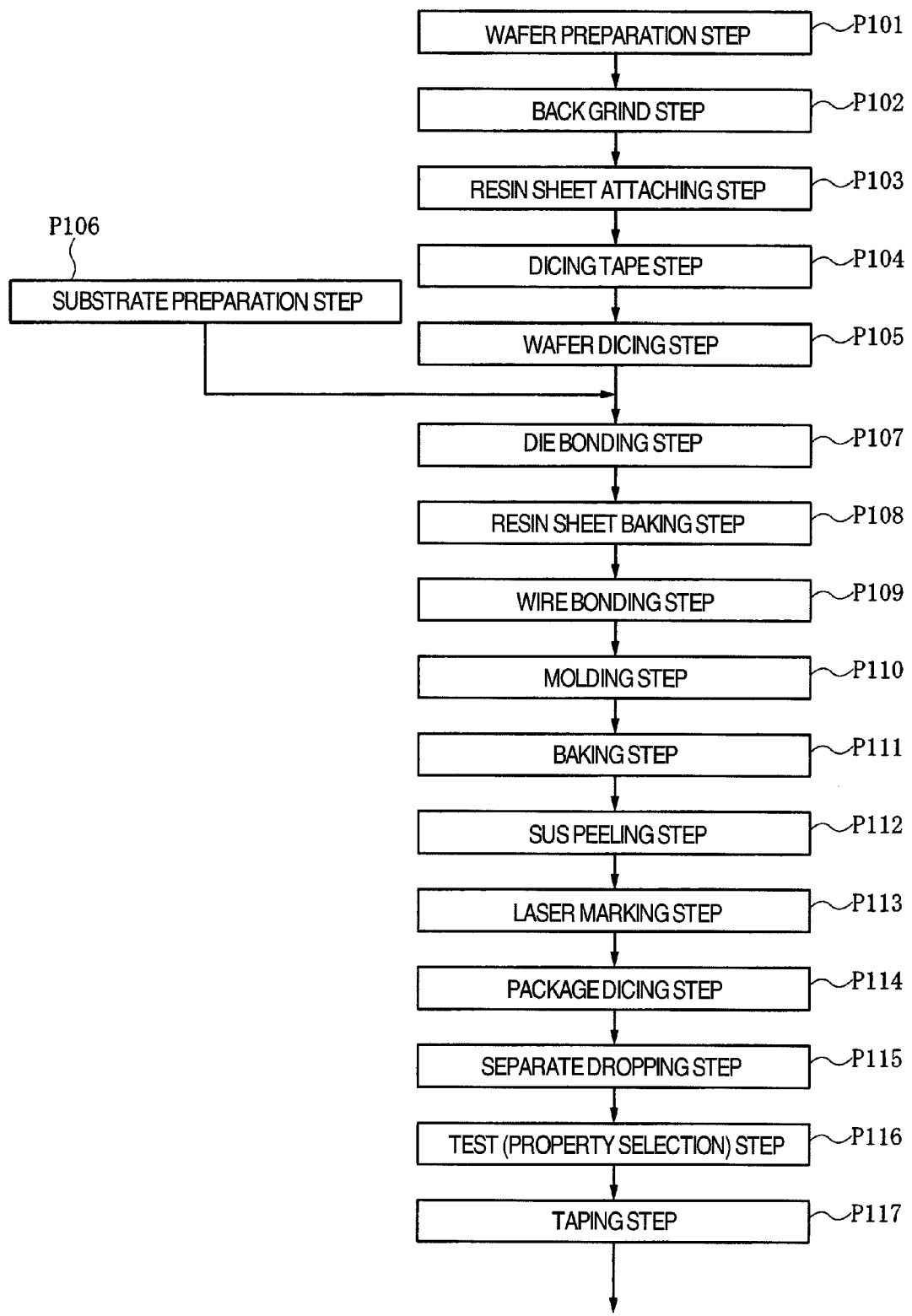
FIG. 57 is a step view for explaining a manufacturing method of the semiconductor device according to the third modified example of one embodiment.

FIG. 41 is a cross-sectional view of a main part of leads showing one lead in a magnified fashion. FIG. 42 is a step view for explaining a manufacturing method of a base material having plural leads, FIG. 43 to FIG. 49 are cross-sectional views of a main part of the base material in a manufacturing step for explaining a manufacturing method of the base material having plural leads, and FIG. 50 to FIG. 54 are cross-sectional views of a main part of semiconductor device in a manufacturing step for explaining a semiconductor device manufacturing method. FIG. 55 is a plan view of the main part showing a rear surface of the semiconductor device, and FIG. 56 is a cross-sectional view of a main part showing a cross section of the semiconductor device. FIG. 57 is a step view for explaining a semiconductor device manufacturing method.

The manufacturing method of the semiconductor device having twelve leads formed by the electrolytic plating method is explained here, but it is not limited to the following but can also be applied to a manufacturing method of a semiconductor device having, for example, 20 or 24 leads.

Since <wafer preparation step P101> to <wafer dicing step P105> are same as <wafer preparation step P1> to <wafer dicing step P5> of the manufacturing method of the semiconductor device SD 1 described above, their description is omitted. Therefore, <substrate preparation step P106> and following steps are described below.

<Base Material Preparation Step P106>

First, shapes of a lead LEE and am identification mark PP are described.

As shown in FIG. 41, the lead LEE and the identification mark PP are made of a laminated film which is formed of a gold (Au) film LEE 1, a nickel (Ni) film LEE2, and a silver (Ag) film LEE3 (or gold film) arranged in ascending order by, for example, an electrolytic plating method, and the nickel film LEE2 sticks out like a brim to form a mushroom form which has an overhang portion. The front surfaces (top surfaces) of the lead LEE and the identification mark PP are at a position higher than the top surface of the mother board 21, and the lead LEE and the identification mark PP which are formed by the electrolytic plating method can be formed to have a thickness of about a half of the thickness of the leads which are formed of a part of the lead frame which is formed by patterning a conductive substrate (metal plate). The lead LEE and the identification mark PP are determined to have a mushroom form, and in a later manufacturing step which is a molding step (P110), anchor effects of the lead LEE and the identification mark PP can be expected. The gold film LEE1 forming the lead LEE and the identification mark PP has a thickness of, for example, 0.03 μm, the nickel film LEE2B has a thickness of, for example, 60 μm, and the silver film LEE3 (or gold film) has a thickness of, for example, 3 μm.

The manufacturing method of the base material on which plural leads LEE are formed is described below with reference to FIG. 42 to FIG. 49. FIG. 42 is a step view for explaining the manufacturing method of the base material having the plural leads, and FIG. 43 to FIG. 49 are cross-sectional views of a main part of the base material in the manufacturing step for explaining the manufacturing method of the base material having the plural leads.

(P106-1: Resist attaching step to exposure step)

Figure 43:
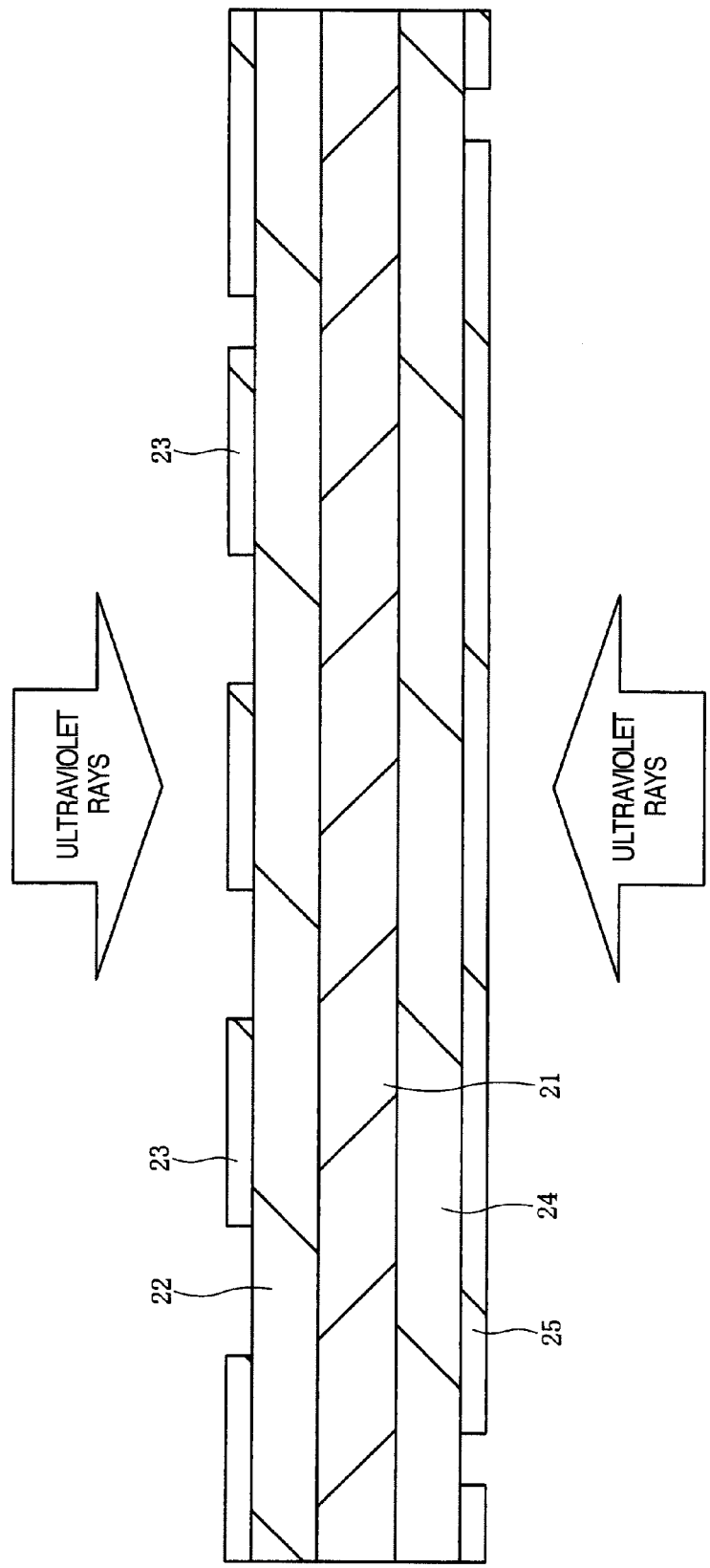
FIG. 43 is a cross-sectional view of the main part of a base material in a manufacturing step for explaining a manufacturing method of a base material having plural leads according to the third modified example of one embodiment.

As shown in FIG. 43, a resist film 22 is coated on a top surface (front surface) of a mother board 21, and ultraviolet rays are emitted to the resist film 22 through a film mask 23 in which a predetermined pattern is formed. Similarly, a resist film 24 is coated on an undersurface (rear surface) on the opposite side of the top surface of the mother board 21, and ultraviolet rays are emitted to the resist film 24 through a film mask 25 in which a predetermined pattern is formed.

(P106-2: Developing Step)

As shown in FIG. 44, the film masks 23, 25 are removed, a developing process is performed, and the resist film 22 coated on the top surface of the mother board 21 and the resist film 24 which is coated on the undersurface of the mother board 21 are patterned respectively. Thus, holes 26 for the plural leads for forming the plural leads LEE and the identification mark PP are formed in the +22 which is coated on the top surface of the mother board 21, and plural guide holes 27 are formed in the resist film 24 which is coated on the undersurface of the mother board 21.

(P106-3: Gold Plating Step)

As shown in FIG. 45, the front surface of the resist film 24 formed on the undersurface of the mother board 21 is covered with a protection film 28, the gold film LEE1 is formed (deposited) on the bottoms of the holes 26 for plural leads formed on the top surface of the mother board 21 by the electrolytic plating method. The gold film LEE1 has a thickness of, for example, 0.03 μm.

(P106-4: Nickel Plating Step)

Figure 46:
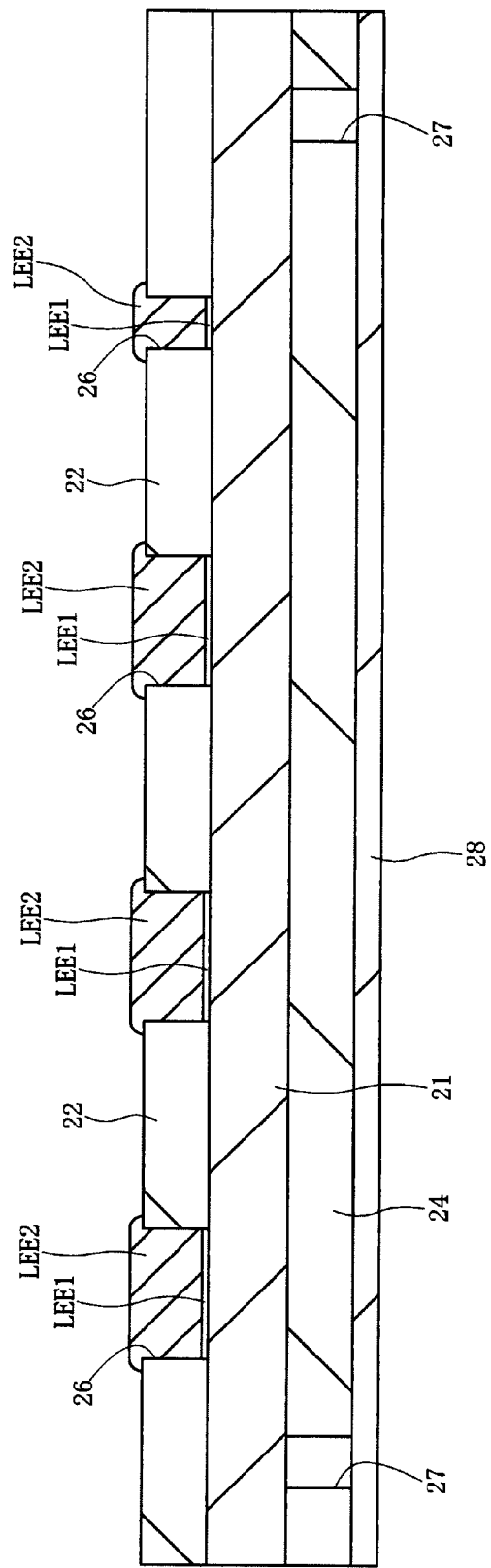
FIG. 46 is subsequent to FIG. 45 and is a cross-sectional view of the main part of the same portion as in FIG. 43.

As shown in FIG. 46, the nickel film LEE2 is formed (deposited) to connect to the gold film LEE1 within the holes 26 for plural leads formed on the top surface of the mother board 21 by the electrolytic plating method. This nickel film LEE2 is formed not only within the holes 26 for plural leads but also to expand along the front surface of the resist film 22, so that it is formed into a mushroom form having an overhang (a part sticking out like a brim). The nickel film LEE2 has a thickness of, for example, 60 p.m.

(P106-5: Silver (or Gold) Plating Step)

Figure 47:
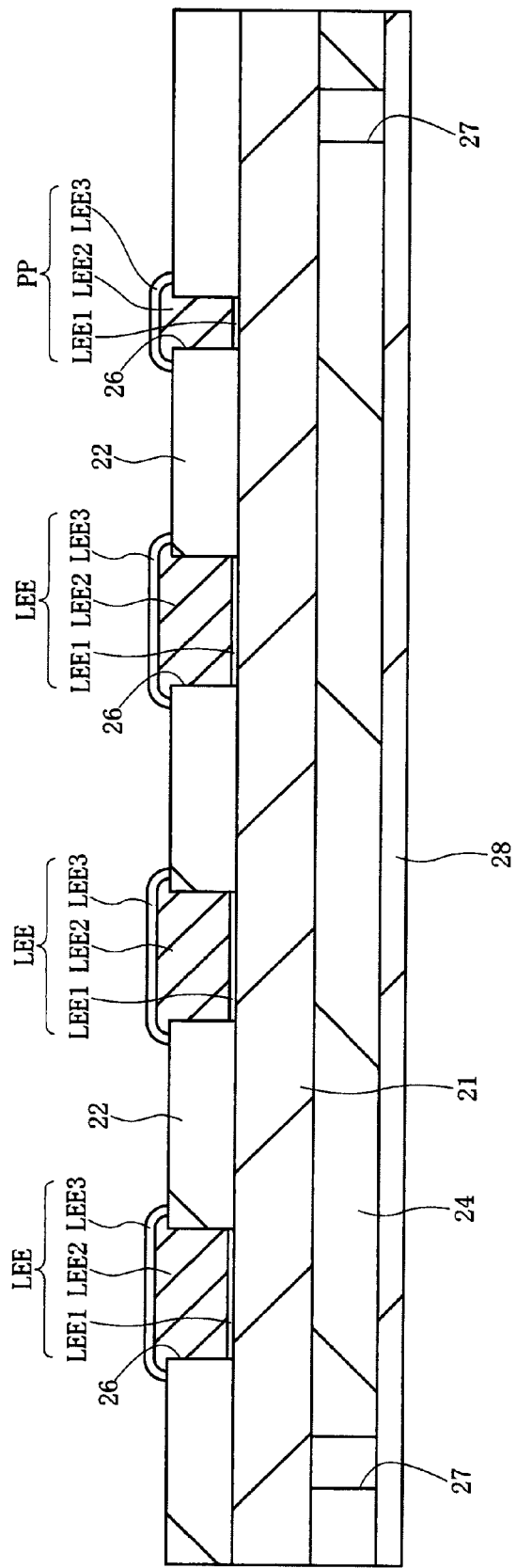
FIG. 47 is subsequent to FIG. 46 and is a cross-sectional view of the main part of the same portion as in FIG. 43.

As shown in FIG. 47, the silver film LEE3 (or gold film) is further formed (deposited) on and to connect to the front surfaces of plural nickel films LEE2 which are formed on the top surface of the mother board 21 by the electrolytic plating method. The silver film LEE3 (or gold film) has a thickness of, for example, 3 μm. In this embodiment, it was described that the gold film LEE1, the nickel films LEE2 and the silver film LEE3 (or gold film) are formed by the electrolytic plating method. But, they may also be formed by the electroless plating method. However, the electrolytic plating method is preferably used when a forming rate (deposition rate) of the above films is considered.

(P106-6: Frame Etching Step)

Figure 48:
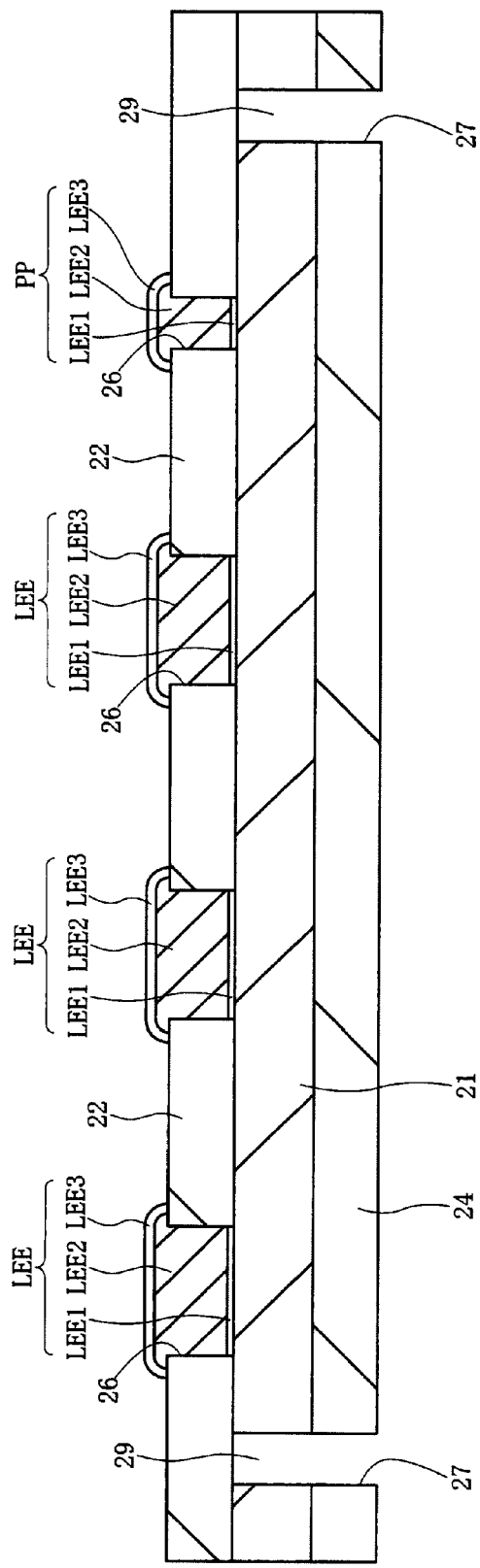
FIG. 48 is subsequent to FIG. 47 and is a cross-sectional view of the main part of the same portion as in FIG. 43.

As shown in FIG. 48, the protection film 28 covering the front surface of the resist film 24 formed on the undersurface of the mother board 21 is removed, and the mother board 21 is etched with the resist film 24 used as a mask. Thus, an outer frame 29 of the mother board 21 is formed in correspondence with the guide holes 27 formed in the resist film 24.

(P106-7: Removing Step)

Figure 49:
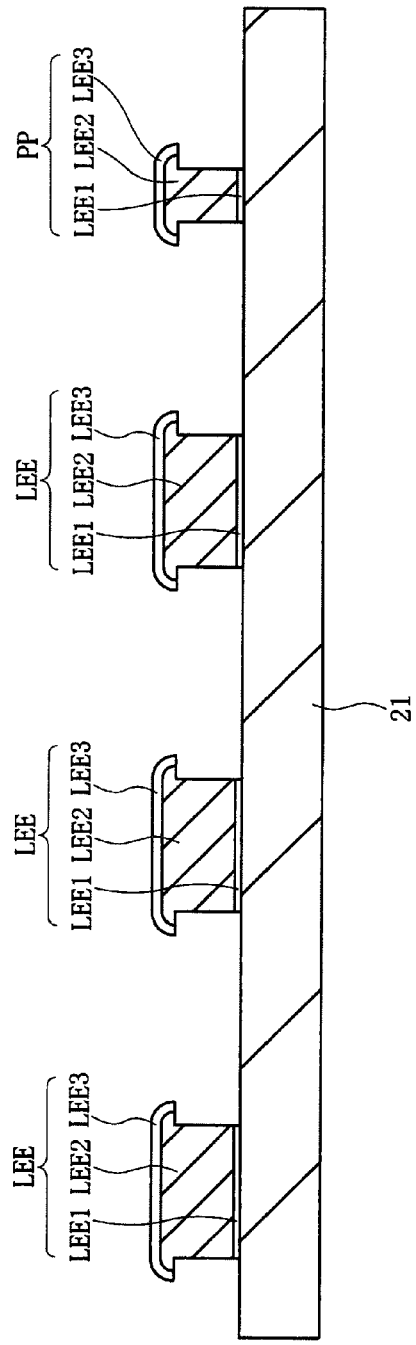
FIG. 49 is subsequent to FIG. 48 and is a cross-sectional view of the main part of the same portion as in FIG. 43.

As shown in FIG. 49, the resist films 22, 24 are removed, and the excessive portions of the mother board 21 are removed to almost complete the mother board 21 having the plural leads LEE and the identification mark PP.

<Die Bonding Step P107>

Ultraviolet rays are irradiated from the undersurface side of the dicing tape 4 to lower the adhesive force of the adhesive layer formed on the top surface of the dicing tape 4 to, for example, about 10-20 g/25 mm and to cure the adhesive layer. Thus, the respective semiconductor chips 5 can be separated easily from the dicing tape 4.

Figure 50:
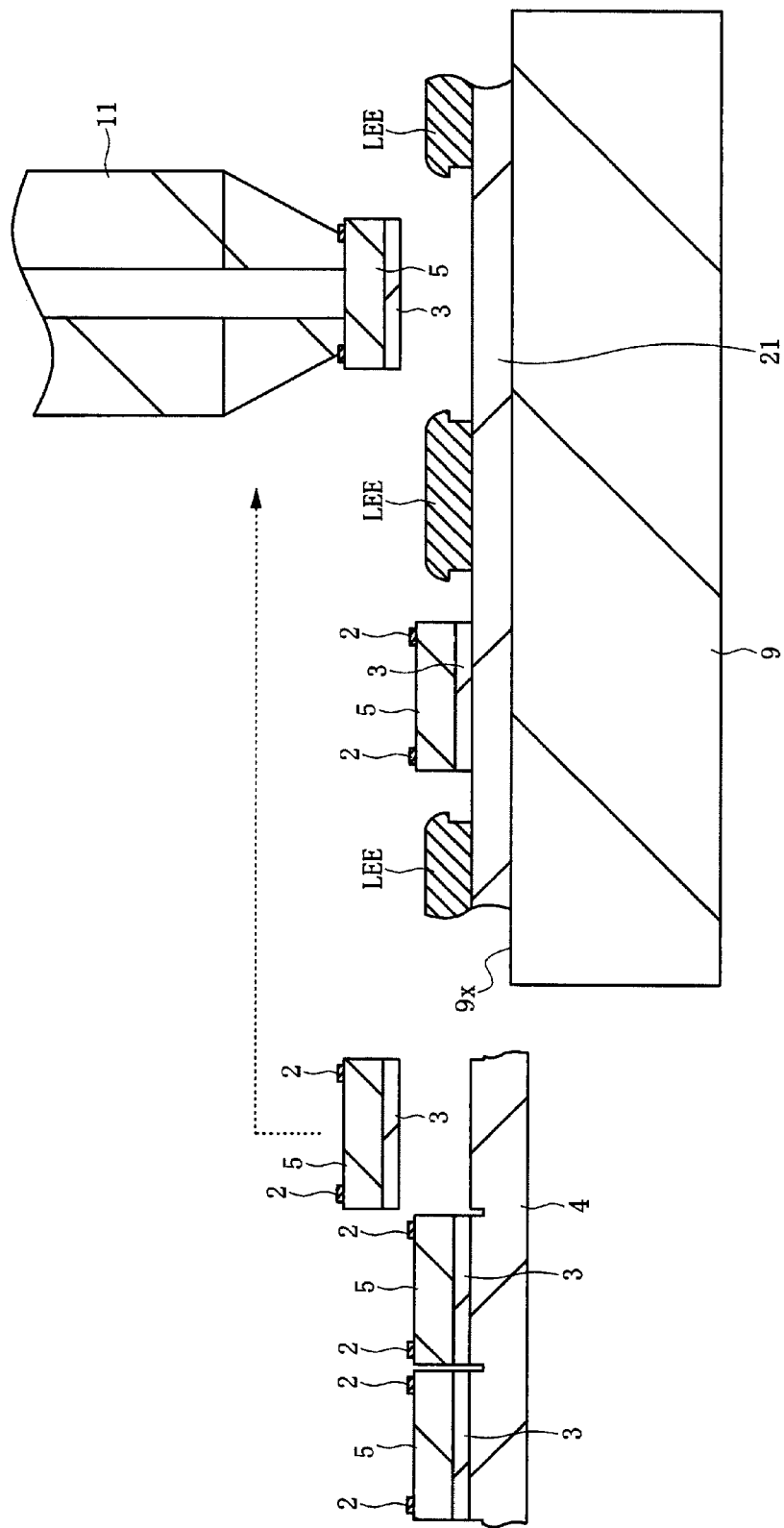
FIG. 50 is a cross-sectional view of the main part of the semiconductor device in a die bonding step according to the third modified example of one embodiment.

As shown in FIG. 50, the undersurface of the mother board 21 and the front surface (top surface) 9x of the heat stage 9 having the heat source are then opposed mutually, and the mother board 21 having plural leads LEE is arranged on the front surface 9x of the heat stage 9. The heat stage 9 is made of a conductive member such as stainless steel (SUS430) and heated to, for example, 40-80° C. Heat of the heat stage 9 is conducted to the mother board 21 arranged on the front surface 9x of the heat stage 9, and the mother board 21 is heated to the same temperature as the heat stage 9.

The front surface of the semiconductor chip 5 is then adsorbed and held by the cylindrical collet 11, and the semiconductor chip 5 is picked up by removing from the dicing tape 4. The resin sheet 3 is adhered to the rear surface of the semiconductor chip 5. The picked-up semiconductor chip 5 is conveyed to a predetermined chip mounting region of the frame tape 10.

The semiconductor chip 5 is then arranged on the chip mounting region of the top surface of the mother board 21 via the resin sheet 3 which is adhered to the rear surface of the semiconductor chip 5, and heat (for example, 40-80° C.) is applied to fix the semiconductor chip 5 to the chip mounting region of the top surface of the mother board 21.

<Resin Sheet Baking Step P108>

Heat treatment at, for example, 150° C. is then applied to the mother board 21, to which the plural semiconductor chips 5 are attached, for about 60 minutes without applying a pressure. This heat treatment is an air bake using, for example, a baking furnace (in a heated chamber which houses the mother board 21 to which the plural semiconductor chips 5 are attached). Thus, adhesive force between the semiconductor chip 5 and the mother board 21 via the resin sheet 3 is enhanced by promoting a curing reaction of the resin sheet 3, and hardness of the resin sheet 3 is increased.

<Wire Bonding Step P109>

Figure 51:
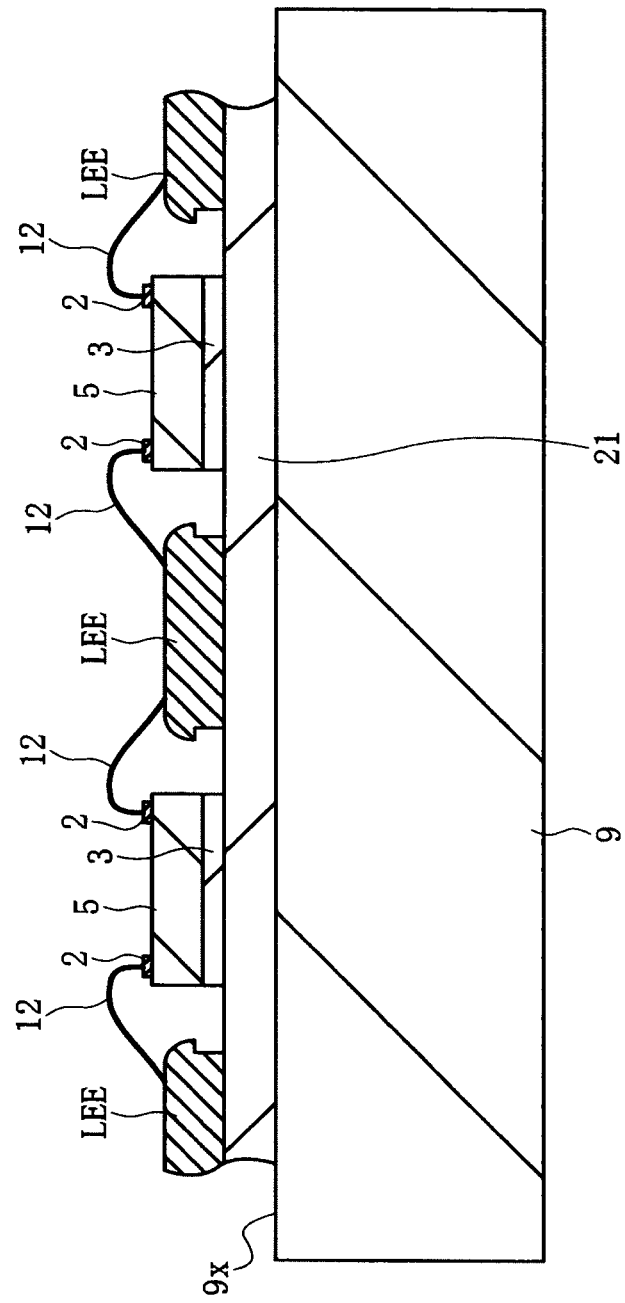
FIG. 51 is a cross-sectional view of the main part of the semiconductor device in a wire bonding step according to the third modified example of one embodiment.

As shown in FIG. 51, the plural electrode pads 2, which are arranged along the edge of the front surface of the semiconductor chip 5, and the front surfaces of the plural leads LEE positioned on the periphery of the chip mounting region on a top surface of the mother board 21 are respectively connected electrically using the plural conductive wires 12 by, for example, a nail head bonding method (ball bonding method) also using ultrasonic vibration for thermocompression bonding.

Mainly, a forward bonding system (system by which after the electrode pads 2 on the semiconductor chip 5 and parts of the conductive wires 12 are connected, the leads LEE and the other parts of the conductive wires 12 are connected) is used, but a reverse bonding system (system by which after the leads LEE and the parts of the conductive wires 12 are connected, the electrode pads 2 of the semiconductor chip 5 and the other parts of the conductive wires 12 are connected) may be used.

<Molding Step P110>

Figure 52:
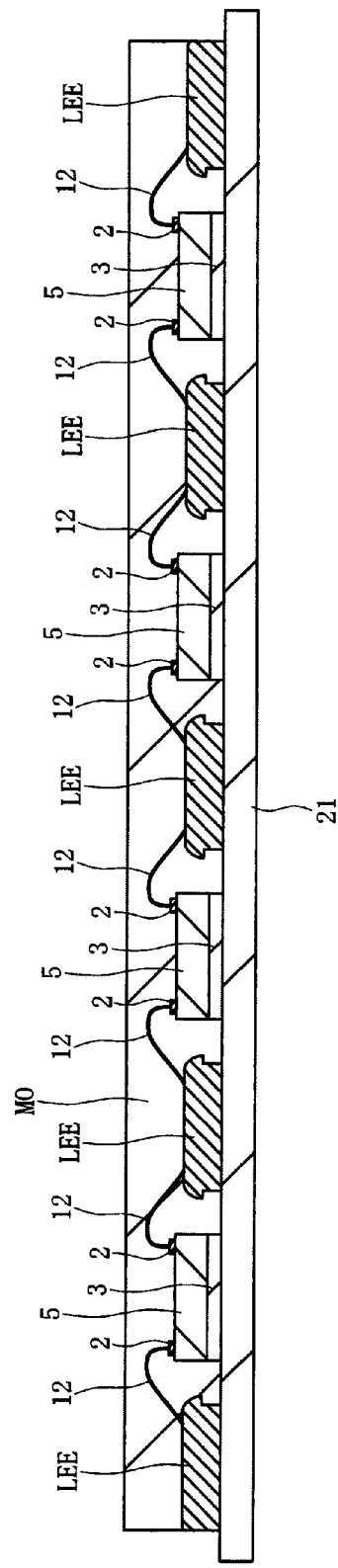
FIG. 52 is a cross-sectional view of the main part of the semiconductor device in a molding step according to the third modified example of one embodiment.

As shown in FIG. 52, the mother board 21 on which the plural semiconductor chips 5 are mounted is set on a die molding device, the temperature is raised to pump the liquefied sealing resin to flow into the die molding device, and the top surface side of the mother board 2 is sealed with the sealing resin to form a single resin-sealed body (sealed body) MO. In order to reduce the stress, the resin-sealed body MO is made of, for example, an epoxy-based thermosetting insulating resin to which a phenol curing agent, silicone rubber and a large number of fillers (for example, silica) are added.

<Baking Step P111>

For example, heat treatment (post-cure bake) is performed at a temperature of 175° C. for five hours. This heat treatment is, for example, an air bake. Thus, the plural semiconductor chips 5, the respective parts (parts of the front surface and the side surfaces) of the plural leads LEE, the plural conductive wires 12, and the parts (front surface (top surface) and side surfaces) of the identification mark PP are sealed with the resin-sealed body MO. The resin-sealed body MO has a thickness of, for example, 300 μm.

<SUS Peeling Step P112>

The mother board 21 is bent and peeled from the resin-sealed body MO. Thus, the other parts (rear surface (undersurface, mounting surface)) of the resin sheet 3 and the plural leads LEE and the rear surface (undersurface) of the identification mark PP are exposed from the rear surface (undersurface) of the resin-sealed body MO. After the mother board 21 is peeled, the resin sheet 3 is in adhesion to the rear surface of the semiconductor chip 5.

<Laser Marking Step P113>

Figure 53:
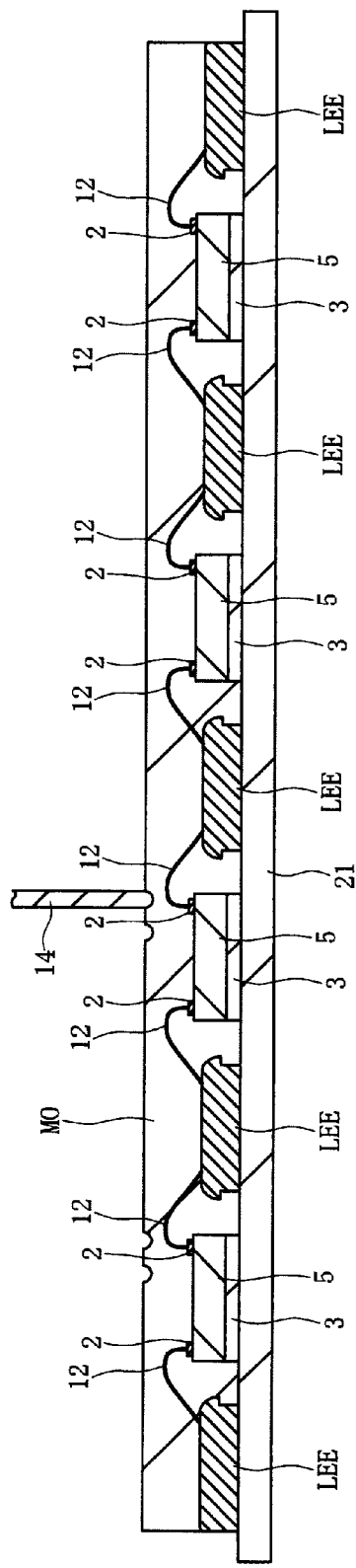
FIG. 53 is a cross-sectional view of the main part of the semiconductor device in a laser marking step according to the third modified example of one embodiment.

As shown in FIG. 53, the laser 14 is used to mark a product name or the like on the top surface of the resin-sealed body MO.

<Package Dicing Step P114>

Figure 54:
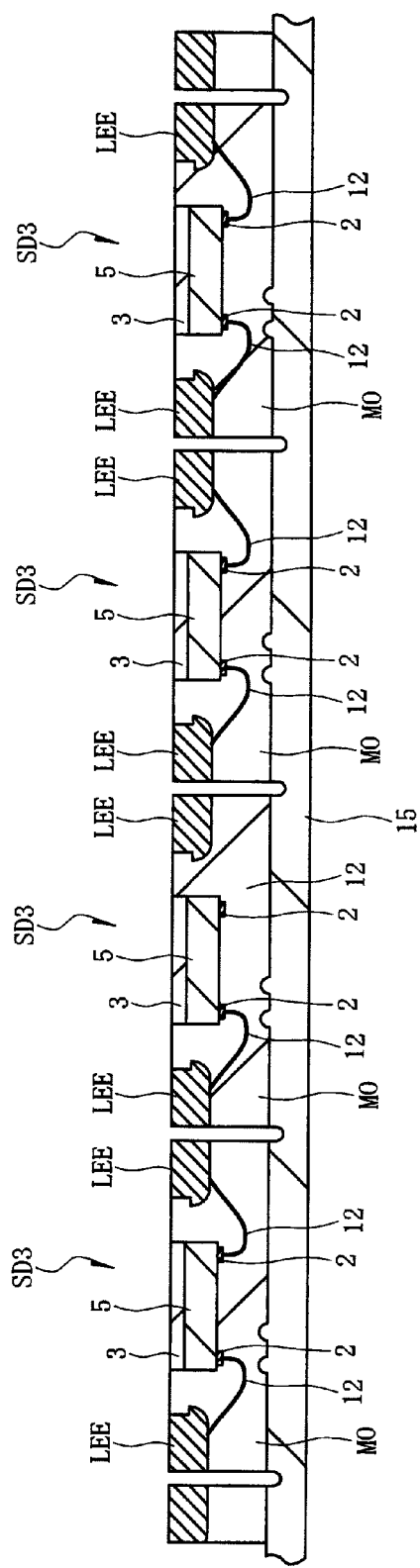
FIG. 54 is a cross-sectional view of the main part of the semiconductor device in a package dicing step according to the third modified example of one embodiment.

As shown in FIG. 54, the dicing tape 15 is prepared. Subsequently, the resin-sealed body MO which has sealed the plural semiconductor chips 5, the respective parts (front surface, and a part of the side surfaces) of the plural leads LEE and the plural conductive wires 12 is fixed to the top surface of the dicing tape 15.

Subsequently, an ultrathin round blade on which, for example, fine diamond particles are attached is used to cut the resin-sealed body MO, the plural leads LEE and the suspension lead LL starting from the rear surface side of the resin-sealed body MO longitudinally and transversely along the scribe regions. The resin-sealed body MO is divided into semiconductor devices (semiconductor packages) SD3, but they maintain an aligned state because the semiconductor devices SD3 are fixed by the dicing tape 15 even after dividing. Subsequently, the semiconductor devices SD3 are washed to remove debris and the like produced when the resin-sealed body MO was cut.

<Separate Dropping Step P115>

As shown in FIG. 55 and FIG. 56, the dicing tape 15 is removed to divide into individual semiconductor devices SD3. A laser mark is marked on the front surfaces of the semiconductor devices SD3. And, the rear surfaces of twelve leads LEE and the resin sheet 3 applied to the rear surface of the semiconductor chip 5 are exposed on the rear surface of the semiconductor device SD3. Therefore, the rear surface of the semiconductor chip 5 is protected by the resin sheet 3. And, the side surfaces of the twelve leads LEE are partly exposed from the resin-sealed body MO on the side surfaces of the semiconductor device SD3. Since it is difficult to visually recognize the resin sheet 3 separately from the resin-sealed body MO, the resin sheet 3 is not recognized by the position recognition of 1 pin.

Similar to the above-described semiconductor devices SD1, plural semiconductor devices SD3 which are individually divided are inspected and packed by the automatic parts feeder AF shown in FIG. 31 described above. Therefore, the plural semiconductor devices SD3 are fed in a separate state into the parts feeder part AFP of the automatic parts feeder AF.

Similar to the above-described manufacturing method of the semiconductor device SD1, the semiconductor devices SD3 judged as good products through <test (property selection) step P116> and <taping step P117> are shipped.

Thus, since the position of 1 pin can be recognized easily according to the identification mark PP even in the semiconductor devices SD3 adopting the leads formed by the electrolytic plating method, even the property selection of the parts feeder system can be adopted for the tabless package.

The embodiments of the invention achieved by the inventors were specifically described above but it is needless to say that the invention is not limited to the embodiments and various modifications and variations can be made within the spirit and the scope of the present invention.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device manufacturing method, comprising the steps of:
    (a) preparing a lead frame which has arranged a plurality of unit frames having a square holding frame made of a conductive member surrounding a chip mounting region, a plurality of leads having a first thickness made of the conductive member coupled to and held by the holding frame, a suspension lead having a second thickness smaller than the first thickness made of the conductive member coupled to and held by the holding frame, and an identification mark having the first thickness made of the conductive member held by the suspension lead;
    (b) preparing a semiconductor wafer having a first principal surface, a plurality of chip regions arranged on the first principal surface, cutting regions arranged between mutually adjacent chip regions among the plurality of chip regions, and a second principal surface on the opposite side of the first principal surface;
    (c) attaching a resin sheet to the second principal surface of the semiconductor wafer;
    (d) after the step (c), cutting the semiconductor wafer and the resin sheet along the cutting regions to obtain semiconductor chips having a part of the resin sheet;
    (e) after the step (d), fixing the lead frame to a top surface of a frame tape arranged on a front surface of a heat stage, arranging the semiconductor chips in the chip mounting regions of the unit frame configuring the lead frame via the part of the resin sheet, and fixing the semiconductor chip to the top surface of the frame tape;
    (f) after the step (e), electrically connecting a plurality of electrode pads of the semiconductor chips and the front surfaces of the plurality of leads via a plurality of conductive wires;

(g) after the step (f), forming a sealed body by sealing the semiconductor chip, the plurality of conductive wires, the front and side surfaces of the plurality of leads, the suspension lead, the front and side surfaces of the identification mark, and the top surface of the frame tape with a resin;

(h) after the step (g), peeling the frame tape from the sealed body to expose the rear surfaces of the plurality of leads and the rear surface of the identification mark from the rear surface of the sealed body; and (i) after the step (h), cutting the sealed body, the plurality of leads, and the suspension lead to obtain individual semiconductor devices, wherein the frame is configured of a first holding part and a third holding part which are separated from each other and provided to extend in a first direction, and a second holding part and a fourth holding part are separated from each other and provided to extend in a second direction intersecting at right angles with the first direction, wherein the first holding part and the second holding part, the second holding part and the third holding part, the holding part and the fourth holding part, and the fourth holding part and the first holding part are respectively coupled with each other, and wherein the identification mark is disposed in a vicinity of a coupled portion of the first holding part and the second holding part only, and is not located in a vicinity of a coupled portion of the second holding part and the third holding part, a coupled portion of the third holding part and the fourth holding part, and a coupled portion of the fourth holding part and the first holding part.

2. The semiconductor device manufacturing method according to claim 1,
wherein the suspension lead is configured of a first part which is provided to extend in the first direction, and a second part which is provided to extend in the second direction, one end of the first part of the suspension lead is coupled with the fourth holding part, one end of the second part of the suspension lead is coupled with the first holding part, and the identification mark is held by the other end of the first part of the suspension lead and the other end of the second part of the suspension lead.

3. The semiconductor device manufacturing method according to claim 1, wherein:
the holding frame is configured of a first holding part and a third holding part which are separated from each other and provided to extend in a first direction, and a second holding part and a fourth holding part which are separated from each other and provided to extend in a second direction intersecting at right angles with the first direction;
the first holding part and the second holding part, the second holding part and the third holding part, the third holding part and the fourth holding part, and the fourth holding part and the first holding part are respectively coupled with each other; and
one end of the suspension lead is coupled with the first holding part, and the other end of the suspension lead holds the identification mark.

4. The semiconductor device manufacturing method according to claim 1, wherein a shape of the rear surface of the identification mark exposed from the rear surface of the sealed body is circular or quadrangular in plan view.

5. The semiconductor device manufacturing method according to claim 1, wherein the conductive member is copper, and a palladium film is formed on the rear surfaces of the plurality of leads and on the rear surface of the identification mark.

6. The semiconductor device manufacturing method according to claim 1, wherein the step (a) further comprises the steps of:
(a1) preparing the conductive member having a front surface and a rear surface on the opposite side of the front surface;
(a2) coating a first resist film on the front surface of the conductive member, and coating a second resist film on the rear surface of the conductive member;
(a3) irradiating an exposure light to a partial area of the first resist film and a partial area of the second resist film to cure the partial area of the first resist film and the partial area of the second resist film;
(a4) performing a developing process on the first resist film and the second resist film such that the partial area of the first resist film and the partial area of the second resist film remain on the front surface and the rear surface of the conductive member;
(a5) etching the conductive member with the partial area of the first resist film and the partial area of the second resist film used as a mask to process the conductive member; and
(a6) removing the partial area of the first resist film and the partial area of the second resist film,
wherein in a view from the front surface side of the conductive member, the regions covered with the partial area of the first resist film are larger than the regions covered with the partial area of the second resist film, but all regions covered with the partial area of the second resist film overlap the regions covered with the partial area of the first resist film.

7. The semiconductor device manufacturing method according to claim 6,
wherein in the view from the front surface side of the conductive member in step (a5), the conductive member is not etched in the regions where the partial area of the first resist film and the partial area of the second resist film are formed to overlap with each other, and
wherein in the view from the front surface side of the conductive member, the conductive member is etched in the thickness direction from the rear surface side such that a part remains on the front surface side in the regions where the partial area of the first resist film is formed but the partial area of the second resist film is not formed.

8. The semiconductor device manufacturing method according to claim 6,
wherein in step (a5), the partial area of the first resist film and the partial area of the second resist film are formed to overlap with each other and the conductive member is not etched in the region where the identification mark is formed in the view from the front surface side of the conductive member, and
wherein the partial area of the first resist film is formed but the partial area of the second resist film is not formed, and the conductive member is etched in the thickness direction from the rear surface side and partly remains on the front surface side in the region where the suspension lead is formed in the view from the front surface side of the conductive member.

9. The semiconductor device manufacturing method according to claim 8, wherein the first thickness of the identification mark is half of the second thickness of the suspension lead.

10. A semiconductor device manufacturing method, comprising the steps of:
- (a) preparing a lead frame which has arranged a plurality of unit frames having a square holding frame made of a conductive member surrounding a chip mounting region, a plurality of leads having a first thickness made of the conductive member coupled to and held by the holding frame, a suspension lead having a second thickness smaller than the first thickness made of the conductive member coupled to and held by the holding frame, and an identification mark having the first thickness made of the conductive member held by the suspension lead;
- (b) preparing a semiconductor wafer having a first principal surface, a plurality of chip regions arranged on the first principal surface, cutting regions arranged between mutually adjacent chip regions among the plurality of chip regions, and a second principal surface on the opposite side of the first principal surface;
- (c) attaching a resin sheet to the second principal surface of the semiconductor wafer;
- (d) after the step (c), cutting the semiconductor wafer and the resin sheet along the cutting regions to obtain semiconductor chips having a part of the resin sheet;
- (e) after the step (d), fixing the lead frame to a top surface of a frame tape arranged on a front surface of a heat stage, arranging the semiconductor chips in the chip mounting regions of the unit frame configuring the lead frame via the part of the resin sheet, and fixing the semiconductor chip to the top surface of the frame tape;
- (f) after the step (e), electrically connecting a plurality of electrode pads of the semiconductor chips and the front surfaces of the plurality of leads via a plurality of conductive wires;
- (g) after the step (f), forming a sealed body by sealing the semiconductor chip, the plurality of conductive wires, the front and side surfaces of the plurality of leads, the suspension lead, the front and side surfaces of the identification mark, and the top surface of the frame tape with a resin;
- (h) after the step (g), peeling the frame tape from the sealed body to expose the rear surfaces of the plurality of leads and the rear surface of the identification mark from the rear surface of the sealed body; and
- (i) after the step (h), cutting the sealed body, the plurality of leads, and the suspension lead to obtain individual semiconductor devices, wherein the step (a) further comprises the steps of
- (a1) preparing the conductive member having a front surface and a rear surface on the opposite side of the front surface;
- (a2) coating a first resist film on the front surface of the conductive member, and coating a second resist film on the rear surface of the conductive member;
- (a3) irradiating an exposure light to a partial area of the first resist film and a partial area of the second resist film to cure the partial area of the first resist film and the partial area of the second resist film;
- (a4) performing a developing process on the first resist film and the second resist film such that the partial area of the first resist film and the partial area of the second resist film remain on the front surface and the rear surface of the conductive member;
- (a5) etching the conductive member with the partial area of the first resist film and the partial area of the second resist film used as a mask to process the conductive member; and
- (a6) removing the partial area of the first resist film and the partial area of the second resist film, wherein, in a view from the front surface side of the conductive member, the regions covered with the partial area of the first resist film are larger than the regions covered with the partial area of the second resist film, but all regions covered with the partial area of the second resist film overlap the regions covered with the partial area of the first resist film.

11. The semiconductor device manufacturing method according to claim 10,
wherein in the view from the front surface side of the conductive member in step (a5), the conductive member is not etched in the regions where the partial area of the first resist film and the partial area of the second resist film are formed to overlap with each other, and
wherein in the view from the front surface side of the conductive member, the conductive member is etched in the thickness direction from the rear surface side such that a part remains on the front surface side in the regions where the partial area of the first resist film is formed but the partial area of the second resist film is not formed.

12. The semiconductor device manufacturing method according to claim 10,
wherein in step (a5), the partial area of the first resist film and the partial area of the second resist film are formed to overlap with each other and the conductive member is not etched in the region where the identification mark is formed in the view from the front surface side of the conductive member, and
wherein the partial area of the first resist film is formed but the partial area of the second resist film is not formed, and the conductive member is etched in the thickness direction from the rear surface side and partly remains on the front surface side in the region where the suspension lead is formed in the view from the front surface side of the conductive member.

13. The semiconductor device manufacturing method according to claim 12, wherein the first thickness of the identification mark is half of the second thickness of the suspension lead.

* * * * *